(12) United States Patent
Bessho et al.

(10) Patent No.: US 6,178,112 B1
(45) Date of Patent: Jan. 23, 2001

(54) ELEMENT EXPLOITING MAGNETIC MATERIAL AND ADDRESSING METHOD THEREFOR

(75) Inventors: Kazuhiro Bessho; Yoh Iwasaki, both of Kanagawa (JP)

(73) Assignee: Sony Corporation, Tokyo (JP)

( * ) Notice: Under 35 U.S.C. 154(b), the term of this patent shall be extended for 0 days.

(21) Appl. No.: 09/248,907

(22) Filed: Feb. 12, 1999

(30) Foreign Application Priority Data

| May 13, 1998 | (JP) | ................................................... 10-130710 |
| May 13, 1998 | (JP) | ................................................... 10-130711 |
| Jun. 30, 1998 | (JP) | ................................................... 10-185255 |

(51) Int. Cl.[7] .................................................... G11C 11/15
(52) U.S. Cl. ............................ 365/173; 365/171; 365/174
(58) Field of Search .................................... 365/173, 171, 365/174, 97, 145

(56) References Cited

U.S. PATENT DOCUMENTS 5,703,805 * 12/1997 Tehrani et al. ........................ 365/173
5,768,183 * 6/1998 Zhu et al. ............................. 365/171

FOREIGN PATENT DOCUMENTS 0 349 774 A2   1/1990 (EP).
0 860 828 A2   8/1998 (EP).

* cited by examiner

Primary Examiner—Huan Hoang
(74) Attorney, Agent, or Firm—Sonnenschein, Nath & Rosenthal

(57) ABSTRACT

An element that is able to control magnetization without applying a magnetic field from outside. A magnetized area formed of a ferromagnetic material is split by a spacer area of a composite material including a magnetic material and a semiconductor material. A stimulus is applied from outside to the spacer area to change the magnetic interaction between split magnetized areas to control the magnetization of the magnetized areas. Alternatively, a layered assembly made up of an electrically conductive layer containing an electrically conductive material and plural magnetic layers is provided so that the electrically conductive layer is arranged between the magnetic layers. The current is caused to flow through the electrically conductive layer to change the magnetic coupling state between the magnetic layers to control the direction of magnetization between the magnetic layers.

35 Claims, 35 Drawing Sheets

ELEMENT EXPLOITING MAGNETIC MATERIAL AND ADDRESSING METHOD THEREFOR

BACKGROUND OF THE INVENTION

1. Field of the Invention

This invention relates to a method for controlling magnetization of a magnetic material. More particularly, it relates to an element exploiting a magnetic material, such as an information recording element for recording the information by controlling the magnetization of the magnetic material, or a variable resistance element for controlling electrical resistance by controlling magnetization of the magnetic material, and to an addressing method in an appliance employing such element.

2. Description of the Related Art

An element employing a magnetic material is attractive for two reasons as compared to a semiconductor device. First, since electrically conductive metals can be used as device elements, high carrier density and low resistance can be achieved. Therefore, an element exploiting a magnetic material is expected to be suited to design rule minuting and high integration. Second, bistable magnetization direction proper to a magnetic material can be used in a non-volatile memory. That is, if bistable magnetization direction proper to a magnetic material is utilized, a solid non-volatile memory, in which the recorded information is not lost even on interruption of the circuit power source, is expected to be realized.

Meanwhile, a solid non-volatile memory, in which the recorded information is not lost even on interruption of the circuit power source, is expected to be useful in many fields of application. Specifically, a solid non-volatile memory does not consume power during periods of non-use, and hence is expected to be in reducing the capacity and the weight of batteries in portable electronic information equipment. On the other hand, the solid non-volatile memory finds wide use, on the background of the advent of the age of satellite media business, to support the activity of a satellite while under the shade of the earth, a time when a solar battery becomes unusable.

The element exploiting the magnetic material has advantages such as i) nonvolatility; ii) no deterioration due to repeated usage; iii) possibility of high-speed writing; iv) small size and adaptability for high recording density; and v) superior resistance against radiation. These merits are discussed hereinbelow in detail.

i) non-volatility

Thanks to the bistability of the direction of magnetization proper to the magnetic material, the information written as the direction of magnetization is maintained unchanged in the absence of the driving power, ii) no deterioration due to repeated usage There is also proposed a memory employing a dielectric material exhibiting bistability as does a magnetic material (ferroelectric random access memory F-RAM). In this F-RAM, the memory state is rewritten by reversing the spontaneous dielectric polarization. However, since the inversion of spontaneous dielectric polarization corresponding to rewriting of the memory state is accompanied by ionic movement in a crystal lattice, repetition of rewriting over one million times leads to development of crystal defects. Thus, with F-RAM, the service life of the element, that cannot be surpassed due to fatigue of the material, poses a problem. On the other hand, since the inversion of magnetization of the magnetic material is not accompanied by ionic movement, an element exploiting the magnetic material can be used almost limitlessly for re-writing without limitation due to fatigue of the material.

iii) possibility of high-speed writing

The speed of inversion of magnetization of the magnetic material is as fast as approximately one ns, so that, by exploiting this high switching rate, high-speed writing becomes possible.

iv) small size and adaptability to high recording density

The magnetic properties of a magnetic alloy can be varied extensively subject to selection of the composition or structure. Thus, an element utilizing a magnetic material has an extremely high degree of freedom in deigning. With the element exploiting a magnetic material, it is possible to utilize electrically conductive magnetic alloy. If the electrically conductive magnetic alloy is used, the current density in the element higher than with the use of a semiconductor is assured, thus enabling further minution and higher recording density than is possible with the use of the semiconductor element.

As an element exploiting these properties, a spin transistor, as described in Journal of Society of Applied Magnetic Science of Japan, vol.19,684 (1995), has been proposed. A spin transistor has its emitter constituted by a magnetic material E, while having its collector and base constituted by a magnetic material C and a non-magnetic material B, respectively, as shown in FIG. 1. With this spin transistor, an output voltage dependent on the direction of magnetization of the magnetic materials C, E is generated by the polarization density which seeps from the magnetic materials C, E towards the non-magnetic material B. Meanwhile, the structure of the spin transistor shown in FIG. 1 is such that an output voltage depends on the direction of magnetization of the magnetic materials C and E. The direction of magnetization is changed by furnishing the current pulses for magnetization to a current line for magnetization 500 and by applying the magnetic field generated by the current pulses for magnetization P to the magnetic materials C and E.

v) superior resistance against radiations

If ionized radiations traverse an element, the memory state of which is created by charging into electrical capacitance, such as a dynamic random access memory (DRAM), electrical discharging is produced, so that the store information is lost. Conversely, the direction of magnetization of the magnetic material is not disturbed by the ionized radiations. Thus, the element exploiting a magnetic material is superior in resistance against radiation. Therefore, the element exploiting a magnetic material is particularly useful for application in need of high resistance against radiations, such as communication satellite. In actuality, a magnetic bubble memory, among the memories exploiting the magnetic material, is already finding use asa memory loaded on a communication satellite.

The device exploiting the magnetic material has many advantages, as discussed above. As a device for taking advantage of these merits, a solid magnetic memory has been proposed. The solid magnetic memory is a magnetic storage device employing an array of magnetic materials asa storage medium and, in distinction from a magnetic tape or a magnetic disc, performs the storage operation without being accompanied by movement of a storage medium.

In the conventional solid magnetic memory, a simple addressing method, exploiting the properties of the magnetic material, is used. The addressing method in the conventional solid magnetic memory is now explained.

In the solid magnetic memory, a magnetic thin film, exhibiting uniaxial magnetic anisotropy, is used. The magnitude of the magnetic field, required for inducing inversion of magnetization in the magnetic thin film, depends on the direction of application of the magnetic field. That is, inversion of magnetization can be induced with a smaller strength of the magnetic field if the magnetic field is applied in a direction inclined by approximately 45° from the easy axis than if the magnetic field is applied in a direction parallel to the easy axis. In the conventional solid magnetic memory, these properties can be utilized for addressing of recording bits to enable the use of an extremely simple addressing system.

That is, in the conventional solid magnetic memory, word lines W1, W2, W3, . . . and bit lines B1, B2, B3, . . . are arrayed at right angles to one another, and storage carriers A-1, A-2, . . . , B-1, B-2, . . . , C-1, C-2, . . . are arranged at the points of intersections, as shown in FIG. 2. That is, in the conventional solid magnetic memory, storage carriers are arrayed in an x-y matrix configuration to constitute a memory chip. The easy axis of each storage carrier is aligned along the word line direction.

If the word line W2 and the bit line B1 are selected and appropriate current is fed therethrough, inversion of magnetization occurs only in a storage carrier B-1 at a point of intersection of the two lines. The word line W2 and the bit line B1, fed with the current, apply the magnetic field across plural storage carriers arrayed thereon. It is noted that the magnetic field from one of the word line W2 or the bit line B1 is insufficient to cause inversion of magnetization. It is only when a magnetic field Hw from the word line W2 and the magnetic field H, from the bit line B1 are synthesized to give the magnetic field oriented 45° relative to the easy axis that inversion of magnetization is produced, that is, it is only in the storage carrier B-1 that the inversion of magnetization is produced. That is, in the conventional solid magnetic memory, the fact that inversion of magnetization is induced in the storage carrier only when the magnetic field applied across the storage carrier is oriented 45° relative to the easy axis is utilized for selecting a specified storage carrier.

That is, in the conventional solid magnetic memory, a specified storage carrier can be selected to induce the inversion of magnetization using a simple arrangement of intersecting electrically conductive lines to render it possible to use an extremely simplified addressing system.

Although the elements exploiting the magnetic material has a number of merits, as discussed above, there are also presented certain demerits. The demerits produced in elements utilizing a magnetic material are explained taking an example of a solid magnetic memory. These demerits, now explained, are unexceptionally brought about due to application of the magnetic fields in the storage carriers for writing.

(i) Cross-talk

In the conventional solid magnetic memory, writing in the memory is by applying a magnetic field across the memory. However, since the magnetic field is of a force acting from a distant point, a non-negligible effect acts on an area neighboring to the selected storage carrier if the storage carrier density is high, thus producing the crosstalk. Although the designing approach of a memory cell having a magnetic field shielding structure is reported in Z. G. Wang et al, IEEE Trans Magn., Mag33, 4498 (1997), the proposed memory cell is complex in structure.

(ii) Lowered Coercivity due to Design Rule Minuting

In the conventional solid magnetic memory, the writing magnetic field is produced by the current. However, there is imposed a limit on the density of the current that can be transported by a conductor $i[A/m^2]$ depending on the material used. The result is that, as the design rule becomes finer and the conductor is finer in diameter, the upper limit of the current that can be used is decreased.

If the diameter of a conductor is D[m], the strength of the magnetic field H[A/m] separated at a distance L from the center of the conductor is given by the equation (1):

$$H=(\pi i D^2/4)/4(2\pi L) \tag{1}$$

The center-to-center distance between the conductor and the storage carrier is not markedly smaller than D, so that, if L=D, the strength of the magnetic field applied to the storage carrier is given by the equation (2):

$$H=(\pi i D^2/4)/(2\pi L)=iD/8 \tag{2}$$

If the allowable current density i is such that $i=10^7[A/cm^2]=10^{11}[A/m^2]$ and $D'[\mu m]=D[m]\times 10^6$, the strength of the magnetic field H applied to the storage carrier is given by the equation (3):

$$H=12500\times D'[A/m]=156\times D'[Oe] \tag{3}$$

That is, if the magnetic material as the storage carrier is located closer to the center of the conductor by design rule minuting, in order to take account of the effect of the storage carrier approaching the source of the magnetic field, the maximum magnetic field that can be utilized is decreased substantially in proportion to the design rule value.

On the other hand, the coercivity of the storage carrier needs to be designed so that inversion of magnetization will be realized by the magnetic field applied from outside. Thus, if the magnetic field that can be applied to the storage carrier is decreased with design rule minuting, the coercivity of the storage carrier needs to be reduced correspondingly. That is, with the solid magnetic memory, the coercivity of the storage carrier needs to be reduced. However, if the coercivity of the storage carrier is reduced excessively, the operational reliability is lowered. This poses a serious problem in a memory for portable electronic equipment used in an environment subjected to a disturbing magnetic field from the ambient.

These problems inherent in the conventional solid magnetic memory arise due to application of the magnetic field across the storage carrier for writing. For overcoming these problems, it is necessary to reconsider the problems beginning from the addressing method of specifying an optional storage carrier selected as an object of writing or readout to achieve the targeted operation.

Meanwhile, the above-mentioned problem is ascribable to application of the magnetic field from outside to reverse the state of magnetization of the storage carrier and is not limited to the case of the solid magnetic memory. Similar problems arise in, for example, a spin transistor shown in FIG. 1. In the spin transistor, which realizes the function that the output is varied in dependence upon the direction of magnetization of the element constituent, an input operation, that is the operation of varying the direction of magnetization of the magnetic element taking part in output decision, is by the application of the magnetic field from the nearby current, as in the case of the above-mentioned solid magnetic memory. Therefore, the problem specified above in case of the solid magnetic memory also arises in the case of the spin transistor.

The above problem can be avoided if it is possible to control the magnetization without utilizing the magnetic field. As a technique of controlling the magnetization without using the magnetic field, there is proposed such a technique employing a ferromagnetic layer/semiconductor layer/ferromagnetic layer, layered together, as disclosed in "Mattson et al, Phys. Rev. Lett. 71 (1993) 185".

This exploits the fact that magnetic coupling between the ferromagnetic layers depends on the carrier concentration of the semiconductor layer as an intermediate layer. In the ferromagnetic layer/semiconductor layer/ferromagnetic layer, layered together, magnetic coupling between the ferromagnetic layers can be changed from parallel to antiparallel, as an example, by controlling the carrier concentration of the semiconductor layer as an intermediate layer. Thus, if the coercivity of one of the magnetic layers (fixed layer) is increased, it is possible to rotate the magnetization of the opposite side magnetic layer (movable layer) with respect to the fixed layer. This technique, which enables rotation of magnetization by an electrical input, is viewed as promising as a technique of realizing the samll-sized solid-state device.

Meanwhile, in the ferromagnetic layer/semiconductor layer/ferromagnetic layer, layered together, there is produced indirect magnetic interaction between the ferromagnetic layers via the semiconductor layer. In order to control the magnetic coupling between the ferromagnetic layers by controlling the carrier concentration of the semiconductor layer as the intermediate layer, it is necessary to reduce the film thickness of the semiconductor layer as the intermediate layer.

The reason is that the magnitude of the interaction between the ferromagnetic layers via the semiconductor layer is attenuated exponentially with respect to the thickness of the semiconductor layer. For realizing a realistic magnitude of the interaction, the coercivity of 1000 Oe is accorded by, for example, exchange biasing method, to a piece of a Ni—Fe alloy having a thickness of 2 nm and saturation magnetization of 12500 Gauss. For according an energy equivalent to the energy required for inverting the magnetization of the Ni—Fe alloy by the indirect interaction via the semiconductor layer, it can be estimated, by simple calculations, that the exchange coupling constant need to be not less than 0.02 erg/cm$^2$. From the thesis by J. J. de Vries, entitled "Physical Review Letters" 78 (1997) p.302$^3$, it is seen that the separation between the ferromagnetic layers needs to be approximately 2.5 nm. That is, in order to provide a practically useful element, the thickness of the semiconductor layer needs to be 2.5 nm or less.

It is however not realistic in the current fine working technique to prepare an element using a thin film not larger than 2.5 nm in thickness. Moreover, if such element could be actually prepared, the semiconductor laser of this order of thickness is thought to be acting substantially as an insulation barrier due to the formation of a depletion layer brought about by the formation of a Schottky barrier on an interface between the semiconductor and the ferromagnetic layer. Therefore, it is difficult to implant carriers.

Consequently, an element comprised of the ferromagnetic layer/semiconductor layer/ferromagnetic layer, layered together, cannot be prepared without significant difficulties, although it is theoretically possible to control the magnetization without employing the magnetic field.

SUMMARY OF THE INVENTION

It is therefore an object of the present invention to provide an element exploiting a magnetic material, in which magnetization can be controlled without employing a magnetic field. It is another object of the present invention to provide an element exploiting a magnetic material, in which the addressing function indispensable for the integrated circuit element can be realized at the same time as the problems accompanying writing by utilization of the magnetic field such as crosstalk ascribable to design rule minuting or lowered coercivity are resolved.

In a first aspect of the present invention a magnetized area of a ferromagnetic material is split by a spacer area of a composite material containing a magnetic material and a semiconductor material. A stimulus from outside is applied to the spacer area to change the magnetic interaction between split magnetized areas to control the magnetization of one or more of the split magnetized areas. The magnetization controlling method, information recording method and an information recording element according to this aspect of the present invention are hereinafter explained.

In the magnetization controlling method according to this aspect of the present invention, the magnetized area is split by a spacer area containing the magnetic material and the semiconductor material. A stimulus is applied from outside to the spacer area to change the magnetic interaction between split magnetized areas to control the magnetization of one or more of the split magnetized areas.

This magnetization controlling method utilizes the indirect magnetic interaction between the magnetized areas mediated by the spacer area in order to control the direction of magnetization of the magnetized areas. Since the magnetic material is contained in the spacer area, the magnetic interaction between the magnetized areas of ferromagnetic material can be induced even if the spacer area is of an increased thickness. That is, with the present magnetization controlling method, the magnetization of the magnetized areas can be controlled even if the spacer area is of an increased thickness.

The magnetization controlling method according to this aspect of the present invention includes splitting a magnetized area of a ferromagnetic material by a spacer area having a thickness of not less than 10 nm and applying a stimulus from outside to the spacer area to change the magnetic interaction between split magnetized areas to control the magnetization of one or more of the split magnetized areas.

With the spacer area having a thickness of not less than 10 nm, it is possible to evade the problems otherwise caused by fabrication difficulties or carrier implantation difficulties due to excessively thin thickness of the spacer area. Although there is no particular limitation to the upper limit of the thickness of the spacer area, the thickness is desirably not larger than approximately 1 μm in view of the actual manufacturing process.

An information recording method according to this aspect of the present invention includes splitting a magnetized area of a ferromagnetic material by a spacer area of a composite material containing a magnetic material and a semiconductor material, applying a stimulus from outside to the spacer area in meeting with the information for recording to change the magnetic interaction between split magnetized areas to control the magnetization of one or more of the split magnetized areas, and doing binary or higher multi-valued recording depending on the direction of magnetization of the magnetized area.

With the present information recording method, the indirect magnetic interaction between the magnetized areas mediated by the spacer area is utilized to control the direction of magnetization of the magnetized areas to record the information. Since the magnetic material is contained in the spacer area, the magnetic interaction between the magnetized areas of ferromagnetic material can be induced even if the spacer area is of an increased thickness. That is, with the present information recording method, the magnetization of the magnetized areas can be controlled to record the information even if the spacer area is of an increased thickness.

An information recording method according to this aspect of the present invention includes splitting a magnetized area of a ferromagnetic material by a spacer area having a thickness of not less than 10 nm, applying a stimulus from outside to the spacer area in meeting with the information for recording to change the magnetic interaction between split magnetized areas to control the magnetization of one or more of the split magnetized areas, and doing binary or higher multi-valued recording depending on the direction of magnetization of the magnetized area.

With the spacer area having a thickness of not less than 10 nm, it is possible to evade the problems otherwise caused by fabrication difficulties or carrier implantation difficulties due to excessively thin thickness of the spacer area. Although there is no particular limitation to the upper limit of the thickness of the spacer area, the thickness is desirably not larger than approximately 1 $\mu$m in view of the actual manufacturing process.

An information recording element according to this aspect of the present invention has a structure in which a magnetized area of a ferromagnetic material is split by a spacer area of a composite material containing a magnetic material and a semiconductor material. The stimulus in meeting with the information for recording is applied from outside to the spacer area to change the magnetic interaction between split magnetized areas to control the magnetization of one or more split magnetized areas, and binary or higher multi-valued recording is made depending on the direction of magnetization of the magnetized areas.

With the present information recording element, the indirect magnetic interaction between the magnetized areas mediated by the spacer area is utilized to control the direction of magnetization of the magnetized areas to record the information. Since the magnetic material is contained in the spacer area, the magnetic interaction between the magnetized areas of ferromagnetic material can be induced even if the spacer area is of an increased thickness. That is, with the present information recording element, the magnetization of the magnetized areas can be controlled to record the information even if the spacer area is of an increased thickness.

An information recording element according to this aspect of the present invention has a structure in which a magnetized area of a ferromagnetic material is split by a spacer area having a thickness not less than 10 nm. There is applied the stimulus in meeting with the information for recording from outside to the spacer area to change the magnetic interaction between split magnetized areas to control the magnetization of one or more split magnetized areas, and binary or higher multi-valued recording is made depending on the direction of magnetization of the magnetized areas.

With the spacer area having a thickness of not less than 10 nm, it is possible to evade the problems caused by fabrication difficulties or carrier implantation difficulties due to excessively thin thickness of the spacer area. Although there is no particular limitation to the upper limit of the thickness of the spacer area, the thickness is desirably not larger than approximately 1 $\mu$m in consideration of the actual manufacturing process.

In the magnetization controlling method, information recording method or the information recording element, according to this aspect of the present invention, the stimulus from outside may be one of electrical stimulation, light illumination or temperature control. The composite material used for the spacer area may be enumerated by magnetic semiconductor, a medium comprised of ferromagnetic particles dispersed in a magnetic semiconductor, a multi-layer film assembly of a ferromagnetic film and a semiconductor film and a multi-layer film assembly of a ferromagnetic film and a magnetic semiconductor film. These may be used alone or in combination for the spacer area.

In a second aspect of the present invention, a layered film assembly is constructed by an electrically conductive layer containing an electrically conductive material and plural magnetic layers so that the electrically conductive layer is arranged between the magnetic layers, and the current is caused to flow through the electrically conductive layer of the layered film assembly to change the magnetic coupling state between the magnetic layers to control the direction of magnetization of the magnetic layers. The magnetization controlling method, information recording method and an information recording element according to this aspect of the present invention are hereinafter explained.

A magnetization controlling method according to this aspect of the present invention includes constructing a layered film assembly, obtained on layering an electrically conductive layer containing an electrically conductive material and a plurality of magnetic layers so that the electrically conductive layer is disposed between the magnetic layers, and causing the current to flow in the electrically conductive layer of the layered assembly to change the magnetic coupling state between the magnetic layers to control the direction of magnetization of the magnetic layers.

In this magnetization controlling method, a composite material containing a substance exhibiting magnetic order in a sole phase and a non-magnetic material, a layered film assembly or a composition-modulated film made up of alternately arranged regions of the ferromagnetic composition and regions of non-magnetic composition, or a three-dimensional mixture of the regions of the ferromagnetic composition and regions of non-magnetic composition, may be used as the electrically conductive layer.

In the magnetization controlling method, it is possible to provide layers of a material having an electrical resistance higher than that of the electrically conductive layer as an overlying layer and an underlying layer of the electrically conductive layer. If, in this case, the current is caused to flow through the layered film assembly, the current is concentrated in the electrically conductive layer.

A magnetic functional element according to this aspect of the present invention includes a layered assembly, obtained on layering an electrically conductive layer containing an electrically conductive material and a plurality of magnetic layers so that the electrically conductive layer is disposed between the magnetic layers. The current is caused to flow in the electrically conductive layer of the layered assembly to change the magnetic coupling state between the magnetic layers to control the direction of magnetization of the magnetic layers. In this magnetic functional element, magneto-optical effects, such as magneto-optical Kerr effect or the Faraday effect, are used to provide an output in meeting with the magnetized state of the magnetic layers.

In this magnetic functional element, a composite material containing a substance exhibiting magnetic order in a sole phase and a non-magnetic material, a layered film assembly or a composition-modulated film made up of alternately arranged regions of the ferromagnetic composition and regions of non-magnetic composition, or a three-dimensional mixture of the regions of the ferromagnetic composition and regions of non-magnetic composition, may be used as the electrically conductive layer.

In the magnetic functional element, it is possible to provide layers of a material having an electrical resistance higher than that of the electrically conductive layer as an overlying layer and an underlying layer of the electrically conductive layer. If, in this case, the current is caused to flow through the layered film assembly, the current is concentrated in the electrically conductive layer.

An information recording method according to this aspect of the present invention includes constructing a layered assembly by layering an electrically conductive layer containing an electrically conductive material and a plurality of magnetic layers so that the electrically conductive layer is disposed between the magnetic layers, causing the current to flow in the electrically conductive layer of the layered assembly to change the magnetic coupling state between the magnetic layers to control the direction of magnetization of the magnetic layers and doing binary or higher multi-valued recording based on the direction of magnetization of the magnetic layers.

In the present information recording method, a composite material containing a substance exhibiting magnetic order in a sole phase and a non-magnetic material, a layered film assembly or a composition-modulated film made up of alternately arranged regions of the ferromagnetic composition and regions of non-magnetic composition, or a three-dimensional mixture of the regions of the ferromagnetic composition and regions of non-magnetic composition, may be used as the electrically conductive layer.

Also, in the present information recording method, it is possible to provide layers of a material having an electrical resistance higher than that of the electrically conductive layer as an overlying layer and an underlying layer of the electrically conductive layer. If, in this case, the current is caused to flow through the layered film assembly, the current is concentrated in the electrically conductive layer.

An information recording element according to this aspect of the present invention includes a layered assembly, obtained on layering an electrically conductive layer containing an electrically conductive material and a plurality of magnetic layers so that the electrically conductive layer is disposed between the magnetic layers. The current is caused to flow in the electrically conductive layer of the layered assembly to change the magnetic coupling state between the magnetic layers to control the direction of magnetization of the magnetic layers, and binary or higher multi-valued recording is made based on the direction of magnetization of the magnetic layers. With the present information recording element, the direction of magnetization of the magnetic layers is detected by exploiting the magneto-optical effect, such as the magneto-optical Kerr effect or the Faraday effect to read out the recorded information.

In the present information recording element, a composite material containing a substance exhibiting magnetic order in a sole phase and a non-magnetic material, a layered film assembly or a composition-modulated film made up of alternately arranged regions of the ferromagnetic composition and regions of non-magnetic composition, or a three-dimensional mixture of the regions of the ferromagnetic composition and regions of non-magnetic composition, may be used as the electrically conductive layer.

Also, in the present information recording element, it is possible to provide layers of a material having an electrical resistance higher than that of the electrically conductive layer as an overlying layer and an underlying layer of the electrically conductive layer. If, in this case, the current is caused to flow through the layered film assembly, the current is concentrated in the electrically conductive layer.

A variable resistance element according to this aspect of the present invention includes a layered assembly made up of a first magnetic layer, a second magnetic layer, a non-magnetic layer and a third magnetic layer, layered together. The current is caused to flow in the electrically conductive layer of the layered assembly to change the magnetic coupling state between the first magnetic layer and the second magnetic layer to control the direction of magnetization of the second magnetic layer to control the electrical resistance of a current path including the second magnetic layer, nonmagnetic layer and the third magnetic layer.

In the present variable resistance element, a composite material containing a substance exhibiting magnetic order in a sole phase and a non-magnetic material, a layered film assembly or a composition-modulated film made up of alternately arranged regions of the ferromagnetic composition and regions of non-magnetic composition, or a three-dimensional mixture of the regions of the ferromagnetic composition and regions of non-magnetic composition, may be used as the electrically conductive layer.

Also, in the present variable resistance element, it is possible to provide layers of a material having an electrical resistance higher than that of the electrically conductive layer as an overlying layer and an underlying layer of the electrically conductive layer. If, in this case, the current is caused to flow through the layered film assembly, the current is concentrated in the electrically conductive layer.

In a third aspect, the present invention utilizes the exchange interaction propagated through the solid phase as means for designating an optional storage carrier selected for writing or readout t achieve the targeted operation. The magnetic storage device and the addressing method in this third aspect are hereinafter explained.

A magnetic storage device according to this aspect of the present invention includes an array of a plurality of split magnetic members as storage carriers, wherein exchange interaction propagated through a solid phase is used as means for designating an optional one of storage carriers selected for writing or readout to achieve a targeted operation.

In exploiting the exchange interaction propagated through the solid phase, there is used a structure comprised of a coupling control layer sandwiched between two magnetic layers. The exchange interaction used in this case is the exchange interaction operating between two magnetic layers arranged on both sides of the coupling control layer. If the optional storage carrier is selected for writing or readout, changes in the exchange interaction between the two magnetic layers, generated by application of stimuli, such as electrical or optical stimuli, to the coupling control layer, are used.

As the coupling control layer, a semiconductor layer, for example, is used. The exchange interaction is mediated by valence electrons of the semiconductor layer. If the optional storage carrier is selected for writing or readout, changes in the exchange interaction between the two magnetic layers, generated by application of electrical stimuli to the semiconductor layer, are used.

As the coupling control layer, a dielectric layer, for example, may be used. In this case, the exchange interaction is mediated by electrons migrated between the magnetic layers via the dielectric layer by the tunnel effect. If the optional storage carrier is selected for writing or readout, changes in the exchange interaction between the two magnetic layers, generated by varying the tunnel barrier height of the dielectric layer, are used.

As the coupling control layer, an electrically conductive layer, for example, may be used. In this case, the exchange interaction used is the exchange interaction operating between two magnetic layers via the electrically conductive layer. If the optional storage carrier is selected for writing or readout, changes in the exchange interaction between the two magnetic layers, generated by causing the current to flow in the electrically conductive layer, are used.

Also, as the coupling control layer, such a layer with a film thickness of not less than 10 nm containing a magnetic material may be used. Specifically, a multi-layered structure made up of a magnetic layer and a non-ferromagnetic layer, or a structure comprised of a dispersion of magnetic particles in a non-magnetic material, is preferred.

In the magnetic storage device, a magnetic layer formed of a hard magnetic material may be formed as an underlying layer for a structure comprised of a coupling control layer sandwiched between two magnetic layers. As the magnetic layers, arranged on either sides of the coupling control layer, a layered film assembly comprised of a pair of magnetic layers layered via an intermediate layer so that the directions of magnetization thereof are antiparallel to each other. Between the magnetic layers and the coupling control layer, there may be provided a thin film formed of an electrically insulating material mediating the magnetic coupling.

In the magnetic storage device, a plurality of linear members are arranged intersecting one another, each storage carrier being arranged at a point of intersection of the linear members. In selecting an optional storage carrier for writing or readout, magnetic interactions exerted by two or more of the linear members on the storage carrier are combined to effect writing or readout on selected storage carriers, and at least one of the magnetic interactions is exchange interaction propagated through a solid phase.

In the present magnetic storage device, a plurality of linear members are arranged intersecting one another, each storage carrier being arranged at a point of intersection of the linear members. In selecting an optional storage carrier for writing or readout, the direction of magnetization of a storage carrier is controlled by the combination of magnetic interactions exerted from three or more linear members on the storage carrier, and at least one of the magnetic interactions is exchange interaction propagated through a solid phase.

An addressing method in a magnetic storage'device having an array of plural split magnetic members as a storage carrier according to this aspect of the present invention includes exploiting the exchange interaction propagated through a solid phase in selecting an optional storage carrier for writing or readout.

In exploiting the exchange interaction propagated through the solid phase, there is used a structure comprised of a coupling control layer sandwiched between two magnetic layers. The exchange interaction used in this case is the exchange interaction operating between two magnetic layers arranged on both sides of the coupling control layer. If the optional storage carrier is selected for writing or readout, changes in the exchange interaction between the two magnetic layers, generated by application of stimuli, such as electrical or optical stimuli, to the coupling control layer, are used.

As the coupling control layer, a semiconductor layer, for example, is used. The exchange interaction is mediated by valence electrons of the semiconductor layer. If the optional storage carrier is selected for writing or readout, changes in the exchange interaction between the two magnetic layers, generated by application of electrical stimuli to the semiconductor layer, are used.

As the coupling control layer, a dielectric layer, for example, may be used. In this case, the exchange interaction is mediated by electrons migrated between the magnetic layers via the dielectric layer by the tunnel effect. If the optional storage carrier is selected for writing or readout, changes in the exchange interaction between the two magnetic layers, generated by varying the tunnel barrier height of the dielectric layer, are used.

As the coupling control layer, an electrically conductive layer, for example, may be used. In this case, the exchange interaction used is the exchange interaction operating between two magnetic layers via the electrically conductive layer. If the optional storage carrier is selected for writing or readout, changes in the exchange interaction between the two magnetic layers, generated by causing the current to flow in the electrically conductive layer, are used.

Also, as the coupling control layer, such a layer with a film thickness of not less than 10 nm containing a magnetic material may be used. Specifically, a multi-layered structure made up of a magnetic layer and a non-ferromagnetic layer, or a structure comprised of a dispersion of magnetic particles in a non-magnetic material, is preferred.

In the addressing method according to the present invention, a plurality of linear members are arranged intersecting one another, each storage carrier being arranged at a point of intersection of the linear members. In selecting an optional storage carrier for writing or readout, the magnetic interactions exerted from two or more linear members on the storage carrier are combined to effect writing or readout for the selected storage carrier, and at least one of the magnetic interactions is exchange interaction propagated through a solid phase.

In the addressing method according to the present invention, a plurality of linear members are arranged intersecting one another, each storage carrier being arranged at a point of intersection of the linear members. In selecting an optional storage carrier for writing or readout, the direction of magnetization of a storage carrier is controlled by the combination of magnetic interactions exerted from three or more linear members on the storage carrier, and at least one of the magnetic interactions is exchange interaction propagated through a solid phase.

According to this aspect of the present invention, there is provided an element that is able to control the magnetization of a magnetic member without employing a magnetic field. Thus, according to this aspect of the present invention, it is possible to eliminate the problem resulting from the writing with the use of a magnetic field in an element exploiting a magnetic member, such as crosstalk generation due to minuted design rule or lowered coercivity. Morever, according to this aspect of the present invention, an addressing function indispensable for an integrated circuit element can be realized despite the use of the element exploiting a magnetic member.

BRIEF DESCRIPTION OF THE DRAWINGS

FIGS. 3A and 3B illustrate the manner of modulating the magnetized state of the magnetized area of a ferromagnetic material by stimuli to a spacer area when the magnetized area is split by the spacer area, wherein FIG. 3A shows the state in which stimuli are not given the spacer area and FIG. 3B shows the state in which stimuli are given the spacer area to invert the direction of magnetization of one of the magnetized areas.

FIGS. 31A to 31C are schematic views for illustrating the driving principle of a negative logic write-once type information recording element, wherein FIG. 31A shows a reset state, FIG. 31B shows an ON state and FIG. 31C shows a set state.

FIGS. 32A to 32C are schematic views for illustrating the driving principle of a positive logic write-once type information recording element, wherein FIG. 32A shows a reset state, FIG. 32B shows an ON state and FIG. 32C shows a set state.

FIG. 3A shows the state in which the direction of magnetization of the movable magnetic layer is kept rightwards, FIG. 33B shows the state of rewriting the direction of magnetization of the movable magnetic layer to leftwards, FIG. 33C shows the state in which the direction of magnetization of the movable magnetic layer is kept leftwards, and FIG. 33D shows the state of rewriting the direction of magnetization of the movable magnetic layer to rightwards.

FIGS. 40A to 40E illustrate the driving principle of the memory cell shown in FIG. 39, wherein FIG. 40A shows the state in which the direction of magnetization of a storage carrier is kept rightwards, FIG. 40B shows the state in which the current is allowed to flow only in the second conductor layer constituting the second y-direction driving line, FIG. 40C shows the state of rewriting the direction of magnetization of the storage carrier to leftwards, FIG. 40D shows the state n which the current is allowed to flow only in the first conductor layer constituting the first y-direction driving line, FIG. 40E shows the state of rewriting the direction of magnetization of the storage carrier to rightwards.

DESCRIPTION OF THE PREFERRED EMBODIMENTS

Figure 1:
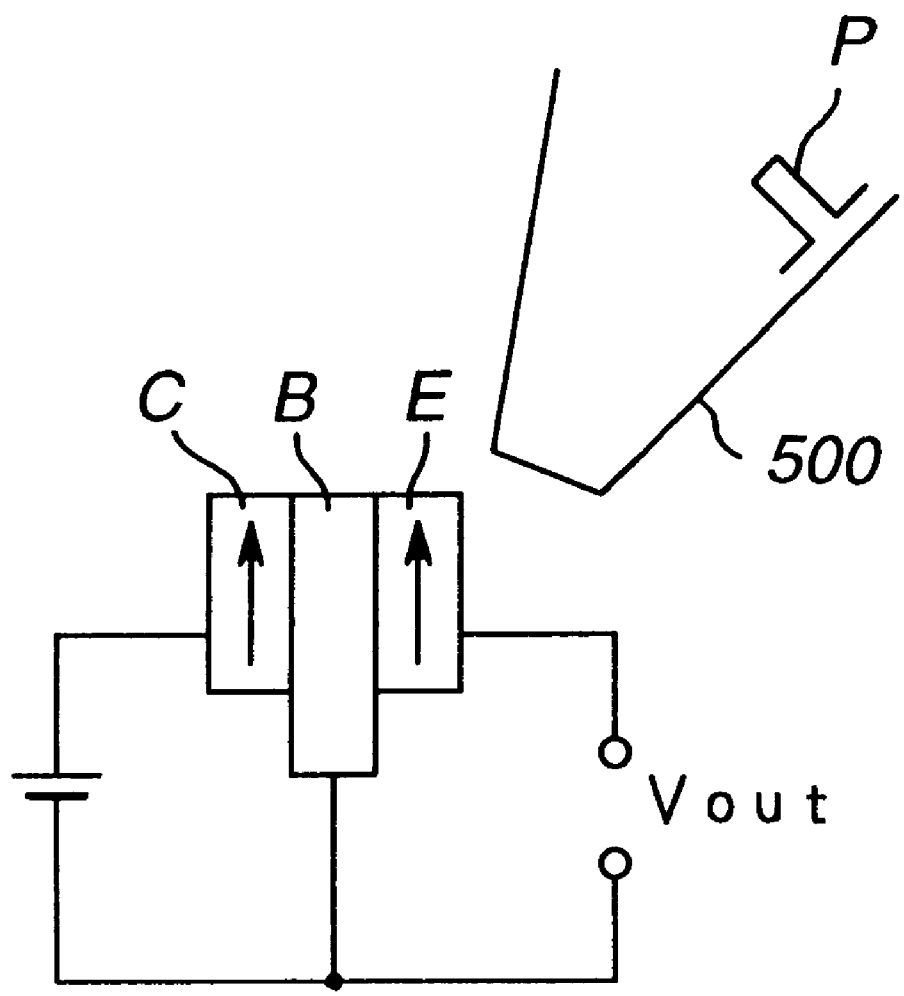
FIG. 1 shows the structure of a spin transistor.

Referring to the drawings, preferred embodiments of the present invention will be explained in detail.

1. First Embodiment

In a first embodiment, a magnetized area by a ferromagnetic material is divided by a spacer area of a composite material containing a magnetic material and a semiconductor material and stimuli are applied to the spacer area from outside to vary the magnetic interaction between the divided magnetized areas to control the magnetization of one or more magnetized areas. The method of controlling the magnetization, information recording method and the information recording element employing the above basic concept are hereinafter explained.

1-1 Principle of the Magnetization Control Method

Figure 3A:
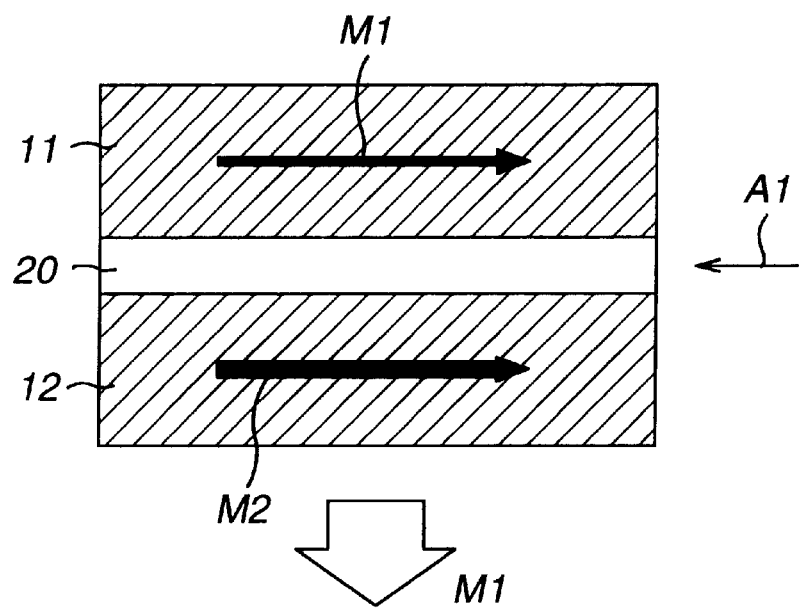
Figure 3B:
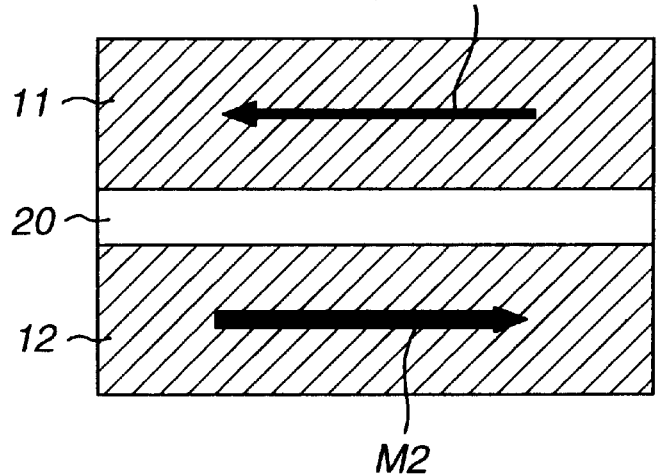

First, the basic principle of the magnetization controlling method is explained by referring to FIGS. 3A and 3B.

Referring to FIG. 3A, a magnetized area 11, formed of a ferromagnetic material, a spacer area 20, formed of a composite material including a magnetic material and a semiconductor material, and a magnetized area 12, formed of a ferromagnetic material, are layered together to provide a structure comprised of the spacer area 20 sandwiched between the magnetized areas 11, 12. If, in this layered structure, the concentration of electrons of the conduction bands or positive holes of the valence electron bands of the semiconductor contained in the spacer area 20 is varied, the RKKY interaction between the magnetized areas via these carriers is changed. Therefore, the magnetic coupling between the magnetized area 11 and the opposite side magnetized area 12 can be controlled by controlling the carrier concentration of the spacer area 20.

Thus, external stimuli are applied to the spacer area 20, as indicated by arrow A1 in FIG. 3, to vary the concentration of the electrons of the conduction bands or positive holes of the valence electron bands of the semiconductor contained in the spacer area 20 and hence the magnetic interaction between the magnetized areas 11 and 12 to control the magnetization of the magnetized areas 11 and 12. By varying the magnetic interaction between the magnetized areas 1, 12 to control the magnetization thereof, it is possible to cause transition of direction of magnetization M1 of the magnetized area 11 and the direction of magnetization M2 of the magnetized area 12 from the parallel state shown in FIG. 3A to the anti-parallel state shown in FIG. 3B.

It is noted that the carrier concentration of the spacer area 20 can be controlled by applying voltage across the spacer area 20 to implant carriers, illuminating light on the spacer area 20 or by controlling the temperature of the spacer area 20. That is, for giving stimuli to the spacer area 20 for controlling the magnetization of the magnetized areas 11, 12, electrical stimulation by carrier implantation, light illumination or temperature control may be used.

1-2 Specified Example of Elements

In the present embodiment, the magnetic material is contained in the spacer area 20 to produce the magnetic interaction between the magnetized areas even if the spacer area 20 is thicker in thickness. A specified example of having the magnetic material contained in the spacer area is hereinafter explained with reference to FIGS. 4 to 6.

Figure 4:
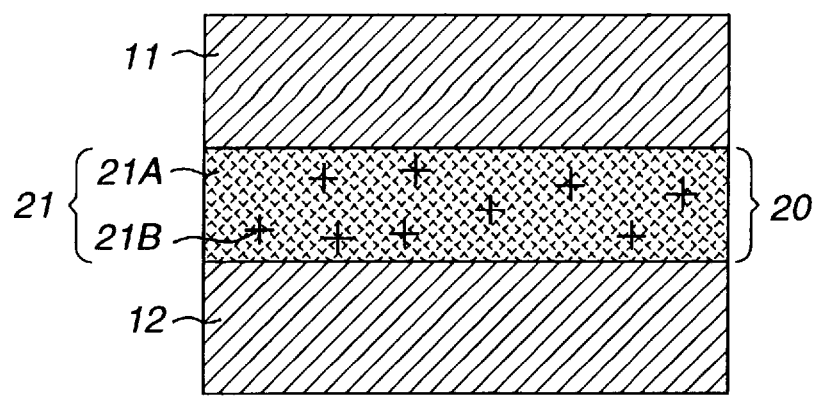
FIG. 4 shows the cross-section of layered assembly obtained on layering a magnetized area formed of a ferromagnetic material, a spacer area of a composite material of a magnetic material and a semiconductor material and a magnetized area of a ferromagnetic material, in which a magnetic semiconductor is used as the composite material used in the spacer area.

FIG. 4 shows an example in which a magnetic semiconductor 21 is used as a composite material used for the spacer area 20. The magnetic semiconductor 21 of such a structure in which magnetic ions 21B are dispersed into a semiconductor matrix 21A. At this time, the magnetized area 11 is coupled with the magnetic ions 21B via the semiconductor matrix 21A of the magnetic semiconductor 21. These magnetic ions 21B are coupled to other magnetic ions 21B. This coupling is repeated until ultimately the magnetized area 11 is coupled to the opposite side magnetized area 12. That is, the magnetized areas 11 and 12 are indirectly coupled to each other via the semiconductor matrix 21A and the magnetic ions 21B.

In general, the phenomenon of generation and extinction of magnetic coupling dependent on the carrier concentration is noticed in the magnetic semiconductor, as discussed in H. Ohno et al, Phys. Rev. Lett. 68 91992) 2664. This phenomenon is termed a carrier-induced ferromagnetism. Therefore, the state of coupling of the magnetic ions 21B to the neighboring magnetic ions 2 1B can be modulated by the carrier concentration of the magnetic semiconductor 21. Thus, with the layered structure, shown in FIG. 4, the indirect magnetic coupling between the magnetized areas 11 and 12 can be controlled by controlling the carrier concentration of the magnetic semiconductor 21 for controlling the direction of magnetization of the magnetized areas 11 and 12.

In this manner, if the magnetic semiconductor 21 is used as the composite material used for the spacer area 20, the magnetized areas 11, 12 can be indirectly coupled to each other via the semiconductor matrix 21A and the magnetic ions 21B, so that the magnetic interaction can be induced between the magnetized areas even if the spacer area 20 is of a thicker thickness. That is, by using the magnetic semiconductor 21 for the spacer area 20, it becomes possible to control the magnetization of the magnetized areas 11, 12 even if the spacer area 20 is of an increased thickness.

The material for the magnetic semiconductor 21 may be II-IV based, III-V based or chalcogenide-based, or a so-called semi-magnetic semiconductor, such as EuTe or EuS. It suffices if the concentration of the magnetic ions 2 1B contained in the magnetic semiconductor 21 is such as to enable the control o the magnetic coupling state between magnetic ions by carrier concentration control.

Figure 5:
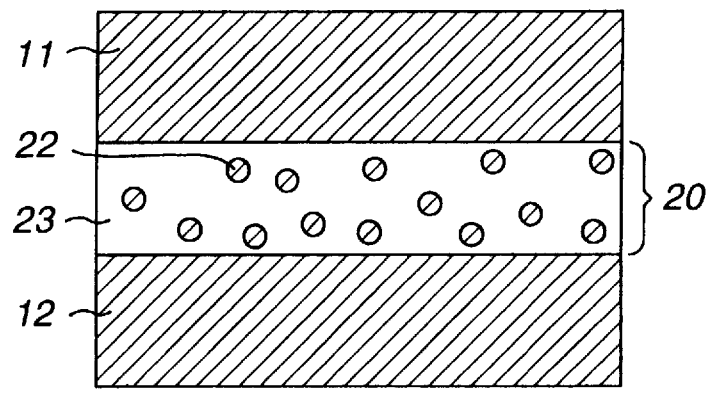
FIG. 5 shows the cross-section of layered assembly obtained on layering a magnetized area formed of a ferromagnetic material, a spacer area of a composite material of a magnetic material and a semiconductor material and a magnetized area of a ferromagnetic material, in which a medium obtained on dispersing a magnetic clusters comprised of ferromagnetic fine particles in the inside of a semiconductor is used as the composite material used in the spacer area.

FIG. 5 shows an embodiment in which a medium obtained on artificially dispersing a magnetic clusters 22 comprised of ferromagnetic particles into the inside of a semiconductor 23 is used as a composite material used for the spacer area 20. The magnetic clusters 22 plays the role similar to that of the magnetic ions 21B in FIG. 4 to realize the effect similar to that achieved by the example shown in FIG. 4.

As the semiconductor 23, a semiconductor comprised of amorphous or crystalline Si or Ge may be used. As the semiconductor 23, a compound semiconductor, an oxide semiconductor or a mixed crystal semiconductor may be used. It suffices if the material of the magnetic clusters 22 exhibits magnetic moment, such that Fe, Co or Ni, alloys thereof, rare earth elements, or alloys containing rare earth elements, may be used. There is no particular limitation to the size, shape or density of the magnetic clusters 22, provided that they permit the magnetic coupling state between the magnetic clusters to be controlled by controlling the carrier concentration of the semiconductor 23.

In the present embodiment, magnetic semiconductors may be used in place of the semiconductor 23. If the magnetic semiconductor is used in place of the semiconductor 23, not only the operation by the magnetic clusters 22 but also that by the magnetic ions as in the embodiment of FIG. 4 is displayed.

Figure 6:
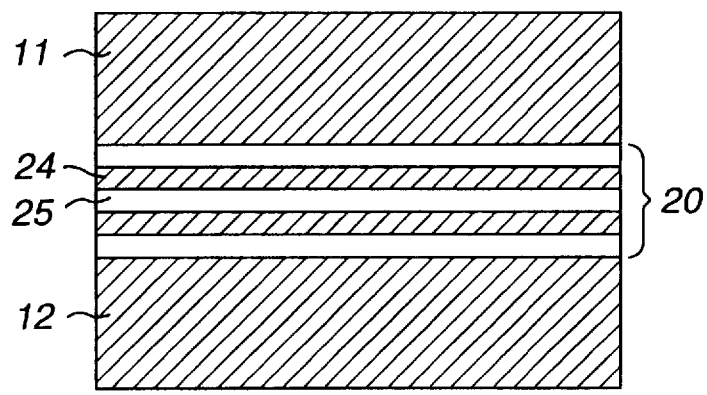
FIG. 6 shows the cross-section of layered assembly obtained on layering a magnetized area formed of a ferromagnetic material, a spacer area of a composite material of a magnetic material and a semiconductor material and a magnetized area of a ferromagnetic material, in which a multi-layer film obtained on layering a ferromagnetic layer and a semiconductor layer together is used as the composite material used in the spacer area.

FIG. 6 shows an embodiment in which the effect similar to that shown in FIGS. 4 and 5 is achieved by using a multi-layered film comprised of ferromagnetic films 24 and semiconductor films 25 layered together as a composite material used for the spacer area 20. In this case, the magnetized area 11 is coupled to the ferromagnetic film 24 closest to the magnetized area 21 via the neighboring semiconductor film 25. This ferromagnetic film 24 is coupled to the closest other ferromagnetic film 24. This coupling is repeated until coupling with the opposite magnetized area 12 is achieved. That is, the magnetized area 11 and the opposite side magnetized area 12 are indirectly coupled to each other via the multi-layered film comprised of the ferromagnetic films 24 and the semiconductor film 25 layered together.

In the multi-layered film, obtained on layering the ferromagnetic films 24 and the semiconductor films 25 together, the magnetic coupling state between the ferromagnetic films is varied in dependence upon the carrier concentration or the semiconductor films 25, as discussed in, for example, E. E. Fullerton et al, J. Magn.& Magn. Mater. 117 (1992) L301. Thus, the coupling state between the ferromagnetic film 24 and the other ferromagnetic film 24 neighboring thereto can be modulated by the carrier concentration of the semiconductor films 25. Thus, by controlling the carrier concentration of the semiconductor films 25, the indirect magnetic coupling between the magnetized area 11 and the opposite side magnetized area 12 can be controlled to control the direction of magnetization of the magnetized areas 11, 12.

The semiconductor films 25 may be formed of amorphous or crystalline semiconductors, such as Si or Ge. The semiconductor films 25 may be formed of a compound semiconductor, an oxide semiconductor or a mixed crystal semiconductor. It suffices if the material of the ferromagnetic films 24 exhibits magnetic moment, such that Fe, Co or Ni, alloys thereof, rare earth elements, or alloys containing rare earth elements, may be used. There is also no limitation to the film thickness or the layering period of the ferromagnetic films 24 or the semiconductor films 25 provided that they permit the magnetic coupling state between the ferromagnetic films to be controlled by controlling the carrier concentration of the semiconductor films 25. in the present embodiment, a magnetic semiconductor film may be used in place of the semiconductor film 25. If the magnetic semiconductor film is used in place of the semiconductor film 25, not only the operation by the magnetic clusters 22 but also that by the magnetic ions as in the embodiment of FIG. 4 is displayed.

Meanwhile, if the structure shown in FIGS. 4 to 6 is used, the magnetization of the magnetized areas 11, 12 can be controlled with the thickness of the spacer area 20 of, for example, not less than 10 nm, it being unnecessary to set the thickness to 2.5 nm or less as in the conventional practice. The reason is that, while the coupling force between ferromagnetic materials via a semiconductor is increased exponentially as the distance between the ferromagnetic materials, indirect coupling occurs via a magnetic material if there is one between the ferromagnetic materials.

Specifically, in an embodiment shown in FIG. 4, magnetic ions 21B present in the spacer area 20 operate as a medium to effect indirect coupling between the magnetized areas 11 and 12 even if the spacer area 20 is of an increased thickness. In the embodiment shown in FIG. 5, the magnetic clusters 22 present in the spacer area 20 act as the medium to effect indirect coupling between the magnetized areas 11 and 12 even if the spacer area 20 is of an increased thickness. In the embodiment shown in FIG. 6, the ferromagnetic films 24 present in the spacer area 20 act as the medium to effect indirect coupling between the magnetized areas 11 and 12 even if the spacer area 20 is of an increased thickness.

Figure 7:
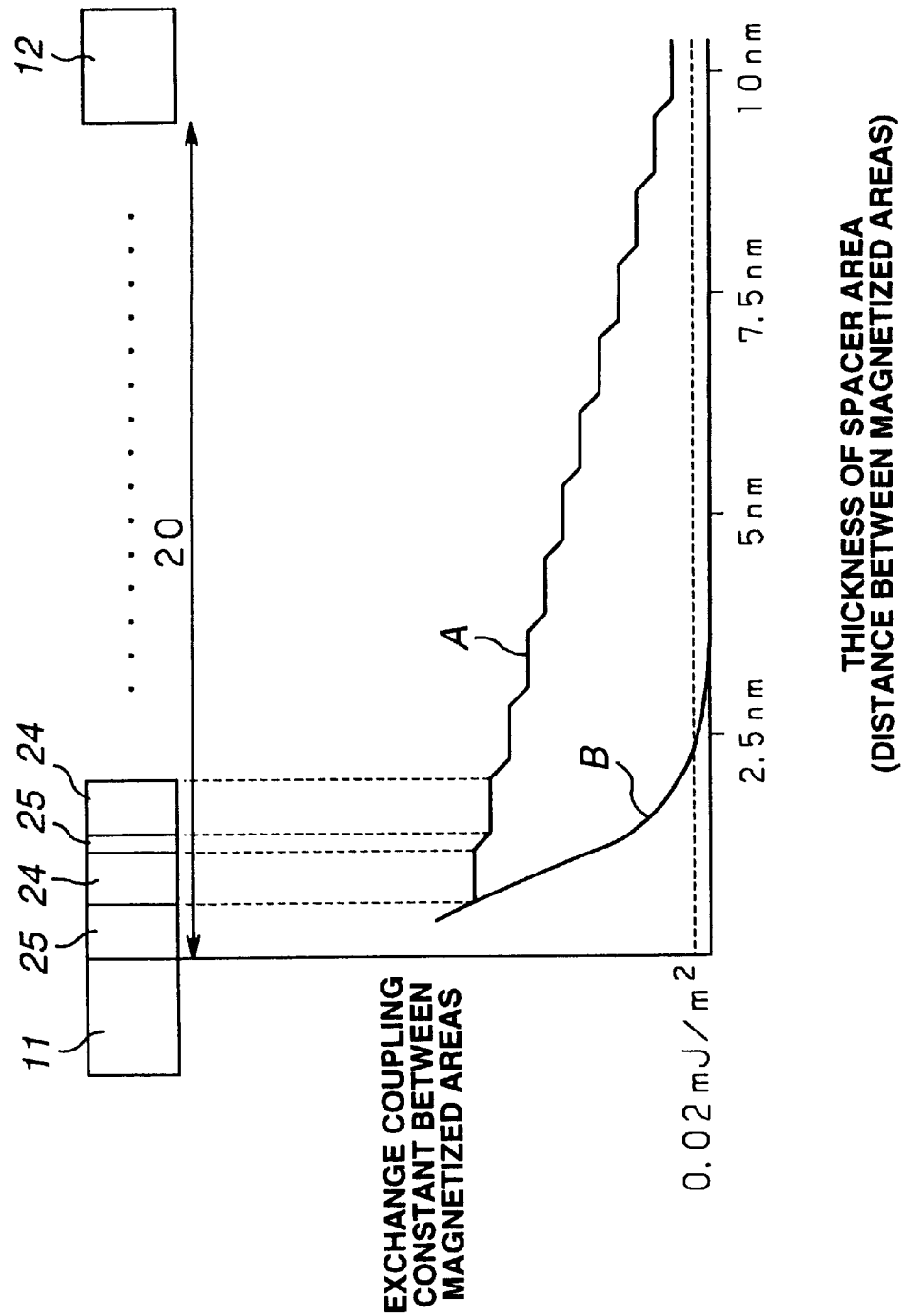
FIG. 7 shows the relation between the thickness of the spacer area and the magnetized area for cases wherein the spacer area is a multilayer film of a ferromagnetic layer and a semiconductor layer and wherein the wherein the spacer area is made up only of a semiconductor layer.

FIG. 7 shows how the magnetized area 11 is indirectly coupled to the other magnetized area 12 via a magnetic material contained in the spacer area 20. In this figure, the abscissa and the ordinate denote the thickness of the spacer area 20 (the distance between the magnetized areas) and the exchange coupling constant between the magnetized areas. Such relation between the thickness of the spacer area 20 and the exchange coupling constant can be checked by providing plural samples of a thickness of the spacer areas 20 changed stepwise by approximately 0.5 nm and by measuring the exchange coupling constants in these samples by, for example, a magnetic resonance method.

In FIG. 7, a solid line A denotes the relation between the thickness of the spacer area 20, that is the distance between the magnetized areas, and the exchange coupling constant, in case of using a multi-layered film of the ferromagnetic films 24 and the semiconductor films 25 as the spacer area 20. It is assumed that the magnetic moments of the respective ferromagnetic films 24 are arranged parallel to one another, that is that the direction of magnetization of the magnetized area 11 is parallel to that of the other magnetized area 12. Stated differently, FIG. 7 shows a case in which the magnetized area 11 is ferromagnetically coupled to the other magnetized area 12 via the ferromagnetic films 24 in-between.

Meanwhile, FIG. 7 also shows, for comparison, the case when the spacer area 20 is constituted solely by the semiconductor. That is, a solid line B in FIG. 7 shows the relation between the thickness of the spacer area 20, that is the distance between the magnetized areas, and the exchange coupling constant, in case the spacer area 20 is formed only of the semiconductor.

Referring to FIG. 7, if the spacer area 20 is formed only of the semiconductor, the exchange coupling constant is attenuated exponentially as the thickness of the spacer area 20 is increased. If the thickness of the spacer area 20 is not less than approximately 2.5 nm, the coupling between the magnetized areas is extremely weak such that no practically useful elements can be constituted. Therefore, the thickness of the spacer area 20 conventionally has to be set to 2.5 nm or less.

Conversely, if the multi-layered film, comprised of the ferromagnetic films 24 and the semiconductor films 25, layered together, is used as the spacer area 20, coupling can be maintained every layering period, because the ferromagnetic films 24 are present in the spacer area 20, as shown in FIG. 7. It is seen from this that, by using a composite material containing the magnetic material and the semiconductor material as the spacer area 20, the magnetized area 11 can be directly coupled to the opposite side magnetized area 12 via the magnetic material operating as a medium. That is, if the composite material comprised of the ferromagnetic films 24 and the semiconductor films 25 is used as the spacer area 20, the spacer area 20 may be significantly thicker than conventionally.

Thus, by applying the present invention, the spacer area 20 can be thicker in thickness than conventionally. If the spacer area 20 has a thickness of the order of not less than 10 mn, the structure comprised of the magnetized areas 11, 12 on both sides of the spacer area 20 can be sufficiently prepared with the current fine processing technique. Moreover, if the thickness of the spacer area 20 is of the order of 10 nm or more, it is possible to overcome the problem of formation of a depletion layer due to formation of the Schottky barrier on the interface between the semiconductor and the ferromagnetic material thus enabling the carriers to be implanted into the spacer area 20.

Of the structures shown in FIGS. 4 to 6, the structure shown in FIG. 4 has a merit that the spacer area is of a homogeneous single-phase structure to facilitate the manufacture. Also, the structure shown in FIG. 5 has a number of paths of magnetic coupling of different strengths. Therefore, the magnetic coupling can be gradually decreased by removing the paths in the order of the increasing coupling strengths. That is, the structure shown in FIG. 5 is meritorious in realization of an analog operation. The structure of FIG. 6 has the merit that it can be controlled more readily to permit higher reproducibility of desirable characteristics. Moreover, with the structure shown in FIG. 6, matching of characteristics or material designing can be easily achieved by varying the film thicknesses or the layering period.

In the foregoing description, the instance of coupling by the RKKY interaction is given as an example. However, the principle of indirect interaction is not limited to the RKKY interaction or the like provided that the condition that the coupling state between the magnetized areas can be modulated by controlling the carrier concentration of the spacer area 20 is met. That is, the present invention can be applied to the coupling mediated by tunnel electrons or to the coupling by the localized level in the semiconductor. The coupling mediated by the tunnel electrons is disclosed in for example, P.Bruno, Phys. Rev. B49 (1994) 13231, while that by the localized level in the semiconductor is discussed in, for example, S.Toscano et al, J. Magn. & Magn. Mater. 114 91992) L301.

1-3 Information Recording Element and Information Recording Method

The information recording element and the information recording method , exploiting the above-described magnetization controlling method, is explained with reference to FIGS. 8 to 17.

A first example of the information recording element and the information recording method is first explained with reference to FIGS. 8 to 11. Meanwhile, the information recording element 30 is a write-once type information recording element that is able to make bi-level recording depending on the direction of magnetization of the magnetized area.

Figure 8:
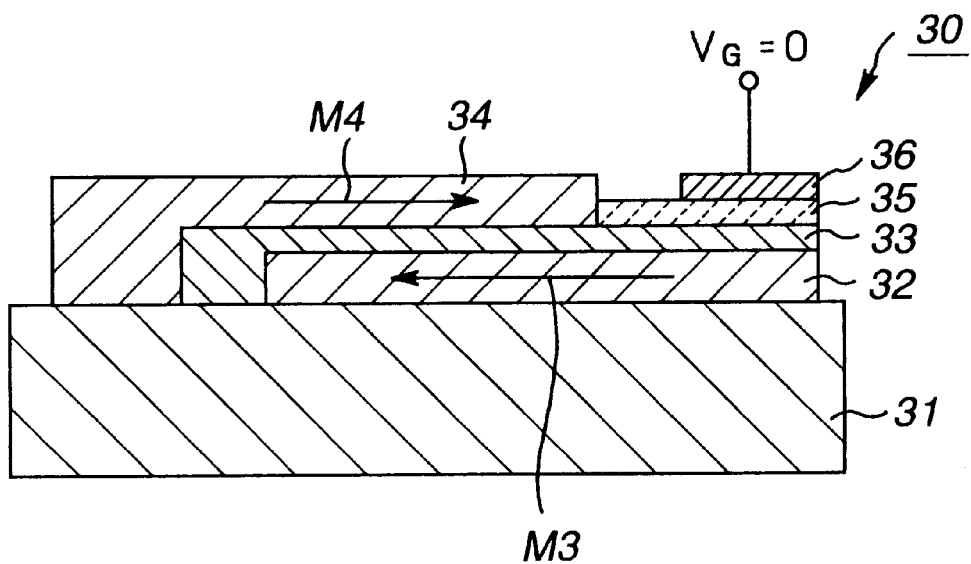
FIG. 8 is a cross-sectional view showing an illustrative information recording element according to the present invention, and specifically showing the state in which no voltage is applied across its gate electrode.
Figure 9:
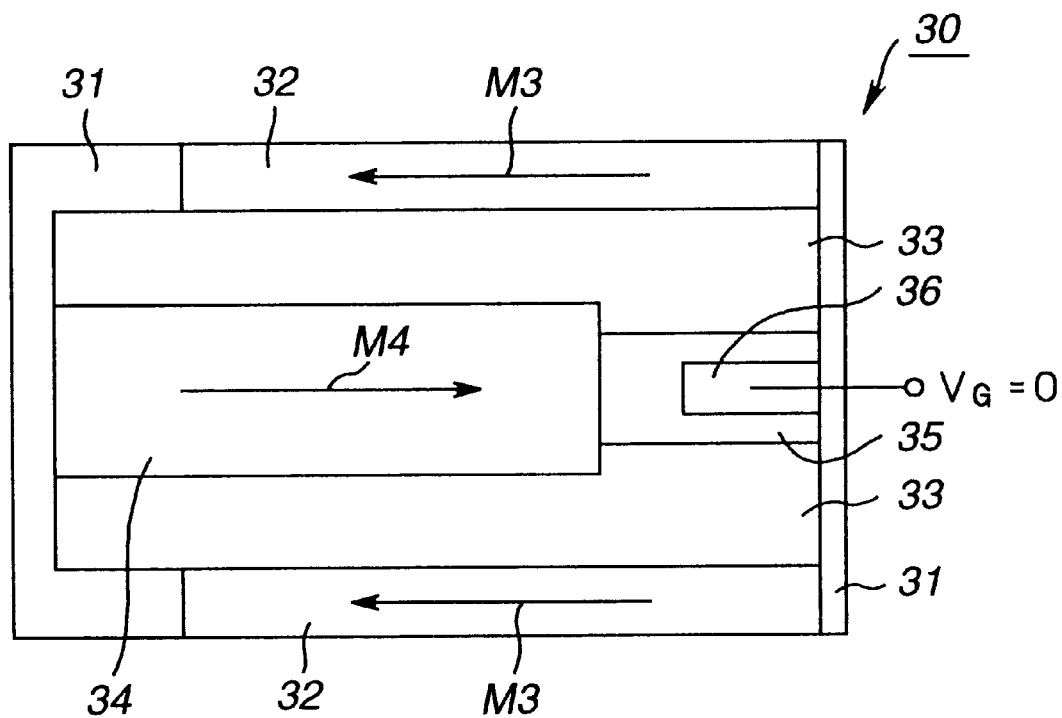
FIG. 9 is a plan view showing the information recording element of FIG. 8 and specifically showing the state in which no voltage is applied across the gate electrode.

Referring to FIGS. 8 and 9, the information recording element 30 includes a stationary magnetic layer 32, formed on a substrate 31, a spacer layer 33 formed on the stationary magnetic layer 32, a movable magnetic layer 34 formed on the spacer layer 33 and a gate electrode 36 formed on the spacer layer 33 via an insulating layer 35.

In this information recording element 30, the stationary magnetic layer 32 represents one of the magnetized areas disposed on both sides of the spacer layer 33, and has its direction of magnetization M3 fixed at all times in a pre-set direction. This stationary magnetic layer 32 is preferably formed of a ferromagnetic material of a sufficiently high ferromagnetic material, specifically a ferromagnetic material with the coercivity of the order of not less than 1 kOe, so that the direction of magnetization M3 will not be changed by the weak magnetic field that can exist in an ordinary environment.

The movable magnetic layer 34 represents the other of the magnetized areas lying on both sides of the spacer layer 33, and has a variable direction of magnetization M4 depending on the information for recording. The shape or the material of the movable magnetic layer 34 is selected so that its coercivity will be lower than that of the stationary magnetic layer 32. The movable magnetic layer 34 is processed by, for example, a magnetization in a magnetic field, so as to exhibit strong uniaxial magnetic anisotropy and so as to have an anti-parallel direction of magnetization M4 to the direction of magnetization of the stationary magnetic layer 32.

The spacer layer 33 operates as a spacer area for splitting the magnetized area formed of a ferromagnetic material. That is, in the present information recording element 30, the magnetized area formed by the stationary magnetic layer 32 and the movable magnetic layer 34 is split by the spacer layer 33 comprised of a composite material including the magnetic material and the semiconductor material. The composite material constituting the spacer layer 33 maybe formed of a magnetic semiconductor, as explained with reference to FIG. 4, or of ferromagnetic particles dispersed in a semiconductor or a magnetic semiconductor, as explained with reference to FIG. 5. Alternatively, the composite material may also be formed by a multi-layer film made up of the ferromagnetic films, semiconductor films or the magnetic semiconductor films, as explained with reference to FIG. 6.

Meanwhile, in the information recording element 30 according to the present invention, the spacer layer 33 can be increased in thickness, specifically, can have a film thickness not less than 10 nm. If the film thickness of the spacer layer 33 is not less than 10 nm, it is possible to evade the problems of difficulties in fabrication or in carrier implantation due to excessively thin thickness of the spacer layer 33.

The gate electrode 36 is formed of an electrically conductive material, such as gold, and is mounted facing the spacer layer 33 via the insulating layer 35. If the voltage is applied across the gate electrode 36, the carriers are concentrated in the portion of the spacer layer 33 facing the gate electrode 36 via the insulating layer 35.

In an initial state of the information recording element 30 in which no voltage is applied across the gate electrode 36, that is in a state of the gate electrode Vc=0, the direction of magnetization M3 of the stationary magnetic layer 32 is antiparallel with respect to the direction of magnetization M4 of the movable magnetic layer 34, as shown in FIGS. 8 and 9.

Figure 10:
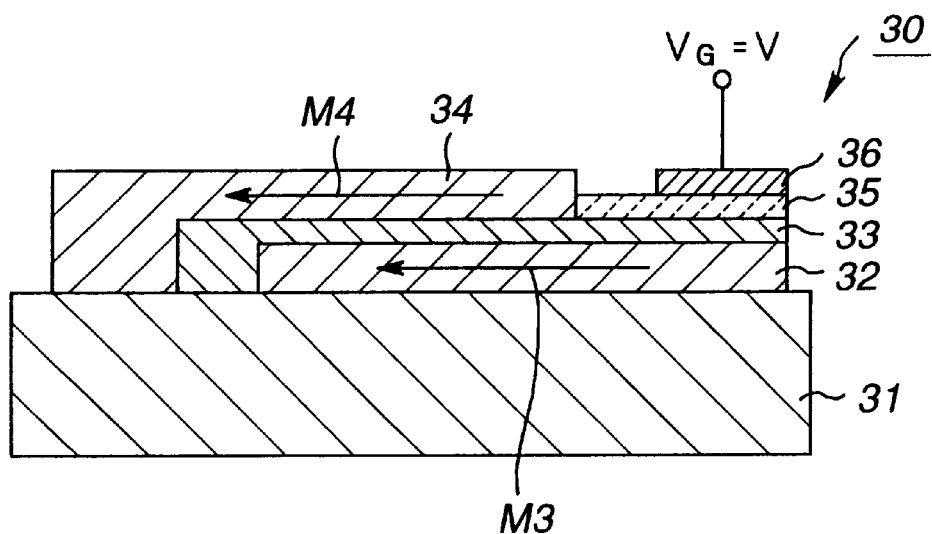
FIG. 10 is a cross-sectional view showing the state in which the voltage is applied across the gate electrode of the ire shown in FIG. 8.
Figure 11:
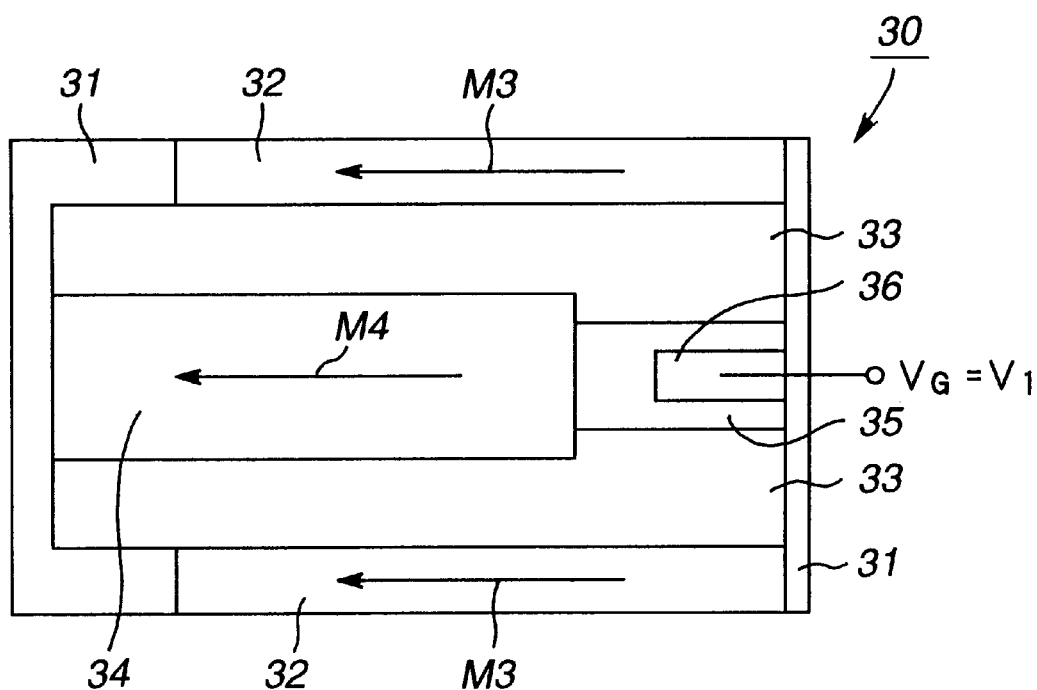
FIG. 11 is a plan view showing the state in which the voltage is applied across the gate electrode of the ire shown in FIG. 8.

When recording the information on the information recording element 30, a pre-set voltage V is applied across the gate electrode 36 (gate electrode VG=V), as —shown in FIGS. 10 and 11. If the voltage V is applied across the gate electrode 36, the carrier concentration of the spacer layer 33 arranged between the stationary magnetic layer 32 and the movable magnetic layer 34 is changed, as a result of which the magnetic coupling state between the stationary magnetic layer 32 and the movable magnetic layer 34 is changed. The movable magnetic layer 34 of lower coercivity is placed under a torque, so that the direction of magnetization M4 of the movable magnetic layer 34 is inverted. The magnetization, once inverted, is stable since the movable magnetic layer 34 has the strong uniaxial magnetic anisotropy, such that the state is maintained after cessation of application of the voltage V across the gate electrode 36.

Thus, with the information recording element 30, the direction of magnetization M4 of the movable magnetic layer 34 can be controlled without using the magnetic field, such that the bi-level information can be recorded depending of the orientation of magnetization of the movable magnetic layer 34.

Figure 12:
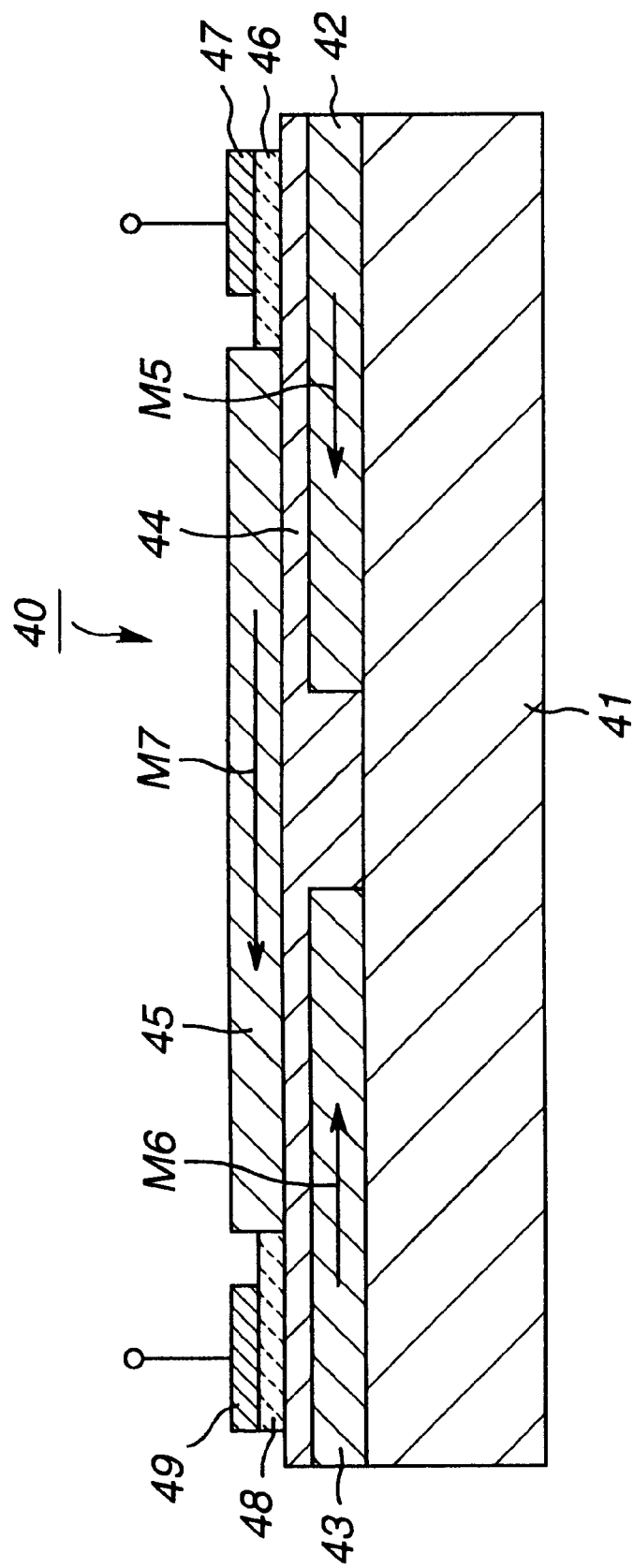
FIG. 12 shows another illustrative information recording element and specifically showing the state in which no voltage is applied across the first and second gate electrodes.
Figure 13:
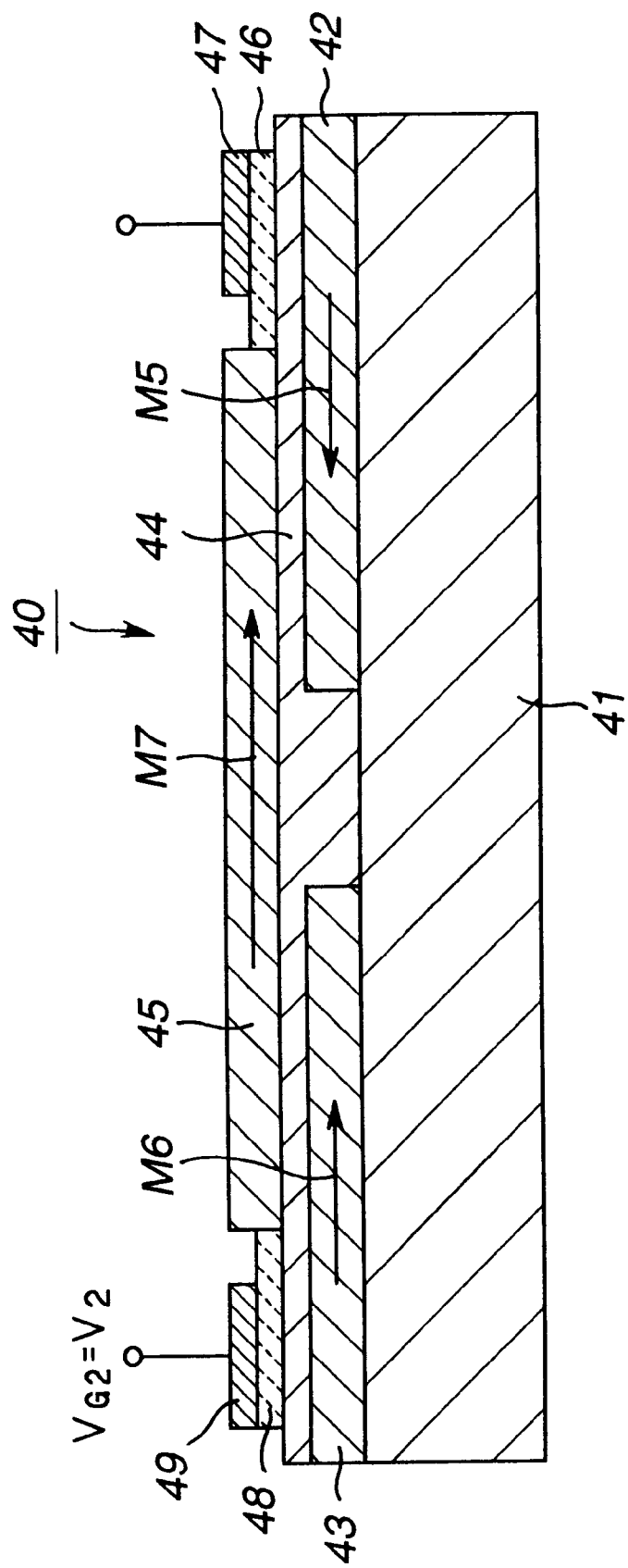
FIG. 13 is a cross-sectional view showing the state in which the voltage is applied across the second gate electrode of the information recording element shown in FIG. 12.
Figure 14:
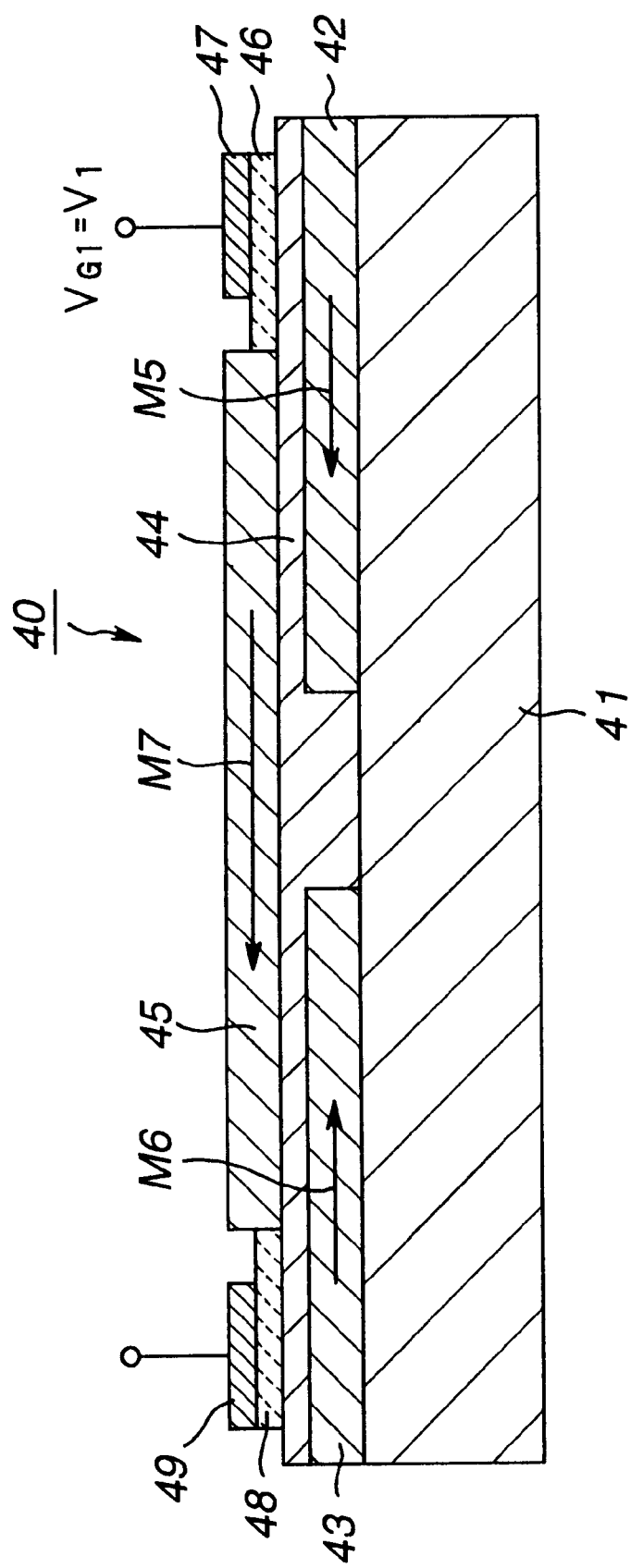
FIG. 14 is a cross-sectional view showing the state in which the voltage is applied across the first gate electrode of the information recording element shown in FIG. 12.

A second embodiment of the information recording element and the information recording method is explained with reference to FIGS. 12 to 14. The information recording element 40, shown in FIGS. 12 to 14, is an information recording element which enables information rewriting by employing plural stationary magnetic layers. In this information recording element 40, binary-valued recording can be realized by the orientation of magnetization of the magnetized area as in the case of the abovementioned information recording element 30.

Referring to FIG. 12, this information recording element 40 includes a first stationary magnetic layer 42, formed on a part of a substrate 41, a second stationary magnetic layer 43 formed on another part of the substrate 41, a spacer layer 44 formed for extending from the first stationary magnetic layer 42 to the second stationary magnetic layer 43, and a movable magnetic layer 45 formed on the spacer layer 44. The information recording element 40 also includes a first gate electrode 47, formed on a part of the spacer layer 44 via an insulating layer 46 and a second gate electrode 49 formed on another part of the spacer layer 44 via another insulating layer 48.

Similarly to the stationary magnetic layer 32 in the information recording element 30, the stationary magnetic layers 42,43 are formed of a magnetic material of high coercivity, and are fixed so as to have fixed direction of magnetization at all times. In this information recording element 40, the direction of magnetization M5 of the first stationary magnetic layer 42 is antiparallel to the direction of magnetization M6 of the second stationary magnetic layer 43.

Similarly to the movable magnetic layer 34 in the above-described information recording element 30, the movable magnetic layer 45 has a variable direction of magnetization M7 depending on the information for recording. That is, this movable magnetic layer 42 has its shape or material selected so as to have coercivity lower than that of the movable magnetic layer 42, 43. Also, the movable magnetic layer 45 is formed by, for example, an in-field film forming method so as to have strong uniaxial magnetic anisotropy and so as to have the direction of magnetization M7 parallel or anti-parallel with respect to the direction of magnetization of the stationary magnetic layers 42, 43. In the present embodiment, the direction of magnetization M7 of the movable magnetic layer 45 is parallel and antiparallel in an initial state to the direction of magnetization M5 of the first stationary magnetic layer 42 and to the direction of magnetization M6 of the second stationary magnetic layer 43, respectively.

The spacer layer 44 operates as a spacer area for splitting the magnetized area formed by the ferromagnetic material. That is, in the present information recording element 40, the magnetized area formed by the first stationary magnetic layer 42, second stationary magnetic layer 43 and the movable magnetic layer 45 is split by the spacer layer 44. This spacer layer 44 is formed of a composite material containing a magnetic material and a semiconductor material. Th composite material constituting the spacer layer 44 may be formed of a magnetic semiconductor, as explained with reference to FIG. 4, a semiconductor or a magnetic semiconductor having ferromagnetic particles dispersed therein, as explained with reference to FIG. 5, or a multi-layered film made up of a ferromagnetic film, a semiconductor film or a magnetic semiconductor film, layered together, as shown in FIG. 6.

With the information recording element 40 according to the present invention, the spacer layer 44 may be of an increased film thickness, specifically a film thickness of not less than 10 nm. If the film thickness of the spacer layer 44 is not less than 10 nm, it is possible to overcome the problem of fabrication difficulties or carrier implantation difficulties ascribable to the excessively thin thickness of the spacer layer 44.

The first gate electrode 47 or the second gate electrode 49 is formed of an electrically conductive material, such as gold. The first gate electrode 47 is arranged for facing the spacer layer 44 via an insulating layer 46 and for facing the first stationary magnetic layer 42 via the insulating layer 46 and the spacer layer 44. The second gate electrode 49 is arranged for facing the spacer layer 44 via an insulating layer 48 and for facing the second stationary magnetic layer 43 via the insulating layer 48 and the spacer layer 44.

If the electrical voltage is applied across the first electrode 47, carriers are concentrated in the vicinity of a portion of the spacer layer 44 which faces the first gate electrode 47 via the first gate electrode 47. In other words, if the voltage is applied across the first electrode 47, carriers are concentrated in the spacer layer 44 between the movable magnetic layer 45 and the first stationary magnetic layer 42.

If the voltage is applied across the second gate electrode 49, carriers are concentrated in the vicinity of the spacer layer 44 arranged via the insulating layer 48. Stated differently, the carriers are concentrated in the spacer layer 44 between the movable magnetic layer 45 and the second stationary magnetic layer 43.

With the present information recording element 40, the direction of magnetization M7 of the movable magnetic layer 44 can be iteratively inverted by controlling the voltage applied across the first gate electrode 47 and the second gate electrode 49. The operation of repeatedly inverting the direction of magnetization M7 of the movable magnetic layer 44 is hereinafter explained.

In the initial state in which no voltage is applied across the first gate electrode 47 or the second gate electrode 49, the direction of magnetization M7 of the movable magnetic layer 45 is parallel to the direction of magnetization M5 of the first stationary magnetic layer 42, while being antiparallel to the direction of magnetization M6 of the second stationary magnetic layer 43, as shown in FIG. 12.

If, in this state, a pre-set voltage V2 is applied across the second gate electrode 49, as shown in FIG. 13, the gate electrode VG2 of the second gate electrode 49 is V2 (VG2=V2). This changes the carrier concentration of the spacer layer 44 arranged between the movable magnetic layer 45 and the second stationary magnetic layer 43 to change the magnetic coupling state between the movable magnetic layer 45 and the second stationary magnetic layer 43. Thus, the torque is applied to the movable magnetic layer 45 of low coercivity to invert the direction of magnetization M7 of the movable magnetic layer 45. That is, the direction of magnetization M7 of the movable magnetic layer 45 is antiparallel to the direction of magnetization M5 of the first stationary magnetic layer 42 and parallel to the direction of magnetization M6 of the second stationary magnetic layer 43, as shown in FIG. 13. This magnetization, thus inverted, is stable because the movable magnetic layer 45 displays strong uniaxial magnetic anisotropy, such that the state of magnetization is maintained even after cessation of application of the voltage V2 across the second gate electrode 49.

When the direction of magnetization of the movable magnetic layer 45 is antiparallel with respect to the direction of magnetization MS of the first stationary magnetic layer 42 and parallel to the direction of magnetization M5 of the second stationary magnetic layer 43, a pre-set voltage V1 is applied across the first gate electrode 47, as shown in FIG. 14, to set the gate voltage Vc1 of the first gate electrode 47 equal to V1(Vc1=V1). This changes the carrier concentration of the spacer layer 44 arranged between the movable magnetic layer 45 and the first stationary magnetic layer 42 to change the magnetic coupling state between the movable magnetic layer 45 and the first stationary magnetic layer 42. Thus, the torque is applied to the movable magnetic layer 45 of low coercivity to invert the direction of magnetization M7 of the movable magnetic layer 45. That is, the direction of magnetization M7 of the movable magnetic layer 45 is parallel to the direction of magnetization M5 of the first stationary magnetic layer 42 and antiparallel to the direction of magnetization M6 of the second stationary magnetic layer 43, as shown in FIG. 14. This magnetization, thus inverted, is stable because the movable magnetic layer 45 displays strong uniaxial magnetic anisotropy, such that the state of magnetization is maintained even after cessation of application of the voltage V1 across the first gate electrode 47.

Thus, with the present information recording element 40, the direction of magnetization M7 of the movable magnetic layer 45 can be controlled by applying the voltage across the first gate electrode 47 or the second gate electrode 49, without using the magnetic field, to enable the recording of the bi-level information depending on the direction of magnetization of the movable magnetic layer 45. Moreover, with the present information recording element 40, the direction of magnetization M7 of the movable magnetic layer 45 can be iteratively reversed by applying the pre-set voltage V1 across the first gate electrode 47 or by applying the pre-set voltage V2 across the second gate electrode 49. That is, the information recording element 40 can iteratively rewrite the information.

A third embodiment of the information recording element and the information recording method are explained with reference to FIGS. 15 to 17. Meanwhile, an information recording element 50 is such an element which enables rewriting of the information by using plural stationary magnetic layers. With the present information recording element 50, similarly to the information recording element 30 and 40, the bi-level recording can be made depending on the direction of magnetization of the magnetized area.

Figure 15:
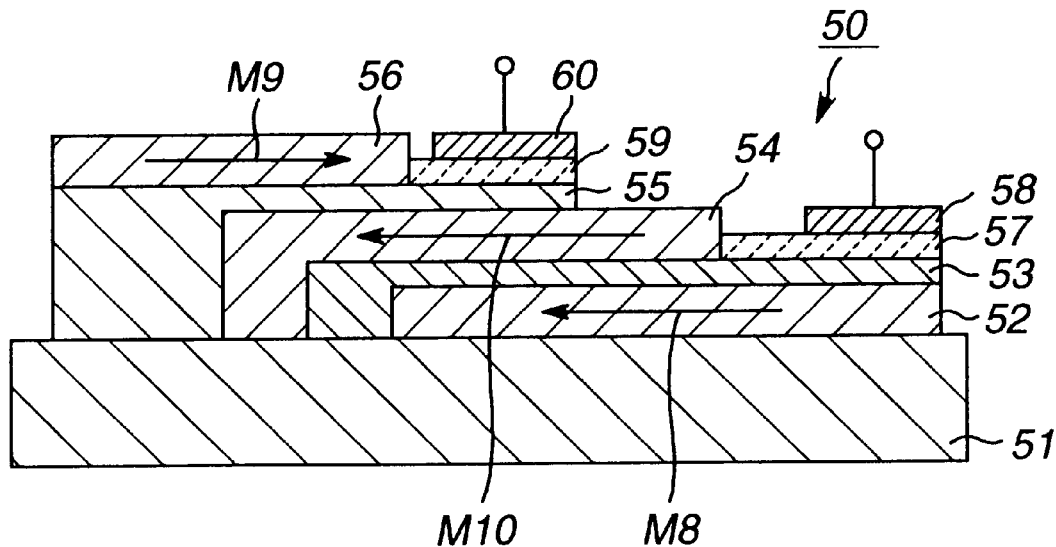
FIG. 15 shows still another illustrative information recording element and specifically showing the state in which no voltage is applied across the first and second gate electrodes.

Referring to FIG. 15, this information recording element 50 includes a first stationary magnetic layer 52, formed on a substrate 51, a first spacer layer 53 formed on the stationary magnetic layer 52, a movable magnetic layer 54 formed on the first spacer layer 53, a second spacer layer 55, formed on the movable magnetic layer 54, and a second stationary magnetic layer 56 formed on the second spacer layer 55. The information recording element 50 also includes a first gate electrode 58 formed on a part of the second spacer layer 55 via an insulating layer 57, and a second gate electrode 60 formed on a part of the second spacer layer 55 via an insulating layer 59.

In the present information recording element 50, the stationary magnetic layers 52, 56 are formed of a magnetic material of a high coercivity, as are the stationary magnetic layer 42, 43, and are fixed so as to be oriented at all times in the same direction of magnetization. In the present information recording element 50, the direction of magnetization M8 of the stationary magnetic layer 52 and the direction of magnetization M9 of the second stationary magnetic layer 56 are set so as to be antiparallel with respect to the direction of magnetization M9 of the second stationary magnetic layer 56.

Similarly to the movable magnetic layer 45, the movable magnetic layer 54 has a variable direction of magnetization M10 depending on the information for recording. That is, the shape or the material type of the present movable magnetic layer 54 is selected so as to be lower in coercivity than the stationary magnetic layers 52 or 56. Also, the movable magnetic layer 45 is formed by, for example, an in-field film forming method so as to have strong uniaxial magnetic anisotropy and so as to have the direction of magnetization M10 parallel or anti-parallel with respect to the direction of magnetization of the stationary magnetic layers 52, 53. In the present embodiment, the direction of magnetization M10 of the movable magnetic layer 54 is parallel and antiparallel in an initial state to the direction of magnetization M8 of the first stationary magnetic layer 52 and to the direction of magnetization M9 of the second stationary magnetic layer 43, respectively.

The first spacer layer 53 and the second spacer layer 55 serve as a spacer area for splitting the magnetized area formed by the ferromagnetic material. That is, in the present information recording element 50, the magnetized area formed by the first stationary magnetic layer 52, second stationary magnetic layer 56 and the movable magnetic layer 54 is split by the first spacer layer 53 and the second spacer layer 55. This spacer layers 53, 55 are formed of a composite material containing a magnetic material and a semiconductor material. Th composite material constituting the spacer layers 53, 55 may be formed of a magnetic semiconductor, as explained with reference to FIG. 4, a semiconductor or a magnetic semiconductor having ferromagnetic particles dispersed therein, as explained with reference to FIG. 5, or a multi-layered film made up of a ferromagnetic film, a semiconductor film or a magnetic semiconductor film, layered together, as shown in FIG. 6.

With the information recording element 50 according to the present invention, the spacer layers 53, 55 may be of an increased film thickness, specifically a film thickness of not less than 10 mn. If the film thicknesses of the spacer layer 44 are not less than 10 nm, it is possible to overcome the problem of fabrication difficulties or carrier implantation difficulties ascribable to the excessively thin thickness of the spacer layers 53, 55.

The first gate electrode 58 or the second gate electrode 60 is formed of an electrically conductive material, such as gold. The first gate electrode 47 is arranged for facing the spacer layer 53 via an insulating layer 57 and for facing the first stationary magnetic layer 52 via the insulating layer 57 and the first spacer layer 53. The second gate electrode 60 is arranged for facing the second spacer layer 55 via an insulating layer 59 and for facing the movable magnetic layer 54 via the insulating layer 59 and the spacer layer 55.

If the electrical voltage is applied across the first electrode 58, carriers are concentrated in the vicinity of a portion of the first spacer layer 53 facing the first gate electrode 58 via the insulating layer 57. In other words, if the voltage is applied across the first gate electrode 58, carriers are concentrated in the first spacer layer 53 between the movable magnetic layer 52 and the first spacer layer 53.

If the voltage is applied across the second gate electrode 60, carriers are concentrated in the vicinity of the second spacer layer 55 arranged via the insulating layer 59. Stated differently, the carriers are concentrated in the part of the second spacer layer 55 facing the second gate electrode 60 via the insulating layer 59. In other words, if the voltage is applied across the second gate electrode 60, carriers are concentrated in the second spacer layer 55 between the movable magnetic layer 54 and the second stationary magnetic layer 56.

With the present information recording element 50, the direction of magnetization M10 of the movable magnetic layer 54 can be iteratively inverted by controlling the voltage applied across the first gate electrode 58 and the second gate electrode 60. The operation of repeatedly inverting the direction of magnetization M10 of the movable magnetic layer 54 is hereinafter explained.

In the initial state in which no voltage is applied across the first gate electrode 58 or the second gate electrode 60, the direction of magnetization M10 of the movable magnetic layer 54 is parallel to the direction of magnetization M8 of the first stationary magnetic layer 52, while being antiparallel to the direction of magnetization M9 of the second stationary magnetic layer 56, as shown in FIG. 15.

Figure 16:
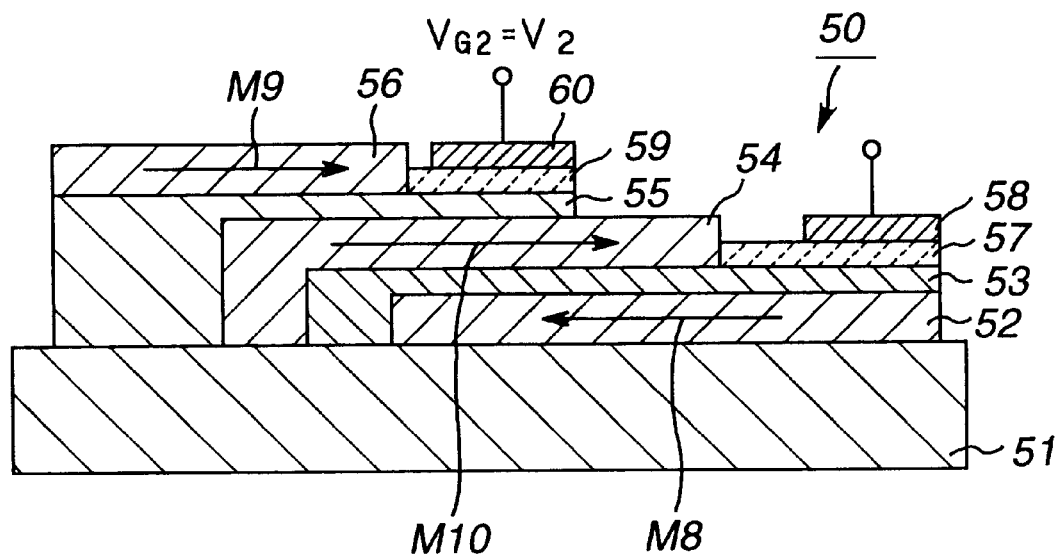
FIG. 16 is a cross-sectional view showing the state in which the voltage is applied across the second gate electrode of the information recording element shown in FIG. 15.

If, in this state, a pre-set voltage V2 is applied across the second gate electrode 60, as shown in FIG. 16, the gate electrode VG2 of the second gate electrode 60 is V2 (VG2=V2). This changes the carrier concentration of the second spacer layer 55 arranged between the movable magnetic layer 54 and the second stationary magnetic layer 56 and hence the magnetic coupling state between the movable magnetic layer 54 and the second stationary magnetic layer 56. This applies the torque to the movable magnetic layer 54 of low coercivity to invert the direction of magnetization M10 of the movable magnetic layer 54. That is, the direction of magnetization M10 of the movable magnetic layer 54 is antiparallel to the direction of magnetization M8 of the first stationary magnetic layer 52 and parallel to the direction of magnetization M9 of the second stationary magnetic layer 56, as shown in FIG. 13. This magnetization, thus inverted, is stable because the movable magnetic layer 54 displays strong uniaxial magnetic anisotropy, such that the state of magnetization is maintained even after cessation of application of the voltage V2 across the second gate electrode 60.

Figure 17:
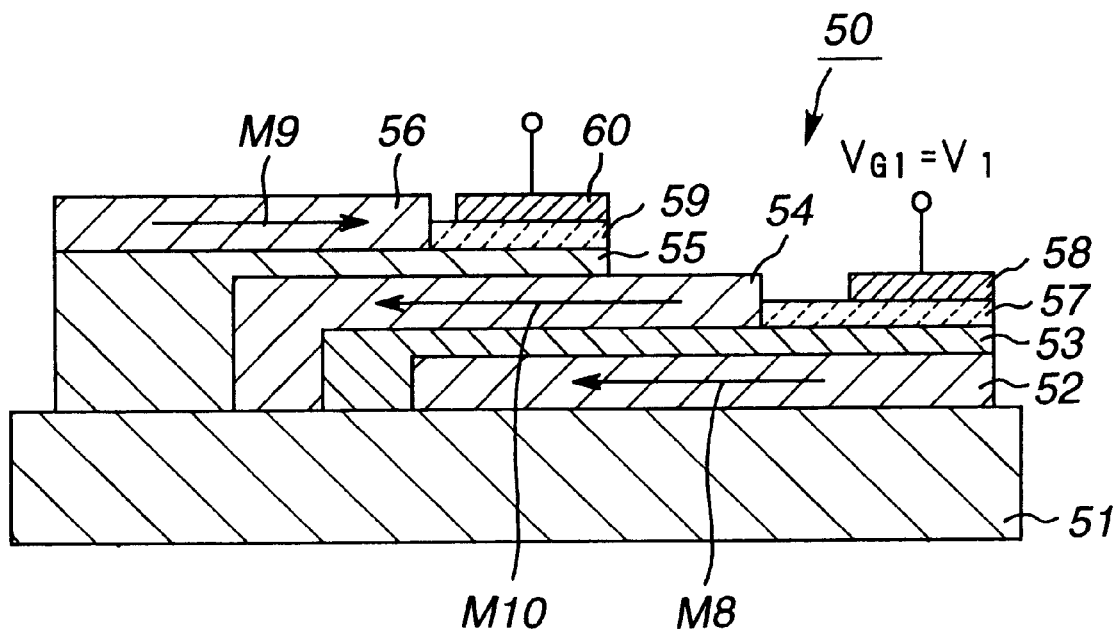
FIG. 17 is a cross-sectional view showing the state in which the voltage is applied across the first gate electrode of the information recording element shown in FIG. 15.
Figure 18:
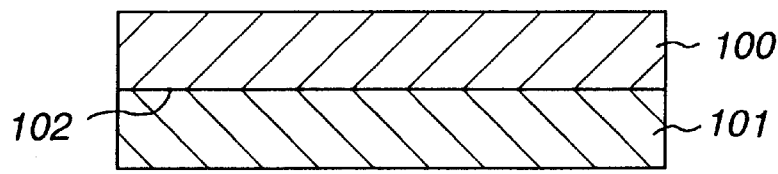
FIG. 18 shows the structure in which a pair of magnetic members are contacted with each other.

When the direction of magnetization M10 of the movable magnetic layer 45 is antiparallel with respect to the direction of magnetization M8 of the first stationary magnetic layer 52 and parallel to the direction of magnetization M9 of the second stationary magnetic layer 56, a pre-set voltage V1 is applied across the first gate electrode 58, as shown in FIG. 17, to set the gate voltage Vc1 of the first gate electrode 58 equal to V1(Vc1=V1). This changes the carrier concentration of the first spacer layer 53 arranged between the movable magnetic layer 54 and the first stationary magnetic layer 52 and hence the magnetic coupling state between the movable magnetic layer 54 and the first stationary magnetic layer 52. This applies the torque to the movable magnetic layer 45 of low coercivity to invert the direction of magnetization M10 of the movable magnetic layer 54. That is, the direction of magnetization M10 of the movable magnetic layer 54 is parallel to the direction of magnetization M8 of the first stationary magnetic layer 52 and antiparallel to the direction of magnetization M9 of the second stationary magnetic layer 56, as shown in FIG. 17. This magnetization, thus inverted, is stable because the movable magnetic layer 45 displays strong uniaxial magnetic anisotropy, such that the state of magnetization is maintained even after cessation of application of the voltage VI across the first gate electrode 58.

Thus, with the present information recording element 50, the direction of magnetization M10 of the movable magnetic layer 54 can be controlled by applying the voltage across the first gate electrode 58 or the second gate electrode 60, without using the magnetic field, to enable the recording of the bi-level information depending on the direction of magnetization of the movable magnetic layer 45. Moreover, with the present information recording element 50, the direction of magnetization M10 of the movable magnetic layer 54 can be iteratively reversed by applying the pre-set voltage across the first gate electrode 58 or by applying the pre-set voltage across the second gate electrode 60. That is, the information recording element 50 can iteratively rewrite the information.

Of the information recording elements shown in FIGS. 12 to 17, the information recording element 40 shown in FIGS. 12 to 14 has a merit that the movable magnetic layer 45 has the movable magnetic layer 45 on its upper surface and hence the changes in the direction of magnetization M7 of the movable magnetic layer 45 can be read easily. On the other hand, the information recording element 50 shown in FIGS. 15 to 17 has a merit over the information recording element 40 shown in FIGS. 12 to 14 that it is in need of a smaller surface area and hence lends itself to higher degree of circuit integration.

In the above-described information recording elements 30, 40 and 50, the movable magnetic layers 34, 45 and 54 used exhibit uniaxial magnetic anisotropy to permit bi-level recording. However, the movable magnetic layer used may have three or more minimum anisotropic energy points relative to the orientation of magnetization. If the movable magnetic layer having three or more minimum anisotropic energy points relative to the orientation of magnetization is used, it is possible to make multi-valued recording of three or more values by the sole movable magnetic layer.

By having the magnetic material contained in the spacer area as described above in detail, it is possible to generate magnetic interaction across magnetized areas formed of a ferromagnetic material even if the spacer area is of a thicker thickness. That is, by having the magnetic material contained in the spacer area, magnetization of the magnetized area can be controlled even if the spacer area is of an increased thickness. That is, by applying the above-described first aspect of the present invention, it is possible to realize the magnetization controlling method, that is able to control the magnetization without using the magnetic field, and an information recording element and an information recording method exploiting the magnetization controlling method. The result is realisation of an ideal solid-state memory that has a quick access time, lends itself to higher degree of circuit integration, has a large number of times of rewriting and which is non-volatile and free from crosstalk.

2. Second Embodiment

The second aspect of the invention is applied to such a configuration in which an electrically conductive layer containing an electrically conductive material is layered with plural magnetic layers so that the electrically conductive layer is disposed between the magnetic layers, and in which the current is allowed to flow through the electrically conductive layers of the layered assembly to control the direction of magnetization of the magnetic layers. In the following, preferred embodiments of the magnetization controlling method, information finctional element, information recording method, information recording element and the variable resistance element, according to the present invention, will be explained in detail.

2-1 Principle of Magnetization Controlling Method

First, the basic principle of the magnetization controlling method is explained. In the present embodiment, inversion of magnetization is induced in the magnetic layers, as constituent elements of a device, with the magnetic interaction (exchange interaction) in the solid material as a driving power, without relying upon the application of a magnetic field from outside. The magnetic layers in which the inversion of magnetization is induced may be termed a 'movable magnetic layer' since the direction of magnetization is reversed, or may also be termed a 'recording medium' if an information recording element is being under consideration.

The exchange interaction is just a source of unidirectionally aligned magnetic moments of atoms in the interior of a ferromagnetic material. If a pair of magnetic members 100, 101 are contacted with each other, the exchange interaction operates therebetween via an interface 102 by which the magnetic members 100, 101 are contacted with each other. If the magnetic members 100, 101 are not directly contacted with each other and an intermediate layer 103 is interposed therebetween, the exchange interaction may act between the magnetic members 100, 101 via the intermediate layer 103. If the intermediate layer 103 is a magnetic member, of course the layer 103 transmits the exchange interaction. However, if the intermediate layer 103 itself is a non-magnetic metal, such as Au, or a semiconductor, such as Si or Ge, the exchange interaction has been confirmed to be transmitted through the intermediate layer 103. The theory which accounts for the source of transmission of the exchange interaction, such as RKKY model, has also been proposed.

This exchange interaction is exploited here to control the direction of magnetization of a magnetic member. The method for controlling the direction of magnetization by taking advantage of the exchange interaction is explained taking a specified example.

Figure 19:
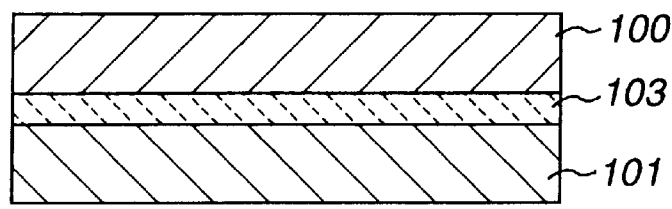
FIG. 19 shows the structure in which an intermediate layer is interposed between the paired magnetic members.

It is assumed that the magnetic members 100, 101 are not directly contacted with each other, but are separated by the intermediate layer 103, as shown in FIG. 19. It is also assumed that the magnetic member 100 is a soft magnetic member having its direction of magnetization liable to be changed, while the magnetic member 101 is a permanent magnet having a fixed direction of magnetization. It is further assumed that the intermediate layer 103 between the magnetic members 100, 101 is of a ferromagnetic material but has a low Curie temperature Tc (a temperature below which the magnetic state is in disorder).

It the temperature is higher than the Curie temperature Tc of the intermediate layer 103, the intermediate layer 103 lacks in the magnetic order, such that the effect of the magnetic member 101 is not transmitted to the magnetic member 100 and hence the magnetization of the magnetic member 100 is in arbitrary orientation under the effect of an external magnetic field. If the temperature is lowered further to a temperature lower than the Curie temperature Tc, there is induced a magnetic order in the intermediate layer 103 such that the interaction of aligning the direction of magnetization of the magnetic members 100, 101 operates via the intermediate layer 103. Since the magnetic member 101 is a permanent magnet, the direction of magnetization of the magnetic member 100, so far oriented in arbitrary directions, are changed into alignment with the direction of magnetization of the magnetic member 101. These changes in the direction of magnetization of the magnetic member 100 is not induced by the external magnetic field, but is induced by the exchange interaction operating in the solid material.

According to the present invention, the direction of magnetization of the magnetic member is controlled with this exchange interaction as the driving power. However, according to the present invention, the exchange interaction is controlled by an electrical input, instead of by the ambient temperature, as in the case described above.

The magnetic functional element according to the present invention is an element that utilizes the operation of changing the direction of magnetization with the exchange interaction as the driving power. In other words, the magnetic functional element according to the present invention is an element made up of a multi-layered structure of plural thin films including a magnetic material and electrical input/output terminals. These changes in the direction of magnetization of the ferromagnetic material are not induced by changes in the external magnetic field applied to the ferromagnetic material but are based on changes in the exchange interaction in the solid material.

That is, in the second aspect of the present invention, the direction of magnetization of the magnetic member is controlled with the exchange interaction in the solid material as a driving power. By utilizing this exchange interaction, there is constructed an information recording element. A magnetic member having moderate tendency to changes in direction of magnetization, with a coercivity of tens of Oe (referred to hereinafter as a magnetic member A), is used as a recording medium, while a magnetic member formed by a permanent magnet (referred to hereinafter as a magnetic member B), is used as a driving power for writing on a recording medium. Depending on the orientation of magnetization of the magnetic member A, multivalued recording, including bi-valued recording, is realized.

The exchange interaction, employing a magnetic member A having a moderate tendency to changes in its direction of magnetization, with a coercivity of tens of Oe, is used as a recording medium, and also employing the magnetic member B of a permanent magnet as a driving source for writing on the recording medium, is hereinafter explained.

It is assumed that the magnetic members A and B are each layered films having a contact surface larger than the volume of the magnetic member and which can transmit the exchange interaction effectively. In the following explanation, the layers of the magnetic member A, having a moderate tendency to changes in its direction of magnetization, with a coercivity of tens of Oe, are used as a recording carrier and hence are termed recording carrier layers. Also, the layers of the magnetic member B, formed by the permanent magnet, are fixed so that the direction of magnetization is constant and hence are termed fixed magnetic layers. Since it is contemplated in the present invention to reduce the size of the information recording element, the recording carrier layers are assumed to have a single magnetic domain structure.

In general, the potential energy $U_{ex}$ by the exchange interaction between two layers is proportionate to an area S of an interface between the magnetic members A and B. If the direction of magnetization of the recording carrier layers is θ and the direction of magnetization of the fixed magnetic layers is $θ_{fix}$, the potential energy $U_{ex}$ by the exchange interaction between the two layers is expressed by the following equation (1-1):

$$U_{ex} = -S \cdot J \cdot \cos(θ - θ_{fix})$$

where J denotes a coefficient.

On the other hand, the recording carrier layer has, in an external magnetic field H, a potential energy (Zeeman Energy) $U_z$ ascribable to the external magnetic field H. This potential energy $U_Z$ is expressed by the following equation (1-2):

$$U_z = -S \cdot t_{MAGNETIC\ SEMICONDUCTOR} \cdot H \cdot (θ - θ_H) \quad (1-2)$$

where $M_S$ is the saturation magnetic flux density, t is the thickness and $θ_H$ is the direction of the external magnetic field H.

As apparent from the above equations (1-1) and (1-2), the potential energy $U_{ex}$ by the exchange interaction and the potential energy $U_z$ are of the same form. That is, the exchange interaction, similarly to the external magnetic field, has the operation of changing the direction of magnetization of the recording carrier layers. Therefore, the magnitude o the exchange interaction can be handled as a magnetic field equivalent value Hex. That is, if $θ_{fix}$ and $θ_H$ are of equal value and $U_{ex}$ is equated to $U_z$, the following equation (1-3):

$$-S \cdot J \cdot \cos θ(θ - θ_H) = -S \cdot t_{MAGNETIC\ SEMICONDUCTOR} \cdot H_{ex} \cdot \cos(θ - θ_H) \quad (1-3)$$

holds, so that the value $H_{ex}$ which is the magnitude of the exchange interaction calculated as a magnetic field can be expressed by:

$$H_{ex} = J/(M_s \cdot t) \quad (1-4)$$

If the coercivity $H_c$ of the recording carrier layers is smaller than the magnetic field equivalent value $H_{ex}$, inversion of magnetization can be produced by the exchange interaction.

Up to now, the magnetic field induced by flowing the current in a conductor is applied across the recording mediun. The strength of the magnetic field H, that can be applied across a recording medium, is expressed by the equation (3), as described above. That is, if the magnetic field is applied across the recording carrier by flowing the current through a conductor, the magnitude of the magnetic field that can be utilized is proportionate to the diameter D' of the conductor:

$$H = 12500 \times D'[A/m] = 156 \times D'[Oe] \quad (3).$$

On the other hand, as may be seen from the equation (1-4), the operation of the inversion of magnetization by the exchange interaction is not dependent on the surface area of the interface. Therefore, in the process of the technical tendency towards a finer element size, the time necessarily comes when the operation of the inversion of magnetization by the exchange interaction according to the present invention surpasses the operation of the conventional application of the magnetic field.

If the values of the exchange interaction are such that J=0.05 mJ/m², the thickness t of the recording carrier layer is t=10 nm and the saturation magnetic flux density M. of the recording carrier layer is $M_S$=1T, and these values are substituted into the above equation (1-4), the magnetic field equivalent value Hex is such that $H_{ex}$=5000 A/m=630 Oe. On the other hand, it is when the diameter D'=0.4 μm that the strength of the magnetic field H represented by the above equation (3) is 630 Oe.

That is, the element size for which the magnetization controlling method according to the present invention is more effective than the method of utilizing the magnetic field generated on flowing the current through a conductor is a sub-micron area. If the recent technological tendency is taken into account, the design rule undoubtedly will reach the submicron order in e,.g. a magnetic memory in very near future. It is therefore evident that the magnetization controlling method according to the present invention will surpass the method of utilizing the magnetic field generated on flowing the current through a conductor in time to come.

Figure 20:
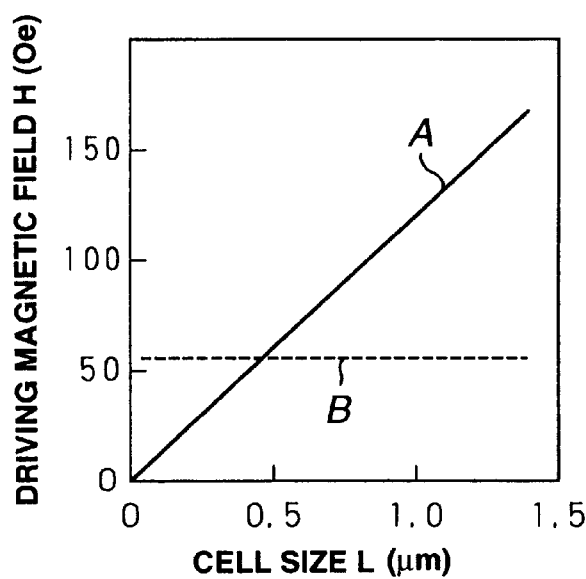
FIG. 20 shows the relation between the size L of a cell of the information recording element and a driving magnetic field H that can be used for driving a recording carrier.

FIG. 20 shows, for comparison sake, the relation between the cell size L of the information recording element and the driving magnetic field H that can be used for driving the recording carrier for the current magnetic field system utilizing the magnetic field generated on flowing the current through the conductor and for the exchange coupling system utilizing the exchange interaction in a solid material. In FIG. 20, a solid line A and a broken line B denote the current magnetic field system and the exchange coupling system, respectively. In the current magnetic field system, the diameter D' of the conductor is assumed to be 0.8 times the cell size.

Referring to FIG. 20, showing the current magnetic field system, the smaller the cell size, the smaller is the magnetic field that can be applied from the conductor. On the other hand, since the exchange coupling operation in the layered structure is not dependent on the cell size, the exchange coupling system is more meritorious the finer becomes the design rule.

Since the magnetic field equivalent value $H_{ex}$ of the exchange interaction is not dependent on the cell size as discussed above, a thin magnetic film of larger coercivity $H_c$ may be used as a recording medium, even if the design rule becomes finer, on the condition that the exchange interaction is exploited to control the magnetization of the recording carrier. Specifically, as may be seen from FIG. 20, a thin magnetic film with the coercivity over tens of Oe may be used as a recording carrier even if the cell size is extremely small. Meanwhile, if the value of the saturation magnetic flux Ms is lowered, it is possible to increase the coercivity of the recording carrier further. Moreover since the operation of the inversion of magnetization on applying the present invention depends on the exchange interaction produced only between two contacting materials, it is possible to evade crosstalk otherwise produced with neighboring elements.

2-2 Specified Example of Element

A specified example of an element according to the present invention, exploiting the above-described principle, is hereinafter explained.

Figure 21:
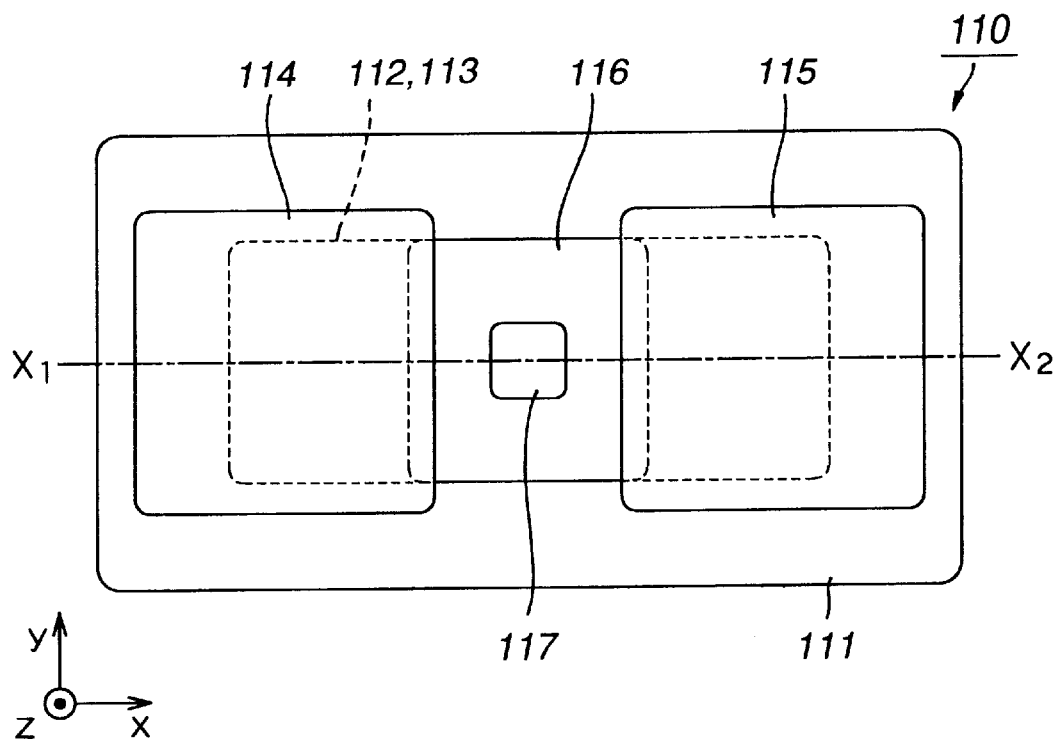
FIG. 21 is a plan view showing an example of a magnetic functional element embodying the present invention.
Figure 22:
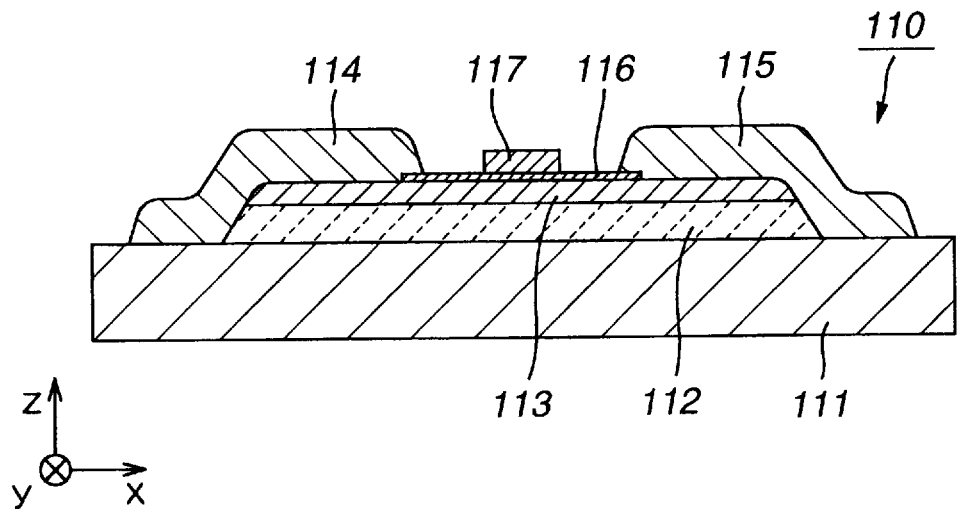
FIG. 22 is a cross-sectional view taken along line X1 to X2 in FIG. 21 and specifically showing an illustrative magnetic functional element embodying the present invention.

FIGS. 21, 22 show an example of a magnetic functional element em the present invention. Referring to FIGS. 21, 22, the magnetic functional element 110 includes a stationary magnetic layer 112, formed on a glass substrate 111, an electrically conductive layer 113 formed on the stationary magnetic layer 112, electrodes 114, 115 connected to both ends of the electrically conductive layer 113, and a movable magnetic layer 117 formed on the electrically conductive layer 113 via an insulating layer 116.

The stationary magnetic layer 112 is formed of an oxide magnetic material of high coercivity, and is stationary in the constant direction of magnetization. That is, the stationary magnetic layer 112 is termed a 'stationary magnetic layer' in the meaning that the element has a constant direction of magnetization. Conversely, the movable magnetic layer 117 is formed of a magnetic material of lower coercivity. With the present magnetic functional element 110, it is possible to control the direction of magnetization of the movable magnetic layer 117. That is, the movable magnetic layer 117 is termed the 'movable magnetic layer' in the sense that the layer 117 has a variable direction of magnetization.

The electrically conductive layer 113 formed of an electrically conductive material, is used to control the magnetic coupling state between the stationary magnetic layer 112 and the movable magnetic layer 117. That is, the electrically conductive layer 113 may be said to be a layer for controlling the magnetic coupling state of the stationary magnetic layer 112 with the movable magnetic layer 117.

With the present magnetic functional element 110, the current is allowed to flow via the electrodes 114, 115 through the electrically conductive layer 113 to change the exchange interaction between the stationary magnetic layer 112 and the movable magnetic layer 117 to control the direction of magnetization of the movable magnetic layer 117. Stated differently, it is possible with the present magnetic functional element 11 to control the exchange interaction by an electrical input to control its direction of magnetization.

Meanwhile, in the magnetic functional element 10, the stationary magnetic layer 112 formed of an oxide material of high electrical resistance is provided as an underlying layer of the electrically conductive layer 113, while the insulating layer 116 of a high electrical resistance is arranged to overlie the electrically conductive layer 113. By forming the layers of high electrical resistance as an overlying layer and as an underlying layer for the electrically conductive layer 113, the current supplied from the electrodes 114, 115 are effectively concentrated in the electrically conductive layer 113. Therefore, the magnetic functional element 110 can be driven with a low current.

Meanwhile, there is no particular limitation to the usage of the magnetic functional element 110 having the function of controlling the direction of magnetization of the movable magnetic layer 117. For example, the magnetic functional element can be used as an electro-optical modulator, an information recording element, variable resistance element or as an amplifying element, as discussed subsequently.

2-2-1-1 Method for Fabricating Magnetic Functional Element

Using a quintenary magnetron sputtering device, the magnetic functional element 110 was actually produced. The fabrication procedure is as follows:

(i) Formation of a Solid Magnetic Layer

First, a stationary magnetic layer 112 of a cobalt-ferrite thin film was formed on the glass substrate 111 of BK-7. Specifically, a cobalt-ferrite thin film was deposited on the glass substrate 111, heated to 250° C., through a first mask having a rectangular opening 20 $\mu$m in the vertical or y-direction and 220 $\mu$m in the horizontal direction or in the x-direction. The cobalt-ferrite thin film was deposited, using a $CoFe_2O_4$ sintered target, at a deposition rate of 0.3 nm/s, to a thickness of 300 nm, by RF-magnetron sputtering. As a sputtering gas, Ar admixed with 10% of $O^2$ was used and fed at a rate of 20 sccm at a sputtering gas pressure of 3 mTorr.

(ii) Formation of the Electrically Conductive Layer

The electrically conductive layer 113, as a multi-layered film comprised of alternate Cr film and Fe—Ag films, was formed on the stationary magnetic layer 112. Specifically, an Fe—Ag mosaic target, comprised of six sector-shaped Ag plates, each having a center angle of 15°, arrayed on an Fe target, and a Cr target, were sputtered simultaneously, at the same time as the glass substrate 111 formed with the stationary magnetic layer 112 was caused to stay alternately above the respective targets, in order to deposit Cr films and Fe—Ag films repeatedly on the glass substrate 111 at room temperature. The film thicknesses were adjusted so that the Cr films each had a film thickness of 0.9 nm and the Fe—Ag films each had a film thickness of 1.5 nm. The heaping sequence was adjusted so that the Fe—Ag film was the first to be deposited on the stationary magnetic layer 112 and the Fe—Ag film was deposited as the uppermost layer after 16 and half periods.

(iii) Formation of Insulating Layer

An insulating layer of aluminum oxide 116 then was formed on the electrically conductive layer 113. Specifically, a Mo mask having a square-shaped opening of 20 $\mu$m by 20 $\mu$m opening was arrayed at the center of a deposited pattern and an Al thin film was further deposited thereon. Then, using the substrate etching function of a sputtering device, the Al thin film was plasma-oxidized to form the insulating layer 116. This plasma oxidation of the Al thin film was carried out at a gas pressure of 10 mTorr in an atmosphere of Ar admixed with 5% of $O^2$.

(iv) Formation of Movable Magnetic Layer

The movable magnetic layer 117, composed of a $Ni_{78}Fe_{22}$ alloy thin film, then was formed on the insulating layer 116. Specifically, a Mo mask having a square opening 3 $\mu$m by 3 $\mu$m was arrayed in register with a deposited pattern on the glass substrate 111. The glass substrate 111 was heated to 160° C. and a $Niu_{78}Fe_{22}$ alloy thin film 110 nm in thickness was deposited thereon. The $Niu_{78}Fe_{22}$ alloy thin film was deposited, as the magnetic field of 50 Oe was applied in a direction parallel to the longitudinal side of the pattern (in the y-direction), in order to accord magnetic anisotropy to the $Niu_{78}Fe_{22}$ alloy thin film of 10 mn in thickness.

(v) Formnation of Electrodes

Then, the Au electrodes 114, 115 were formed on both ends of the electrically conductive layer 113. Specifically, Au thin films were deposited to a size of 100 μm long, 100 μm wide and 200 μm thick so as to overlie both ends of the electrically conductive layer 113, that is to overlie the left and right ends of the previously deposited pattern.

(vi) Magnetization of Stationary Magnetic Layer

Finally, a magnetic field of 2 kOe was applied by an electromagnet at room temperature in a direction parallel to the horizontal side of the pattern (x-direction) to complete the magnetic functional element 110 shown in FIGS. 21 and 22, with the direction of magnetization of the stationary magnetic layer 112 aligned in the x-direction.

2-2-1-2 Confimation of Exchange Interaction

An external magnetic field was then applied across the magnetic functional element 110 fabricated as described above to observe the magnetization hysteresis of the movable magnetic layer 117 to confirm the results of the presence of the exchange interaction. The results were as follows:

For observing the magnetization hysteresis of the movable magnetic layer 117, the magneto-optical Kerr effect MOKE, proportional to the magnetization of the material surface layer, was utilized. Specifically, a set of MOKE measurement devices was arranged in the x-z plane and another set of MOKE measurement devices was arranged in the y-z plane, in order to measure the Kerr rotation angle proportionate to the magnetization component in the x-direction and that proportionate to the magnetization component in the y-direction.

Figure 23:
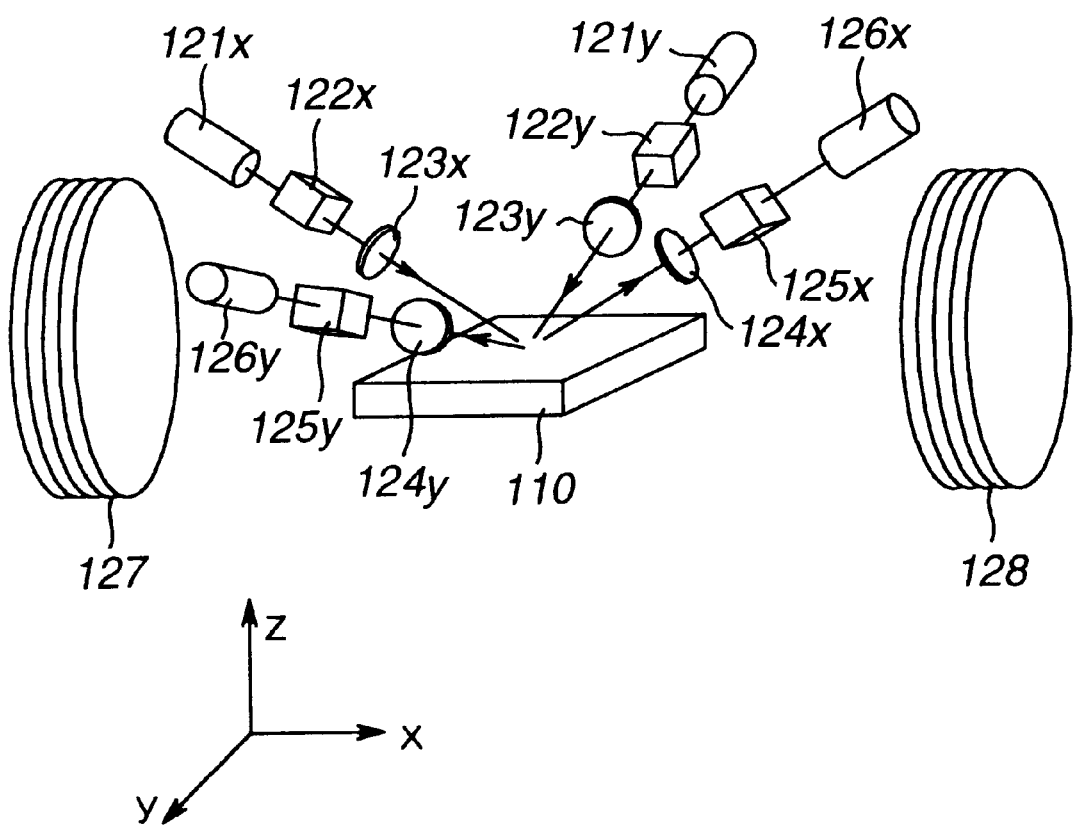
FIG. 23 shows the method of measuring components of magnetization in two mutually perpendicular directions (x- and y-directions).

The MOKE measurement device for measuring the Kerr rotation angle in the x-direction includes an optical system comprised of a semiconductor laser 121x for radiating the visible light laser with a wavelength of 670 nm, a light polarizator 122x, a first lens 123x, a second lens 124x, a light polarizator 125x and a photodetector 126x, arranged in the x-z plane, as shown in FIG. 23. The MOKE measurement device illuminates the laser light emitted by the semiconductor laser 121x through the polarizator 122x and the first lens 123x to the movable magnetic layer 117 of the magnetic functional element 110 and the reflected light from the movable magnetic layer 117 is detected by the photodetector 126x via the second lens 124x and the light polarizator 125x to measure the Kerr rotation angle proportionate to the magnetization component in the x-direction. It should be noted that the angle of incidence of the laser light illuminated on the movable magnetic layer 117 of the magnetic functional element 110 and the polarization surface of the laser light are set so that only the MOKE ascribable to the movable magnetic layer 117 can be detected efficiently.

The MOKE measurement device for measuring the Kerr rotation angle in the y-direction includes an optical system comprised of a semiconductor laser 121y for radiating the visible light laser with a wavelength of 670 nm, a light polarizator 122y, a first lens 123y, a second lens 124y, alight polarizator 125y and a photodetector 126y, arranged in the y-z plane, as shown in FIG. 23. The MOKE measurement device illuminates the laser light emitted by the semiconductor laser 121y through the polarizator 122y and the first lens 123y to the movable magnetic layer 117 of the magnetic functional element 110 and the reflected light from the movable magnetic layer 117 is detected by the photodetector 126y via the second lens 124y and the light polarizator 125y to measure the Kerr rotation angle proportionate to the magnetization component in the y-direction. It should be noted that the angle of incidence of the laser light illuminated on the movable magnetic layer 117 of the magnetic functional element 110 and the polarization surface of the laser light are set so that only the MOKE ascribable to the movable magnetic layer 117 can be detected efficiently.

For observing the magnetization hysteresis of the movable magnetic layer 117, an external magnetic field with variable magnitude and orientation was applied to the magnetic functional element 110. The external magnetic field was applied across the magnetic functional element 110 by a pair of coils 127, 128 arranged on both sides of the magnetic functional element 110, as shown in FIG. 23. The magnitude and the orientation of the magnetic field applied to the magnetic functional element 110 were changed by varying the current flowing through the coils 127, 128 and the positions of the coils 127, 128.

Meanwhile, the in-plane magnetization curve of the stationary magnetic layer 112 was measured using a vibrating sample magnetometer VSM. It was found that the magnetization curve presented a satisfactory rectangular shape, with the coercivity being 1060 Oe. Thus, the magnetization hysteresis of the movable magnetic layer 117 by the MOKE was observed for the applied magnetic field strength up to ±50 Oe so as not to cause changes in the magnetization state of the stationary magnetic layer 112 magnetized in the +x direction. Four types of the magnetization hysteresis were observed, namely the magnetization hysteresis in the x-direction in the absence of the current flowing in the movable magnetic layer 117, the magnetization hysteresis in the y-direction in the absence of the current flowing in the movable magnetic layer 117, the magnetization hysteresis in the x-direction in the presence of the current flowing in the movable magnetic layer 117, and the magnetization hysteresis in the y-direction in the presence of the current flowing in the movable magnetic layer 117.

Figure 24:
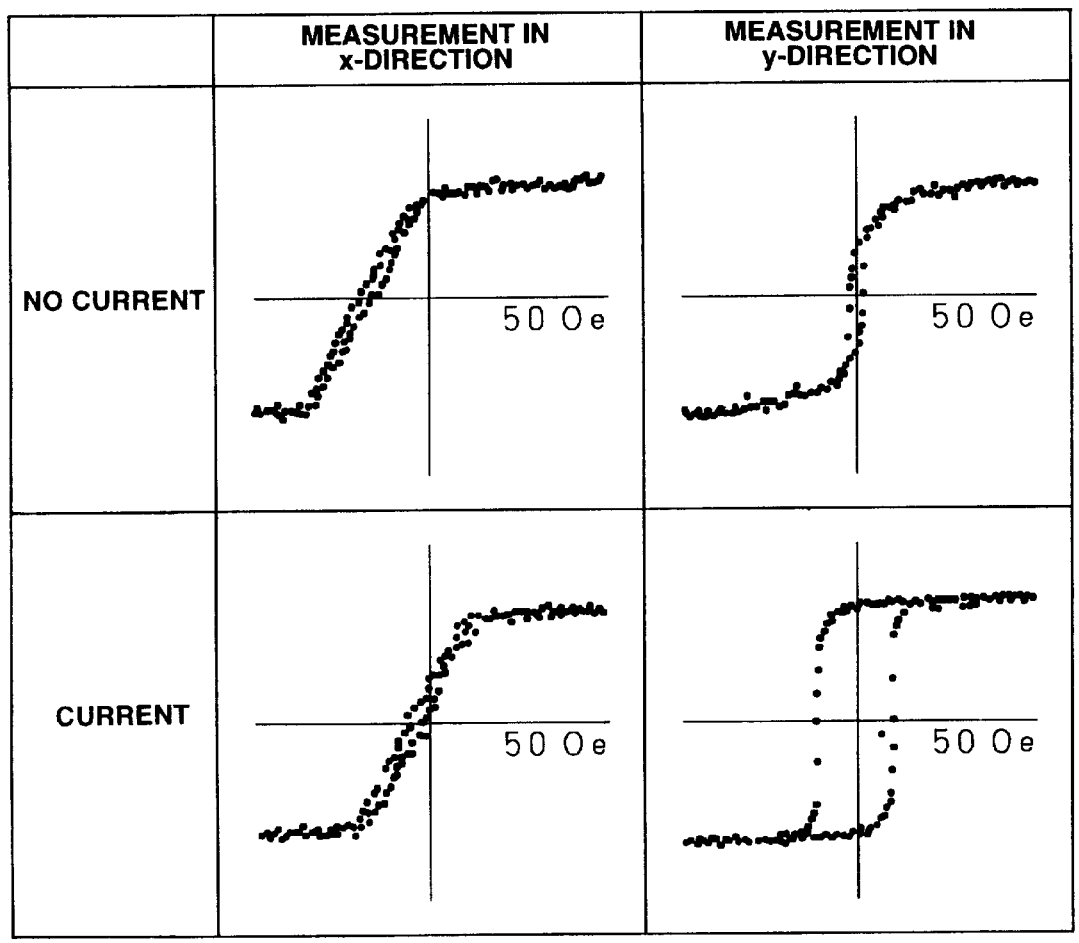
FIG. 24 shows the measured results of hysteresis of magnetization in in two mutually perpendicular directions (x- and y-directions) of the magnetic functional element.

First, the magnetization hysteresis in the absence of the current supplied to the electrically conductive layer 113 was observed. The observed results of the magnetization hysteresis in the x-direction and in the y-direction are shown on upper left and upper right sides of FIG. 24, respectively. The magnetization hysteresis of the x-direction, shown on the upper left side of FIG. 24, represents a hysteresis curve showing left-right symmetry shifted towards left. It is seen from this that the movable magnetic layer is subjected to the bias susceptible to magnetization in the +x direction. On the other hand, the magnetization hysteresis n the y-direction, indicated on the upper right side of FIG. 24, indicates that, in the absence of current flowing in the electrically conductive layer 113, the residual magnetization in the y-direction in the zero magnetic field is extremely small. It is seen from this that, in the zero magnetic field, the direction of magnetization of the movable magnetic layer 117 is oriented substantially in the x-direction.

Then, as the current of 1.2 mA was sent to the electrically conductive layer 113, the magnetization hysteresis of the movable magnetic layer 117 was observed. The observed results of the magnetization hysteresis in the x-direction and in the y-direction are shown on the lower left and lower right sides, respectively. As may be seen from these observed results, if the current is fed through the electrically conductive layer 113, the movable magnetic layer 117 exhibited characteristics of easy magnetization in the y-direction.

Meanwhile, if the current supply is discontinued to observer the magnetization hysteresis of the movable magnetic layer 117, the movable magnetic layer 117 displayed magnetization hysteresis as shown on the upper side of FIG. 24. This indicates that changed caused by whether or not the current is supplied through the movable magnetic layer 117 wee of reversible nature.

Figure 25:
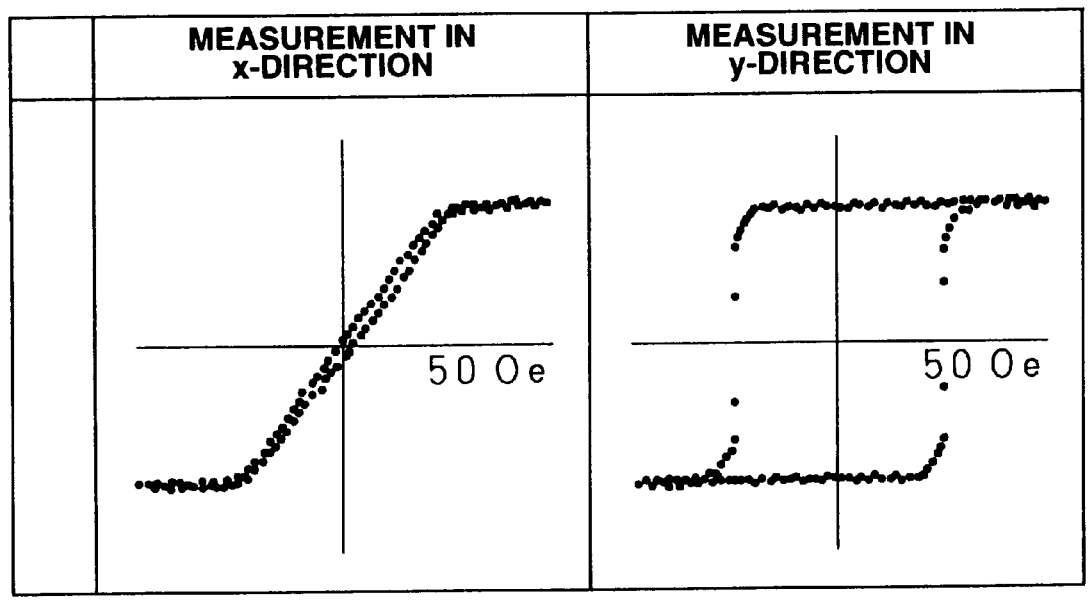
FIG. 25 shows a magnetization curve of a thin film of a Ni—Fe alloy formed on a non-magnetic substrate.

For comparison, the only a Ni—Fe alloy thin film was formed on a non-magnetic substrate and the magnetization hysteresis of the Ni—Fe alloy thin film was observed. The results are shown in FIG. 25. The samples used for these observations were prepared by directly depositing Ni—Fe thin alloy films on the glass substrate under an environment in which, as in the case of forming the movable magnetic layer 117, the magnetic field was applied in the y-direction. The magnetization curve in the y-direction of the Ni—Fe alloy thin film, prepared under the environment in which the magnetic field was applied in the y-direction, showed large coercivity and large residual magnetism, indicating that the magnetic anisotropy of easy magnetization in the y-direction is built in this Ni—Fe alloy thin film.

As may be seen from FIG. 25, the Ni—Fe thin alloy film, deposited in the magnetic field, has the easy axis in the direction of the applied magnetic field. Therefore, the movable magnetic layer 117 of the magnetic functional element 110 by itself has an easy axis in the y-direction. The characteristics of the observed results shown in FIG. 24 are thought to reflect the effect from the underlying layer.

If no current is fed through the electrically conductive layer 113, the movable magnetic layer 117 is biased in the zero magnetic field so as to be easily magnetized in the x-direction. This suggests that the ferromagnetic interaction of aligning the direction of magnetization is propagated from the underlying layer magnetized in the +x direction. On the other hand, if the current is supplied through the electrically conductive layer 113, the movable magnetic layer 117 displays characteristics similar to the observed results of the comparative samples sown in FIG. 25, thus more outstandingly displaying the characteristics proper to the movable magnetic layer itself. It is seen from this that by flowing the current through the electrically conductive layer 113, the effect from the underlying layer is weakened.

The above-mentioned observed results indicate that there exists the exchange interaction between the movable magnetic layer 117 and the stationary magnetic layer 112 as the underlying layer of the movable magnetic layer 117 and that the exchange interaction is weakened by supplying the current to the electrically conductive layer 113.

2-2-1-3 Verification of Switching Operation

Figure 26:
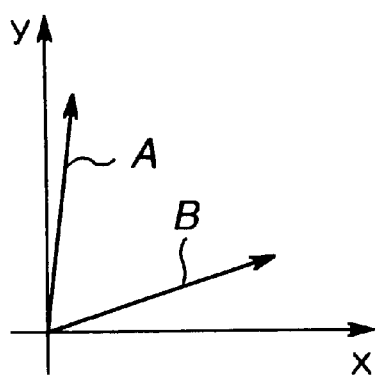
FIG. 26 shows the direction of magnetization of a movable magnetic layer of the magnetic functional element and specifically showing the direction of magnetization when the conductor layer is fed with current and the direction of magnetization when the conductor layer is fed with current.

FIG. 26 shows the ratio of the magnetization components in the respective directions in the zero magnetic field state, as read from FIG. 24, and the orientation of the magnetization vector of the movable magnetic layer 117, as estimated from the read-out ratio. In FIG. 26, vectors A and B indicate the orientations of the magnetization vector of the movable magnetic layer 117 in the current-flowing state and in the non-current-flowing state, respectively.

It is seen from FIG. 26 that the magnetization of the movable magnetic layer 117 is not changed in its absolute value, and is switched between approximately 20° and approximately 85° in terms of the angle the direction of magnetization makes with the x-direction. It was actually verified that the magnetization vector of the movable magnetic layer 117 was switched between these two directions by the on/off of the current supplied to the electrically conductive layer 113.

In verifying the switching operation, two sets of the MOKE measurement devices, shown in FIG. 23, were used simultaneously, and the current on/off to the electrically conductive layer 113 was switched as the Kerr rotation angle in the xdirection proportionate to the magnetization component in the x-direction of the movable magnetic layer 117 and that in the y-direction proportionate to the magnetization component in the y-direction of the movable magnetic layer 117 were monitored.

Figure 27:
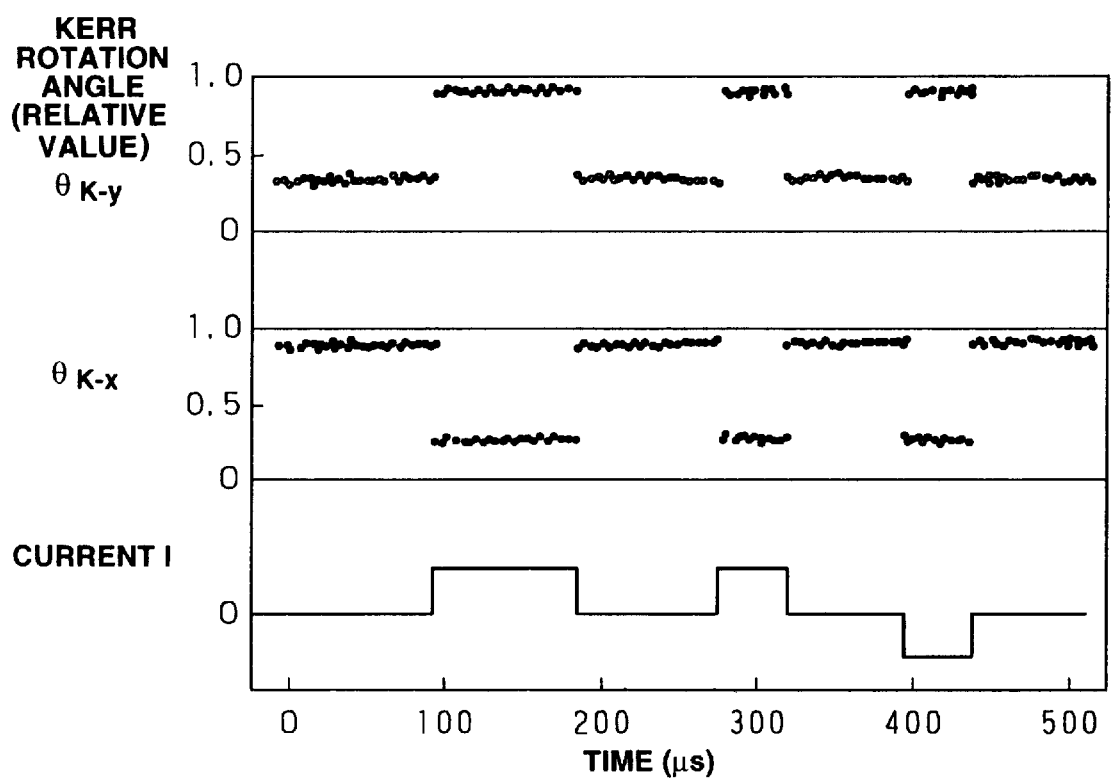
FIG. 27 shows the results of observation of time changes of the magnetization of the magnetic functional element in two mutually perpendicular directions (x- and y-directions) when the on/off state of the current supplied to the conductor layer is switched.

The results are shown in FIG. 27, in which $\theta_{k-x}$ denotes the Kerr rotation angle in the x-direction, $\theta_{k-y}$ denotes the Kerr rotation angle in the y-direction and I indicates the current supplied to the electrically conductive layer 113. As may be seen from FIG. 27, there is observed in the direction of magnetization of the movable magnetic layer 117 a change synchronized with the on/off operation of the current fed to the electrically conductive layer 113, while there is also noticed a 'momentary' switching operation in which the output is changed only as long as there is a current input to the electrically conductive layer 113.

Meanwhile, when the current was supplied to the electrically conductive layer 113, the magnetization vector of the movable magnetic layer 117 was changed in a direction of increasing the angle which the vector makes with the current flowing direction. However, the angular range for which switching occurred was not changed despite changes in the current polarity. From this it is seen that the role which the magnetic field generated by the current plays in changing the direction of magnetization of the movable magnetic layer 117 is small and that the motive power which effects the switching operation resides in the changes in the exchange interaction.

Meanwhile, in the magnetic functional element, the upper and lower layers of the electrically conductive layer 113 are formed of an oxide having the electrical resistance significantly higher than that of the electrically conductive layer 113. Therefore, the 1.2 mA current supplied via the electrodes 114, 115 flows substantially only through the electrically conductive layer 113. In the magnetic functional element 110, the portion of the electrically conductive layer 113 with a width of 20 μm taking part in the switching operation of the movable magnetic layer 117 3 μm by 3 μm in size is only the center 3 μm portion. Thus, the switching operation is achieved with the net current of 0.18 mA.

In this manner, with the magnetic functional element 110, the switching operation can be realized with an extremely small current. In a conventional solid magnetic memory, it is reported that the current caused to flow in a conductor to control the magnetization of the recording carrier could be reduced to approximately 1 mA. With the above-described magnetic functional element, switching can be realized with the significantly smaller current. Moreover, with the inventive system in which magnetization is controlled by the exchange interaction, the current required for the switching operation can be reduced further if the cell size is smaller. Meanwhile, if the 1.3 mA current is supplied to the electrically conductive layer 113, the current density is approximately $1.56 \times 10^9 A/m^2$. This value is of substantially the same order of magnitude as the current density of the current caused to flow through the conductor to control the magnetization of the recording carrier.

2-2-2-4 Operation of the Electrically Conductive Layer

With the above-described magnetic functional element 110, the multi-layer film, obtained on repeatedly layering Cr and Fe—Ag films, is used as the electrically conductive layer 113 controlling the exchange interaction between the stationary magnetic layer 112 and the movable magnetic layer 117. The mechanism for controlling the exchange interaction between the stationary magnetic layer 112 and the movable magnetic layer 117 by the electrically conductive layer 113 is now explained.

If, in the multi-layer film, comprised of Cr and Fe films, layered together, the thickness of t the Cr layer is selected to an appropriate value, such as 0.7 nm, there is realized anti-ferromagnetic coupling, in a known manner, in which magnetization of the Fe films on both sides of the Cr film is antiparallel to each other. If an Fe—Ag film is used in place of the Fe film, similar magnetic coupling occurs on both sides of the Cr film. It is noted however that, if the Fe—Ag film is used in place of the Fe film, the magnetic coupling of the entire multi-layer film becomes weaker because of the Ag content.

Since there are an even number of the Cr films, there is produced ferromagnetic coupling between the lowermost Fe—Ag film and the uppermost Fe—Ag film which tends to align the magnetic moments of the two layers to the same direction and to the same magnitude.

The initially layered Fe—Ag film is ferromagnetically coupled to the stationary magnetic layer 112 made up of the cobalt-ferrite thin film. On the other hand, the insulating layer 116 formed of aluminum oxide is formed on the Fe—Ag film, layered last. This insulating layer 116 is of an extremely thin thickness and hence has many pin-holes. Thus, the uppermost Fe—Ag film is ferromagnetically coupled via these pinholes to the movable magnetic layer 117 of the Ni—Fe alloy thin films, formed thereon. If the coupling from the stationary magnetic layer 112 to the movable magnetic layer 117 is traced in the forward direction, it is seen that ferromagnetic coupling is produced between the stationary magnetic layer 112 and the movable magnetic layer 117, in agreement with the conclusion from the magnetic characteristics shown in an upper side of FIG. 24.

When the current is supplied to the electrically conductive layer 113, the magnetic coupling between the stationary magnetic layer 112 and the movable magnetic layer 117 is weakened. It is however difficult to account for the attenuation of the magnetic coupling by a sole reason. If the mechanism is to be envisioned, it may be contemplated that, if the current is supplied to the electrically conductive layer 113, excess electron scattering is produced in the electrically conductive layer 113 by the current, such that the spin is transported in a vertical direction relative to the film surface of the layered films to disturb the electrons mediating the exchange interaction between the upper and lower magnetic layers to weaken the magnetic coupling. It may also be contemplated that, since the temperature rise by the current weakens the magnetic order in the electrically conductive layer, the magnetic coupling is fractionated by temperature rise brought about by the current to weaken the strength of the magnetic coupling mediated by the entire electrically conductive layer.

Figure 28:
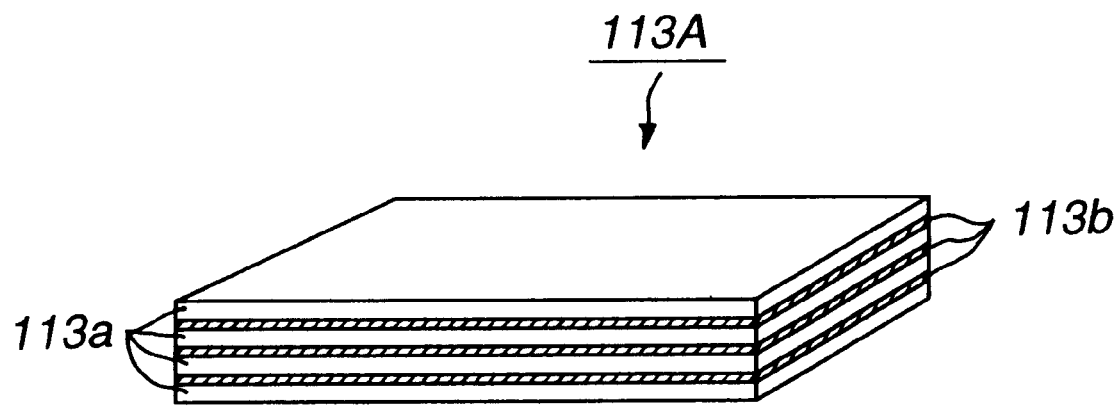
FIG. 28 schematically shows the structure of a conductor layer of a layered structure.

An example of the electrically conductive layer 113 is shown in FIG. 28. The electrically conductive layer 113A, shown in FIG. 28, is made up of plural magnetic layers 113a and intermediate layers 113b disposed between the magnetic layers 113a. Although the electrically conductive layer 113A is made up of four magnetic layers 113a and three intermediate layers 113b, the electrically conductive layer 113 used in the above-mentioned magnetic functional element 110 is made up of 17 magnetic layers 113a and 16 intermediate layers 113b. There is, however, no particular limitation to the number of the layers which may be suitably changed depending on the desired magnetic coupling state.

Also, in the electrically conductive layer 113 of the magnetic functional element 110, an Fe—Ag film is used as the magnetic layer 113a and a Cr film is used as the intermediate layer 113b. However, the materials of the magnetic layers 113a or the intermediate layers 113b is not limited to these materials.

For example, ferromagnetic metals, such as Fe, Co or Ni, or alloys thereof with non-magnetic metals, may be used. As the intermediate layers 113b, almost any metal species may be used. For example, Ti, V, Mn, Cu, Zr, Nb, Mo, Ru, Rh, Pd, Ag, Hf, Ta, W, Re, Ir, Pt or Au, may be used. Also, Cr, itself exhibiting anti-ferromagnetism at room temperature, may naturally be used as the intermediate layers 113b, as it is used in the above-mentioned electrically conductive layer 113. In the electrically conductive layer 113A, having this layered structure, it can be optionally changed by, for example, the type of the magnetic layers 113a, thickness of the intermediate layers 113b or the number of layers of the magnetic layers 113a or the intermediate layers 113b, whether or not the resulting magnetic coupling is ferromagnetic or anti-ferromagnetic, or which is the strength of the magnetic coupling.

Meanwhile, it suffices if the electrically conductive layer 113, used in the magnetic functional element 110, has the function of changing the manner of propagation of the magnetic interaction in the solid phase. Therefore, the electrically conductive layer 113 may be formed of a composite material containing both a material displaying magnetic order as a sole phase and a non-magnetic material. In this case, the electrically conductive layer 113 may be formed without using a multidimensional sputtering device o facilitate the formation of the electrically conductive layer 113.

The electrically conductive layer 113 may be constituted by layered thin films or composition-modulated films, obtained on alternately forming regions of a ferromagnetic composition and regions of non-magnetic compositions. This gives a merit that the structure of the electrically conductive layer 113 is easy to control to assure high reproducibility of characteristics. Moreover, by varying the film thicknesses or the layering periods, material designing or matching of characteristics can be realized easily. This is the case with the electrically conductive layer 113A shown in FIG. 28.

The electrically conductive layer 113 may be of a three-dimensional mixture of the regions of a ferromagnetic composition and regions of non-magnetic compositions. Since there are a number of paths of the magnetic coupling of different strengths, it becomes possible to decrease gradually the magnetic coupling by removing the paths beginning from the weaker coupling paths. Therefore, this structure is particularly suited for an analog operation as in the case of the variable resistance element which will be explained subsequently.

Figure 29:
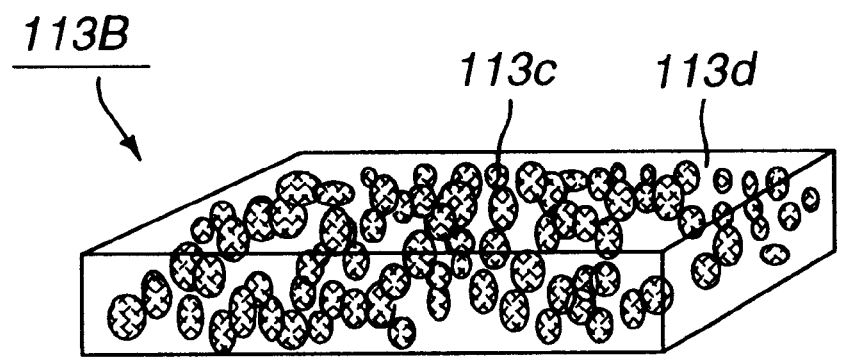
FIG. 29 schematically shows the structure of a conductor layer of a fine particle dispersion structure.

FIG. 29 shows a typical example of the electrically conductive layer 113 comprised of a three-dimensional mixture of the regions of a ferromagnetic composition and regions of non-magnetic compositions. The electrically conductive layer 113B shown in FIG. 29 is of a fine particle dispersion structure in which ferromagnetic particles 113c are dispersed in the inside of a non-magnetic material 113d in the electrically conductive layer 113B of the fine particle dispersion structure, the magnetic coupling is transmitted among ferromagnetic particles 113c like step stones, as a result of which the stationary magnetic layer 112 and the movable magnetic layer 117 arranged on both sides of the electrically conductive layer 113B are magnetically coupled together.

The magnetic coupling among the ferromagnetic particles is extremely weak, so that, if the current flows in the electrically conductive layer 113B, the magnetic coupling tends to be fractionated due to excess electron scattering and rise in temperature. That is, in the electrically conductive layer 113B of the fine particle dispersion structure, the magnetic coupling between the stationary magnetic layer 112 and the movable magnetic layer 117 arranged on both sides thereof, depends on the weak magnetic coupling among the ferromagnetic particles, such that the macroscopic magnetic coupling tends to be fractionated by the current flowing in the electrically conductive layer 113B.

In the electrically conductive layer 113B of the fine particle dispersion structure, the aforementioned materials enumerated for the electrically conductive layer 113a constituting the electrically conductive layer 113A of the layered structure may be used as the materials of the ferromagnetic particles 113c. Also, the aforementioned materials enumerated for the intermediate layers 113b constituting the electrically conductive layer 113A of the layered structure may be used as the materials of the nonmagnetic layer 113d into which are dispersed the ferromagnetic particles 113c.

Meanwhile, the fine particle dispersion structure may also be used as an element of the layered structure. Although the Fe—Ag film is used as the electrically conductive layer 113 of the magnetic functional element 110, the Fe—Ag film, formed of a material of a mixture of two phases of the non-solid-solution type, may correctly be said to be of a fine particle dispersion structure.

The electrically conductive layer 113 may not only be composed of two coexisting phases but also be composed of a single-phase ferri-magnetic material in the state close to a compensation point. The single-phase ferri-magnetic material in the state close to a compensation point exhibits marked changes in the macroscopic magnetic properties by stimuli applied from outside. Thus, by using the single-phase ferri-magnetic material in the state close to a compensation point as the material for the electrically conductive layer 113, it is possible to control the magnetic coupling state between the stationary magnetic layer 112 and the movable magnetic layer 117 or to modulate the magnetic bias directly for the movable magnetic layer 117.

2-2-1-5 Outputting Method

In the above experiment, the results of the switching operation for switching the direction of magnetization of the movable magnetic layer 117 are detected optically by exploiting the MOKE. This is tantamount to the magnetic functional element 110 operating as an electro-optical modulation unit. However, the results of the switching operation for the direction of magnetization of the movable magnetic layer 117 can also be obtained as an electrical output.

Figure 30:
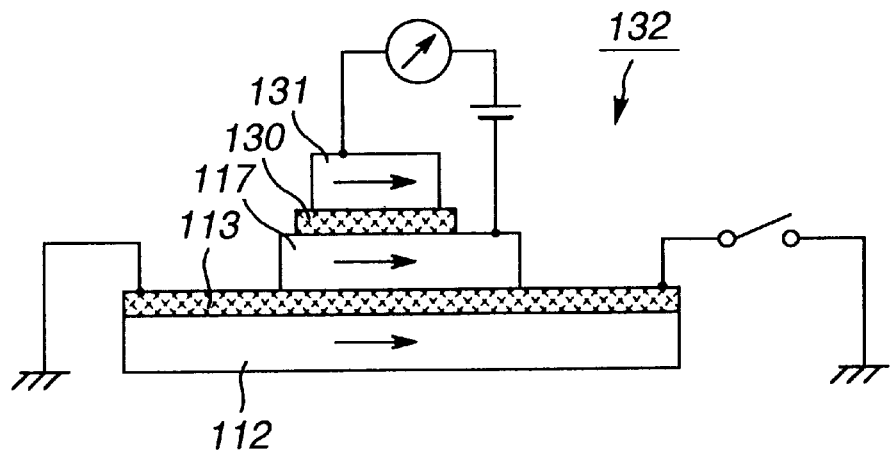
FIG. 30 shows the structure of a magnetic functional element and its peripheral circuit when the results of the switching operation of the direction of magnetization of the movable magnetic layer is obtained as an electrical output.

If the results of the switching operation for the direction of magnetization of the movable magnetic layer 117 are to be obtained as an electrical output, a spacer layer 130 of a non-magnetic metal and a magnetic layer 131 of a magnetic metal having the fixed direction of magnetization are arranged on the movable magnetic layer 117, as shown in FIG. 30. By arranging the spacer layer 130 and the magnetic layer 13 lin the movable magnetic layer 117, changes in the direction of magnetization of the movable magnetic layer 117 can be detected as changes in resistance by the spin valve operation of the movable magnetic layer 117, spacer layer 130 and the magnetic layer 131.

Specifically, an output circuit 132 is constituted for interconnecting the movable magnetic layer 117 and the magnetic layer 131, as shown in FIG. 30. At this time, the electrical resistance is changed in dependence upon the angle the direction of magnetization of the movable magnetic layer 117 makes with the direction of magnetization of the magnetic layer 131 to vary the magnitude of the output current flowing in the output circuit.

Meanwhile, the results of the switching operation for the direction of magnetization of the movable magnetic layer 117 can also be detected by exploiting the tunnel magneto-resistive effect instead of by exploiting the spin valve effect. When exploiting the tunnel magneto-resistive effect, the spacer layer 130 is formed of an insulating material. If the insulating material is used for the spacer layer 130, the magnitude of the current flowing in the output circuit 132 is changed by the tunnel magneto-resistive effect.

Alternatively, four terminals may be suitably connected to the movable magnetic layer 117 and used to obtain a voltage output by the Hall effect in dependence upon the direction of magnetization of the movable magnetic layer 117.

2-2-2 Write-Once Type Information Recording Element

A write-once type information recording element exploiting the exchange interaction by the current is hereinafter explained.

Meanwhile, the operation of orienting the direction of magnetization of the movable magnetic layer in a certain direction is termed the driving operation. The layer which applies the driving operation to the movable magnetic layer is termed a driving layer. In the following description, the portions corresponding to the stationary magnetic layer 112 and the electrically conductive layer 113 of the above-described magnetic functional element 110 are collectively termed a driving layer.

2-2-2-1 Positive Logic Driving Type Information Recording Element

Figure 31A:
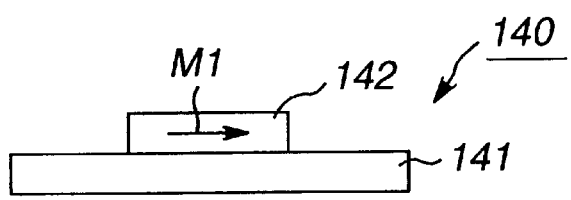
Figure 31B:
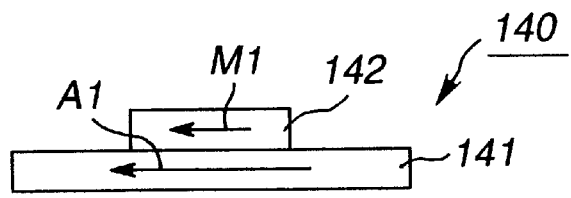
Figure 31C:
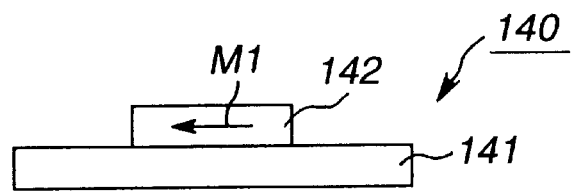

An example of an information recording element which enable writing only once by exploiting the modulation of the exchange interaction is shown in FIGS. 31A to 31C which are schematic views for illustrating the driving principle of the information recording element without specifically showing the wiring for the output or input circuits.

Referring to FIGS. 31A to 31C, the information recording element 140 includes a driving layer 141, on which is formed a magnetic material 142 exhibiting uniaxial magnetic anisotropy, and is adapted for binary recording depending on the direction of magnetization of the movable magnetic layer 142. In FIGS. 31A to 31C, arrows M1 and A1 denote the direction of magnetization of the movable magnetic layer 142 and the driving operation acting on the movable magnetic layer 142 from the driving layer 141.

This information recording element 140 is a so-called 'positive logic driving type' element in which the driving operation A1 acts from the driving layer 141 to the movable magnetic layer 142 when the direction of magnetization of the movable magnetic layer 142 is changed. The driving principle of the information recording element 140 is hereinafter explained.

With the present information recording element 140, the direction of magnetization M1 of the movable magnetic layer 142 is set in the re-set state so as to be reversed from the direction of the driving operation A1 from the driving layer 141, as shown in FIG. 31A. In the example of FIGS. 31A to 31C, the direction of the driving operation A1 is leftward and, in the re-set state, the direction of magnetization M1 of the movable magnetic layer 142 is rightward. In this re-set state, current is supplied to an electrically conductive layer of the driving layer 141, so that the driving operation A1 from the driving layer 141 to the movable magnetic layer 142 ceases.

In order to change the direction of magnetization M1 of the movable magnetic layer 142 to set the on-state of writing the information, the current supply to the electrically conductive layer constituting the driving layer 141 is discontinued. This produces the exchange interaction between the driving layer 141 and the movable magnetic layer 142, while producing the driving operation A1 from the driving layer 141 to the movable magnetic layer 142.

At this time, the driving operation A1 operating from the driving layer 141 on the movable magnetic layer 142 is adapted to have the magnitude in excess of the coercivity of the movable magnetic layer 142. If the driving operation A1 is adapted to exceed the coercivity of the movable magnetic layer 142, the magnetization of the movable magnetic layer 142 is inverted when the on-state is reached, with the direction of magnetization M1 of the movable magnetic layer 142 being then aligned with the direction of the driving operation A1. That is, with the present information recording element 140, the direction of magnetization M1 of the movable magnetic layer 142 is inverted to leftwards when the on-state is reached.

If then the current supply to the electrically conductive layer of the driving layer 141 to inhibit the driving operation A1 from the driving layer 141 to the movable magnetic layer 142, the inverted direction of magnetization M1 of the movable magnetic layer 142 is retained, on account of the uniaxial magnetic anisotropy, as shown in FIG. 31C. That is, if the driving operation A1 is prohibited from acting from the driving layer 141 to the movable magnetic layer 142, the set state, in which the direction of magnetization M1 of the magnetic material 142 has been reversed, is retained, as shown in FIG. 31C.

With the present information recording element 140, as described above, the direction of magnetization M1 of the movable magnetic layer 142 can be reversed by switching the on/off of current supply to the electrically conductive layer constituting the driving layer 141, thus enabling binary recording depending on the direction of magnetization of the movable magnetic layer 142. It should be noted that the information recording element 140 has to continue the current supply to the electrically conductive layer of the driving layer 141 in order to retain the re-set state and hence is not a non-volatile memory.

The present inventors have actually prepared, as the above-mentioned information recording element 140, an element which, similarly to the magnetic functional element 110 shown in FIGS. 21 and 22, includes a glass substrate having formed thereon a stationary magnetic layer of a cobalt-ferrite thin film magnetized to the −x direction, a multi-layered electrically conductive film formed by repeatedly layering the Cr and Fe—Ag films, an insulating layer of aluminum oxide and a movable magnetic layer of a Ni—Fe alloy thin film having an easy axis in the x-direction.

The changes caused in the direction of magnetization of the movable magnetic layer on changing the on/off state of current supply to the electrically conductive layer were checked by measuring the MOKE. Specifically, a magnetic field of 40 Oe was applied in the +x direction, with the current being fed to the electrically conductive layer, in order to align the magnetization of the movable magnetic layer to the +x direction, The magnetic field applied was then removed, as the current was continuously supplied to the electrically conductive layer. It was found that the magnetization of the movable magnetic layer was kept in the +x direction, and that, on cessation of the current supply, the magnetization was inverted to the −x direction, It was thus found that, by switching the on/off of the current supply to the electrically conductive layer, the direction of magnetization of the movable magnetic layer could be changed to enable a write-once operation. It should however be noted that the switching operation of the movable magnetic layer in this case is not the switching operation of changing the angle between the direction of magnetization of the movable magnetic layer and the x-direction from approximately 20° to approximately 85° but is a switching operation between parallel and anti-parallel.

2-2-2-2 Negative Logic Driving Type Information Recording Element

Figure 32A:
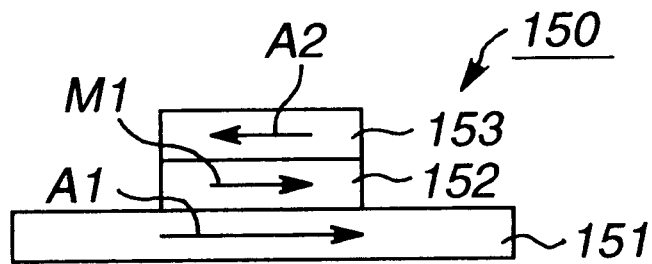
Figure 32B:
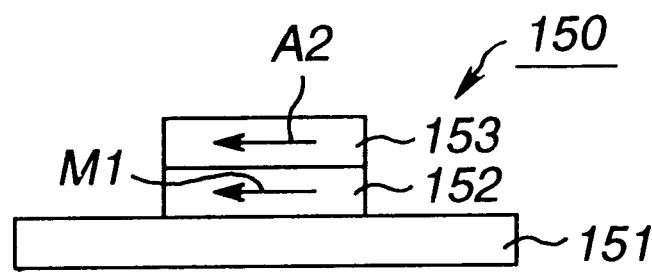
Figure 32C:
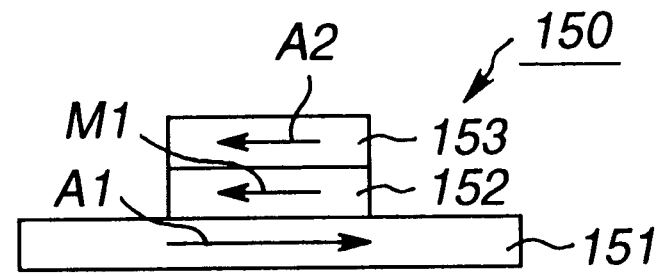

A modification of the information recording element enabling the write-once operation by exploiting the modulation of the exchange interaction by the current is shown in FIGS. 32A to 32C. Meanwhile, FIGS. 32A to 32C are schematic views, similar to FIGS. 31A to 31C, for illustrating the driving principle of the information recording element without specifically showing the wiring for the output or input circuits.

Referring to FIGS. 32A to 32C, showing an information recording element 150, a movable magnetic layer 152 having uniaxial magnetic anisotropy is formed on a driving layer 151, and an anti-ferrornagnetic layer 153 for applying the driving action reversed from the driving action from the driving layer 151 to the movable magnetic layer 152 is formed on the movable magnetic layer 152, in order to enable binary recording depending on the direction of magnetization of the movable magnetic layer 152. In FIGS. 32A to 32C, arrows A1, A2 and M1 indicate the driving operation from the driving layer 151 to the movable magnetic layer 152, the driving operation from the anti-ferromagnetic layer 153 to the movable magnetic layer 153 and the direction of magnetization of the movable magnetic layer 152, respectively.

This information recording element 150 is a so-called negative logic driving type element, in which the direction of magnetization M1 of the movable magnetic layer 152 is changed when the driving operation A1 from the driving layer 151 to the movable magnetic layer 152 ceases. The driving principle of the information recording element 150 is hereinafter explained.

In this information recording element 150, the direction of magnetization M1 of the movable magnetic layer 152 is set to the same direction as that of the driving operation A1 in the re-set state, as shown in FIG. 3A. In the embodiment of FIGS. 32A to 32C, the direction of the driving operation A1 is rightward and, in the re-set state, the direction of magnetization M1 of the movable magnetic layer 152 is rightward. In this information recording element 150. no current is supplied in the re-set state to the electrically conductive layer of the driving layer 151. Therefore, in the reset sate, the driving operation A1 from the driving layer 151 is applied to the movable magnetic layer 152. However in the information recording element 150, the driving operation A2 reversed in direction from the driving operation A1 from the driving layer 151 is applied from the anti-ferromagnetic layer 153 to the movable magnetic layer 152, with the driving operation A1 from the driving layer 151 being cancelled by the driving operation A2 from the anti-ferromagnetic layer 153. However, since the anti-ferromagnetic layer 153 exhibits uniaxial magnetic anisotropy, the direction of magnetization M1 of the movable magnetic layer 152 is kept in its initially magnetized direction, without dependency upon the driving operation A1 from the driving layer 151 or the driving operation A2 from the anti-ferromagnetic layer 153.

If the direction of magnetization M1 of the movable magnetic layer 152 is to be changed to set up an on-state for writing the information, the current is supplied to the electrically conductive layer of the driving layer 151. This weakens the exchange interaction between the driving layer 151 and the movable magnetic layer 152 such that the driving operation A1 from the driving layer 151 to the movable magnetic layer 152 is rendered ineffective. The driving operation A2 from the anti-ferromagnetic layer 153 to the movable magnetic layer 152 is set so as to have a magnitude surpassing the coercivity of the movable magnetic layer 152. If the driving operation A2 from the anti-ferromagnetic layer 153 is designed to exceed the coercivity of the movable magnetic layer 152, the magnetization of the movable magnetic layer 152 is inverted when the driving operation A1 from the driving layer 151 to the movable magnetic layer 142 ceases to be effective, with the direction of magnetization M1 of the movable magnetic layer 152 being aligned with the direction of the driving operation A2 from the anti-ferromagnetic layer 153. That is, with the present information recording element 150, the direction of magnetization M1 of the movable magnetic layer 152 is inverted to leftwards when the on-state is reached.

If subsequently the current ceases to be supplied to the electrically conductive layer constituting the driving layer 151 to permit the driving operation A1 to be applied from the driving layer 151 to the movable magnetic layer 152, the driving operation A1 is cancelled y the driving operation A2 from the anti-ferromagnetic layer 153, as in the case of the re-set state. Since the movable magnetic layer 152 has the uniaxial magnetic anisotropy, the inverted direction of magnetization M1 of the movable magnetic layer 152 is retained unchanged, as shown in FIG. 32C. That is, if the current supply to the electrically conductive layer constituting the driving layer 151 such that the driving operation A1 is applied from the driving layer 151 to the movable magnetic layer 152, the set state, corresponding to the inverted direction of magnetization M1 of the movable magnetic layer 152, is maintained, as shown in FIG. 32C.

With the present information recording element 150, as described above, the direction of magnetization M1 of the movable magnetic layer 152 can be inverted by switching the on/off of the current supply to the electrically conductive layer 152 of the driving layer 151, such as to enable binary recording depending on the direction of magnetization M1 of the movable magnetic layer 152. Moreover, there is no necessity in the information recording element 150 to supply the current to the electrically conductive layer of the driving layer 151 to maintain the re-set state or the set state. That is, the present information recording element 150 serves as a non-volatile memory.

The present inventors have actually prepared, as the above-mentioned information recording element 150, an element which, similarly to the magnetic functional element 110 shown in FIGS. 21 and 22, includes a glass substrate having formed thereon a stationary magnetic layer of a cobalt-ferrite thin film, magnetized to the −x direction, a multi-layered electrically conductive film formed by repeatedly layering the Cr and Fe—Ag films, an insulating layer of aluminum oxide and a movable magnetic layer of a Ni—Fe alloy thin film having an easy axis in the x-direction, and which also includes an anti-ferromagnetic Rh—Mn film formed on the movable magnetic layer for applying a driving operation in the -x direction to the movable magnetic layer.

The changes caused in the direction of magnetization of the movable magnetic layer on changing the on/off state of current supply to the electrically conductive layer were checked by measuring the MOKE. Specifically, a magnetic field of 40 Oe was applied in the +x direction, with the current being fed to the electrically conductive layer, in order to align the magnetization of the movable magnetic layer to the +x direction. The magnetic field applied was then removed. It was found that the magnetization of the movable magnetic layer was kept in the +x direction, and that, on supplying the current to the electrically conductive layer, the magnetization was inverted to the −x direction.

It was thus found that, by switching the on/off of the current supply to the electrically conductive layer, the direction of magnetization of the movable magnetic layer could be changed to enable a write-once operation. It should however be noted that the switching operation of the movable magnetic layer in this case is not the switching operation of changing the angle between the direction of magnetization of the movable magnetic layer and the x-direction from approximately 20° to approximately 85° but is a switching operation between the +x direction and the −x direction.

If the on/off of the current supply to the electrically conductive layer is switched to cause transient inversion of magnetization of the movable magnetic layer, the inverted state was kept after the cessation of the current supply. That is, it was confirmed that the element having the anti-ferromagnetic layer formed on the movable magnetic layer operates as a non-volatile memory.

2-2-3 Overwrite Type Information Recording Element

An embodiment of an overwrite type information recording element exploiting the modulation of the exchange interaction by the current is shown in FIGS. 33A to 33D. Similarly to FIGS. 31A to 31D or FIGS. 32A to 32D, FIGS. 33A to 33D are schematic views for illustrating the driving principle of the information recording element without specifically showing the wiring for input or output circuits.

Referring to FIGS. 33A to 33D, showing the information recording element 160, a movable magnetic layer 161 exhibiting uniaxial magnetic anisotropy is sandwiched between a first driving layer 162 and a second driving layer 163. The information recording element 160 can perform binary recording based on the direction of magnetization of the movable magnetic layer 161.

In FIGS. 33A to 33D, arrows A1, A2 and M1 indicate the driving operation from the driving layer 161 to the movable magnetic layer 162, the driving operation from the second driving layer 163 to the movable magnetic layer 161 and the direction of magnetization of the movable magnetic layer 161, respectively.

If the direction along the easy axis of the movable magnetic layer 161 is the x-direction, the first driving layer 162 causes the driving operation A1 to act on the movable magnetic layer 161 in order to orient the direction of magnetization M1 of the movable magnetic layer 161 to the +x direction (rightward direction in FIG. 33). On the other hand, the second driving layer 163 causes the driving operation A2 to act on the movable magnetic layer 161 in order to orient the direction of magnetization M1 of the movable magnetic layer 161 to the −x direction (leftward direction in FIG. 33).

If, in the information recording element 160, the driving operation A1 from the first driving layer 162 to the movable magnetic layer 161 is rendered ineffective, the direction of magnetization M1 of the movable magnetic layer 161 is oriented in the −x direction by the driving operation A2 from the second driving layer 163 to the movable magnetic layer 161. On the other hand, if the driving operation A2 from the second driving layer 163 to the movable magnetic layer 161 is rendered ineffective, the direction of magnetization M1 of the movable magnetic layer 161 is oriented in the +x direction by the driving operation A1 from the first driving layer 162 to the movable magnetic layer 161.

Also, if, in the information recording element 160, both the driving operation A1 from the first driving layer 162 to the movable magnetic layer 161 and the driving operation A2 from the second driving layer 163 to the movable magnetic layer 161 are effective, the driving operation A1 from the first driving layer 162 and the driving operation A2 from the second driving layer 163 cancel each other, while the direction of magnetization M1 of the movable magnetic layer 161 is stabilized by uniaxial magnetic anisotropy of the movable magnetic layer itself to maintain its state.

The driving principle of the information recording element 160 is explained in further detail.

Figure 33A:
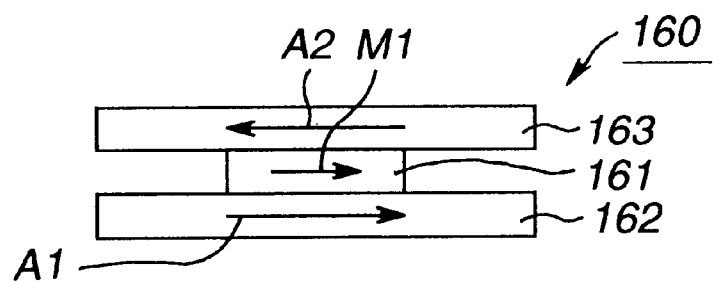
FIGS. 33A to 33D schematic views for illustrating the driving principle of a overwrite type information recording element, where

FIG. 33A shows the state in which the direction of magnetization M1 of the movable magnetic layer 161 is kept in the +x direction (rightward direction in the drawing). At this time, no current is supplied to the electrically conductive layer of the first driving layer 162 nor to the electrically conductive layer of the second driving layer 163. Therefore, both the driving operation A1 from the first driving layer 162 and the driving operation A2 from the second driving layer 163 operate on the movable magnetic layer 161. However, since the direction of the driving operation A1 from the first driving layer 162 is reversed from the direction of the driving operation A2 from the second driving layer 163, the driving operation A1 from the first driving layer 162 and the driving operation A2 from the second driving layer 163 cancel each other. Thus, the direction of magnetization M1 of the movable magnetic layer 161 is stabilized by the uniaxial magnetic anisotropy proper to the movable magnetic layer itself, thus maintaining its state (the state in which the direction of magnetization M1 of the movable magnetic layer 161 is oriented in the +x direction).

Figure 33B:
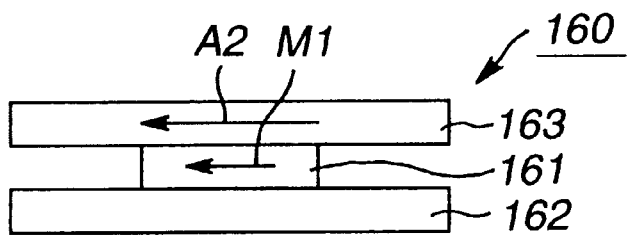

FIG. 33B shows the state in which the direction of magnetization M1 of the movable magnetic layer 161 is rewritten from the +x direction (rightward direction in the drawing) to the −x direction (leftward direction in the drawing). In this case, current is supplied from the first driving layer 162 to the movable magnetic layer 161, so that the driving operation A11 from the first driving layer 162 to the movable magnetic layer 161 ceases. On the other hand, no current is supplied to the electrically conductive layer constituting the second driving layer 163. Thus, the driving operation A2 from the second driving layer 163 acts on the movable magnetic layer 161.

The driving operation A2 acting from the second driving layer 163 to the movable magnetic layer 161 is designed to have a magnitude in excess of the coercivity of the movable magnetic layer 161. If the driving operation A2 from the second driving layer 163 is adapted to surpass the coercivity of the movable magnetic layer 161, the magnetization of the movable magnetic layer 161 is inverted from the +x direction (rightward direction in the drawing) to the −x direction (leftward direction in the drawing) when the driving operation A1 from the first driving layer 162 ceases to be effective, as shown in FIG. 33B, while the direction of magnetization M1 of the movable magnetic layer 161 is aligned with the direction of the driving operation A2 from the second driving layer 163.

Figure 33C:
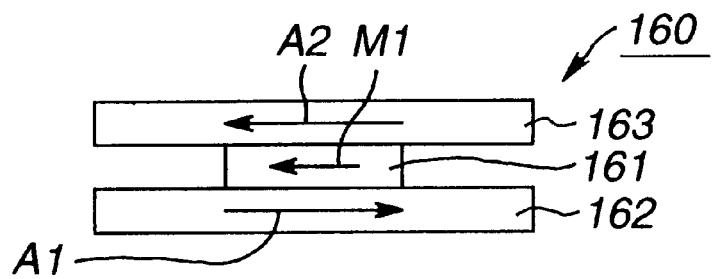

FIG. 33C shows the state in which the direction of magnetization M1 of the movable magnetic layer 161 is kept in the −x direction (rightward direction in the drawing). At this time, no current is supplied to the electrically conductive layer of the first driving layer 162 nor to the electrically conductive layer of the second driving layer 163. Therefore, both the driving operation A1 from the first driving layer 162 and the driving operation A2 from the second driving layer 163 operate on the movable magnetic layer 161. However, since the direction of the driving operation A1 from the first driving layer 162 is reversed from the direction of the driving operation A2 from the second driving layer 163, the driving operation A1 from the first driving layer 162 and the driving operation A2 from the second driving layer 163 cancel each other. Thus, the direction of magnetization M1 of the movable magnetic layer 161 is stabilized by the uniaxial magnetic anisotropy proper to the movable magnetic layer itself, thus maintaining its state (the state in which the direction of magnetization M1 of the movable magnetic layer 161 is oriented in the −x direction).

Figure 33D:
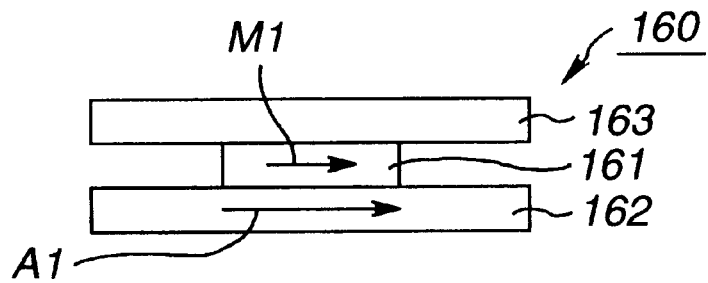

FIG. 33D shows the state in which the direction of magnetization M1 of the movable magnetic layer 161 is rewritten from the −x direction (leftward direction in the drawing) to the +x direction (rightward direction in the drawing). In this case, current is supplied to the electrically conductive layer of the second driving layer 163, so that the driving operation A2 from the second driving layer 163 to the movable magnetic layer 161 ceases. On the other hand, no current is supplied to the electrically conductive layer constituting the first driving layer 161. Thus, the driving operation A1 from the first driving layer 162 acts on the movable magnetic layer 161.

The driving operation A1 acting from the first driving layer 162 to the movable magnetic layer 161 is designed to have a magnitude in excess of the coercivity of the movable magnetic layer 161. If the driving operation A1 from the first driving layer 162 is adapted to surpass the coercivity of the movable magnetic layer 161, the magnetization of the movable magnetic layer 161 is inverted from the −x direction (leftward direction in the drawing) to the +x direction (rightward direction in the drawing) when the driving operation A2 from the second driving layer 163 ceases to be effective, as shown in FIG. 33D, while the direction of magnetization M1 of the movable magnetic layer 161 is aligned with the direction of the driving operation A1 from the first driving layer 162.

Thus, with the present information recording element 160, the direction of magnetization M1 of the movable magnetic layer 161 can be inverted by switching the on/off of current supply to the electrically conductive layer of the first driving layer 162 or the on/off of current supply to the electrically conductive layer of the second driving layer 163, thus enabling binary recording based on the direction of magnetization of the movable magnetic layer 161. Moreover, with the present information recording element 160, the direction of magnetization M1 of the movable magnetic layer 161 can be repeatedly inverted to enable repeated rewriting of the recorded information. Moreover, thee is no necessity in the information recording element 160 to supply the current to the electrically conductive layer of the first driving layer 162 or to the electrically conductive layer of the second driving layer 163 to maintain the direction of magnetization M1 of the movable magnetic layer 161. That is, the present information recording element 160 serves as a non-volatile memory.

With the information recording elements 140, 150, 160, described above, the movable magnetic layers 142, 152, 162 exhibiting uniaxial magnetic anisotropy are used to make binary recording. However, the movable magnetic layers 142, 152, 162 having three or more minimum anisotropic energy points with respect to the direction of magnetization can be used. If the movable magnetic layers 142, 152, 162 having three or more minimum anisotropic energy points with respect to the direction of magnetization are used, it is possible to make three-valued or higher multi-valued recording with a sole movable magnetic layer.

2-2-4 Variable Resistance Element

Figure 34:
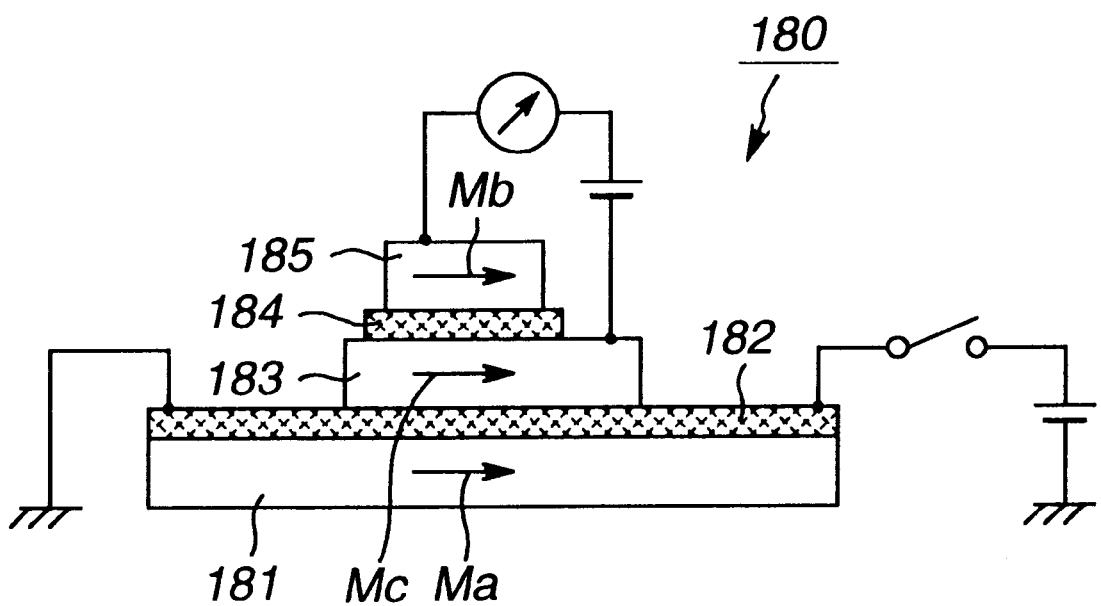
FIG. 34 shows an illustrative variable resistance element embodying the present invention.

FIG. 34 shows an example of a variable resistance element exploiting modulation of exchange interaction by the current.

A variable resistance element 180, shown in FIG. 34, is constructed similarly to the element of FIG. 30 (the element adapted to obtain the results of the switching operation of the direction of magnetization of the movable magnetic layer as an electrical output). Specifically, the variable resistance element 180 includes a first stationary magnetic layer 181, fixed in a pre-set direction of magnetization Ma, an electrically conductive layer 182, formed on the stationary magnetic layer 181, a movable magnetic layer 183, formed on the electrically conductive layer 182, a spacer layer 184 of a non-magnetic metal, formed on the movable magnetic layer 183, and a second stationary magnetic layer 185 of a magnetic metal, fixed in a pre-set direction of magnetization Mb.

In the variable resistance element 180, the current is caused to flow through the electrically conductive layer 182 to vary the magnetic coupling state between the first stationary magnetic layer 181 and the movable magnetic layer 183 to control the direction of magnetization Mc of the movable magnetic layer 183. As a material of the electrically conductive layer 182, such a material having a relatively moderate rate of change of the magnetic coupling state between the first stationary magnetic layer 181 and the movable magnetic layer 183 is preferably employed. By employing a material having a relatively moderate rate of change of the magnetic coupling state, the direction of magnetization of the movable magnetic layer 183 can be varied substantially steplessly by the current input to the electrically conductive layer 182.

For assuring relatively moderate rate of change of the magnetic coupling state with respect to the input current value, it is sufficient if such an electrically conductive layer 182 is of a structure comprised of a mixture of regions of the ferromagnetic composition and regions of the non-magnetic composition. With the above-described structure comprised of a three-dimensional mixture of regions of the ferromagnetic composition and regions of the non-magnetic composition, there exist a large number of magnetic coupling paths of different strengths, so that, by removing the paths in the order of the increasing strength, the magnetic coupling can be decreased gradually. Therefore, the direction of magnetization Mc of the movable magnetic layer 183 can be varied substantially steplessly by the current input to the electrically conductive layer 182 to provide an analog operation.

Also, with the present variable resistance element 180, the movable magnetic layer 183, spacer layer 184 and the second stationary magnetic layer 185 make up a spin valve, such that, if the direction of magnetization Mc of the movable magnetic layer 185 is varied, the electrical resistance of the path to the movable magnetic layer 183, spacer layer 184 and the second stationary magnetic layer 185 is changed by the spin valve operation of the spacer layer 184 and the second stationary magnetic layer 185.

That is, with the present variable resistance element 180, the current is caused to flow through the electrically conductive layer 182 to change the magnetic coupling state between the first stationary magnetic layer 181 and the movable magnetic layer 183 to control the direction of magnetization Mc of the movable magnetic layer 183. By controlling the direction of magnetization Mc of the movable magnetic layer 183, it is possible to control the electrical resistance of the path leading to the movable magnetic layer 183, spacer layer 184 and the second stationary magnetic layer 185.

If the variable resistance element 180 is of a circuit structure shown in FIG. 34, and the spin valve constituted by the movable magnetic layer 183, spacer layer 184 and the second stationary magnetic layer 185, the variable resistance element 180 may be used as an analog amplifier. That is, with the circuit configuration shown in FIG. 34, it is possible to provide an amplifying operation in which the impedance of a large current circuit on the output side is varied with a small current input to the electrically conductive layer 182.

By varying the magnetic coupling state between the magnetic layers to control the direction of magnetization of the magnetic layers, as explained in the foregoing in detail, it is possible to evade the problem of crosstalk generation accompanying the minuted design rule or the lowered coercivity in controlling the direction of magnetization of the magnetic layers. With the magnetic functional element, magnetic recording element and variable resistance element of the present invention, exploiting the magnetization controlling method, it is possible to evade the problem of the generation of crosstalk or the lowered coercivity despite progress in design rule minuting.

3. Third Embodiment

In a third aspect of the present invention, the exchange interaction propagated through the solid phase is exploited as means for achieving the targeted operation by designating an optional storage medium selected for writing or readout. A present embodiment of the magnetic storage device and the addressing method, arranged in this manner, is hereinafter explained.

3-1 Solid Magnetic Memory

The magnetic storage device according to the present invention is such a memory device having an array of plural split magnetic members, or a so-called solid magnetic memory. The direction of magnetization of the storage medium, as an element for storage, is controlled without reliance upon the application of an magnetic field from outside. Specifically, the direction of magnetization of the in the first aspect of the invention or the magnetization controlling method in the second aspect of the invention are applied to control the direction of magnetization of the storage carrier as an element taking charge of storage.

In the following explanation, a solid magnetic memory controlling the direction of magnetization of the storage carrier as an element taking charge of storage with the magnetic interaction in the solid phase (exchange interaction) as the driving force is taken as an example. Meanwhile, in the following explanation, this solid magnetic memory is termed an exchange coupling type solid magnetic memory.

The problem inherent in the conventional solid magnetic memory, that is the problem such as generation of crosstalk due to minuted design rule or lowered coercivity, is ascribable to the application of a magnetic field to the storage medium for writing. In the exchange coupling type solid magnetic memory, exploiting the exchange interaction to control the direction of magnetization of the storage carrier, it is possible to resolve the problem in the conventional solid magnetic memory.

Figure 35:
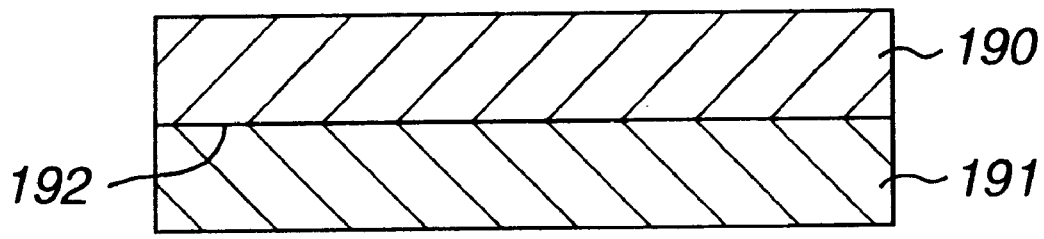
FIG. 35 shows the structure in which a pair of magnetic members are contacted with each other.
Figure 36:
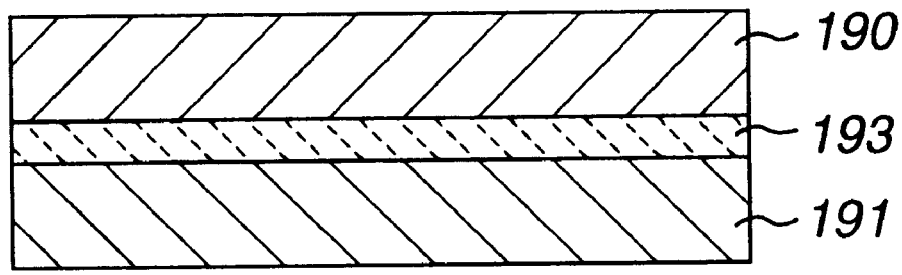
FIG. 36 shows the structure in which an intermediate layer is interposed between the paired magnetic members.

Meanwhile, the exchange interaction is the source of aligning the magnetic moment of the atoms in a sole direction in the interior of a ferromagnetic material. If a pair of magnetic members 190, 191 are contacted with each other as shown in FIG. 35, the exchange interaction operates through a contact interface 192. If the magnetic member 190 is not contacted directly with the magnetic member 191, as shown in FIG. 36, and an intermediate layer 193 is present between the magnetic members 190, 191, the exchange interaction between the magnetic members 190, 191 is occasionally propagated through the intermediate layer 193. If the intermediate layer 193 is a magnetic member, of course the layer 193 transmits the exchange interaction. However, if the intermediate layer 193 itself is a non-magnetic metal, such as Au, or a semiconductor, such as Si or Ge, the exchange interaction has been confirmed to be transmitted through the intermediate layer 193. The theory which accounts for the source of transmission of the exchange interaction, such as RKKY model, has also been proposed.

3-2 Example of Exchange Coupling Type Solid Magnetic Memory

Figure 37:
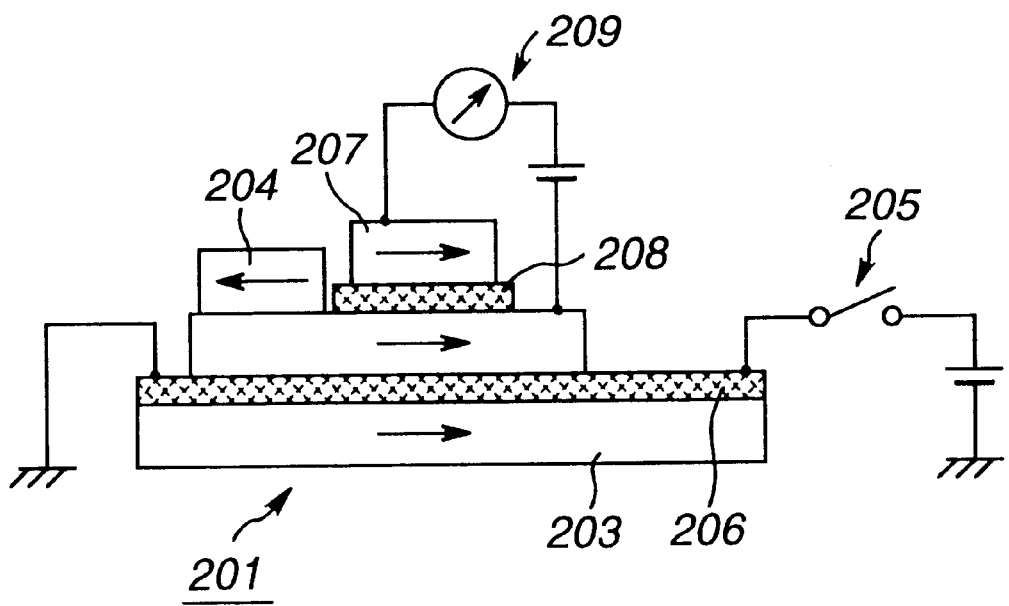
FIG. 37 shows an illustrative exchange coupling type solid magnetic memory.

FIG. 37 shows an example of an exchange coupling type solid magnetic memory 201. The exchange coupling type solid magnetic memory 201, shown in FIG. 37, is a write-once memory on which writing is possible only once by controlling the direction of magnetization of a storage carrier 202 formed of a magnetic material.

In this exchange coupling type solid magnetic memory 201, the storage carrier 202 is sandwiched between two stationary magnetic layers 203, 204 which give mutually opposite biases. The current supplied from an input circuit 205 to a coupling control layer 206 operates for cutting the bias applied by the stationary magnetic layer 203 to the storage carrier 202.

That is, if the input to the coupling control layer 206 is off such that no current is flowing in the coupling control layer 206, there is produced an exchange interaction between the stationary magnetic layer 203 and the storage carrier 202 such that the bias from the stationary magnetic layer 203 acts on the storage carrier 202. If there is the bias from the stationary magnetic layer 203, the bias from the stationary magnetic layer 203 and that from the stationary magnetic layer 204 cancel each other so that there operates no net driving power on the magnetization of the storage carrier 202.

On the other hand, if the input to the coupling control layer 206 is on, such that the current flows in the coupling control layer 206, the exchange interaction ceases to operate between the stationary magnetic layer 203 and the storage carrier 202 such that the bias acting from the stationary magnetic layer 203 on the storage carrier 202 ceases to operate. If the operation of bias from the stationary magnetic layer 203 ceases, inversion of magnetization is induced in the storage carrier 202 under the bias from the stationary magnetic layer 204.

In the embodiment of FIG. 37, readout of the direction of magnetization of the storage carrier 202 is achieved under the principle of the spin valve. The stationary magnetic layer 207 is separated by a non-magnetic intermediate layer 208 so as not to affect the magnetization of the storage carrier 202. The current supplied from an output circuit 209 to flow from the stationary magnetic layer 207 through the nonmagnetic intermediate layer 208 to the storage carrier 202 is larger or smaller if the direction of magnetization of the storage carrier 202 and the direction of magnetization of the stationary magnetic layer 207 is parallel or antiparallel, respectively, thus enabling detection of the direction of magnetization of the storage carrier 202.

Since the exchange coupling type solid magnetic memory 201 exploits the exchange interaction to control the magnetization of the storage carrier 202, it is possible to resolve the problem accompanying the writing by magnetic field utilization, such as generation of crosstalk accompanying the design rule minuting or lowered coercivity.

Figure 38:
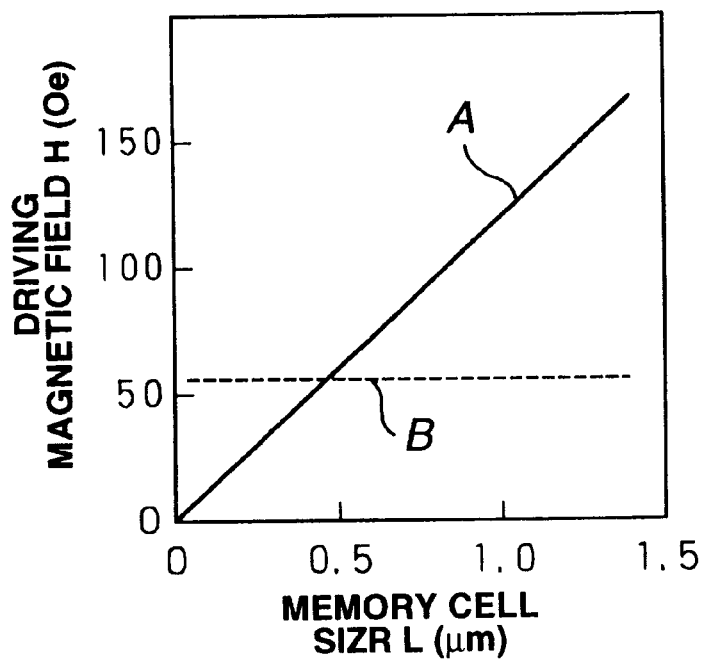
FIG. 38 shows the relation between the size L of a cell of the information recording element and a driving magnetic field H that can be used for driving a recording carrier.

FIG. 38 shows, for comparison, the relation between the size L of a unit storage portion of a solid magnetic memory, referred to hereinafter as a memory cell, and the driving magnetic field H that can be used for driving the storage carrier, for the case of a current magnetic field system exploiting the magnetic field induced on flowing the current through a conductor, that is a conventional solid magnetic memory shown in FIG. 2, and for the case of the exchange coupling system exploiting the exchange interaction in the solid phase, that is an exchange coupling type solid magnetic memory shown in FIG. 37. In FIG. 38, if a solid line A denotes the case of the current magnetic field system, a broken line B denotes the case of the exchange coupling system. Meanwhile, in the current magnetic field system, the diameter of the conductor is assumed to be 0.8 times the memory cell size L.

In the current magnetic field system, as shown in FIG. 38, the magnetic field that can be applied from the conductor becomes smaller as the memory cell size is reduced. On the other hand, since the exchange interaction is not dependent on the memory cell size L, the exchange coupling system is meritorious as the design rule is minuted.

The exchange interaction, calculated as the magnetic field, is not dependent n the memory cell size L. Thus, if the exchange interaction is utilized to control the magnetization of the storage carrier, it is possible to use a magnetic material of higher coercivity, even if design rule is progressively minuted. Specifically, as may be seen from FIG. 38, if the memory cell size L is extremely small, it is possible to use a magnetic member having coercivity in excess of tens of Oe as the storage carrier. By exploiting the storage carrier having a larger coercivity, the storage carrier can be used with high operational reliability for a portable type electronic equipment used under an environment subjected to a disturbing magnetic field from the ambient.

3-3 Addressing of Solid Magnetic Memory

The addressing function, indispensable for an integrated circuit element, is added to the above-described exchange coupling type solid magnetic memory.

In general, the writing process for a solid magnetic memory having plural memory cells is made up of the following series of operations. That is, a memory cell in which to write is selected by an arithmetic processing device exploiting the solid magnetic memory. The information which reads: "the magnetization of the storage carrier in a target memory cell is to be inverted" is sent from the arithmetic processing device to the solid magnetic memory. The target memory is among a number of memory cells in the solid magnetic memory. Then, based on the above information, the driving power of the inversion of magnetization is displayed to the recording carrier of the memory cell in question to cause inversion of magnetization of the storage carrier in question. This operation of selecting the specified memory cell to cause the specified operation to be performed on the selected memory cell is generally termed the addressing.

If, in the solid magnetic memory, in which the direction of magnetization of the storage carrier is controlled by an electrical input, the addressing function is to be achieved, it is sufficient to provide the wiring for transporting the electrical signals from the arithmetic processing device to the memory cell in question (so-called address line). That is, if the address line is provided for each memory cell, and electrical signals are sent to the address line associated with the memory cell in question, it is possible to select and actuate the specified memory cell.

However, if the address lines are provided for the respective memory cells, the result is the complex structure. If, with in vertical memory cells by n horizontal memory cells, for example, address lines are provided for the individual memory cells, m×n address lines are required, even if only one address line is provided for a sole memory cell. This complicates the structure to render it difficult to provide an integrated circuit element.

Figure 2:
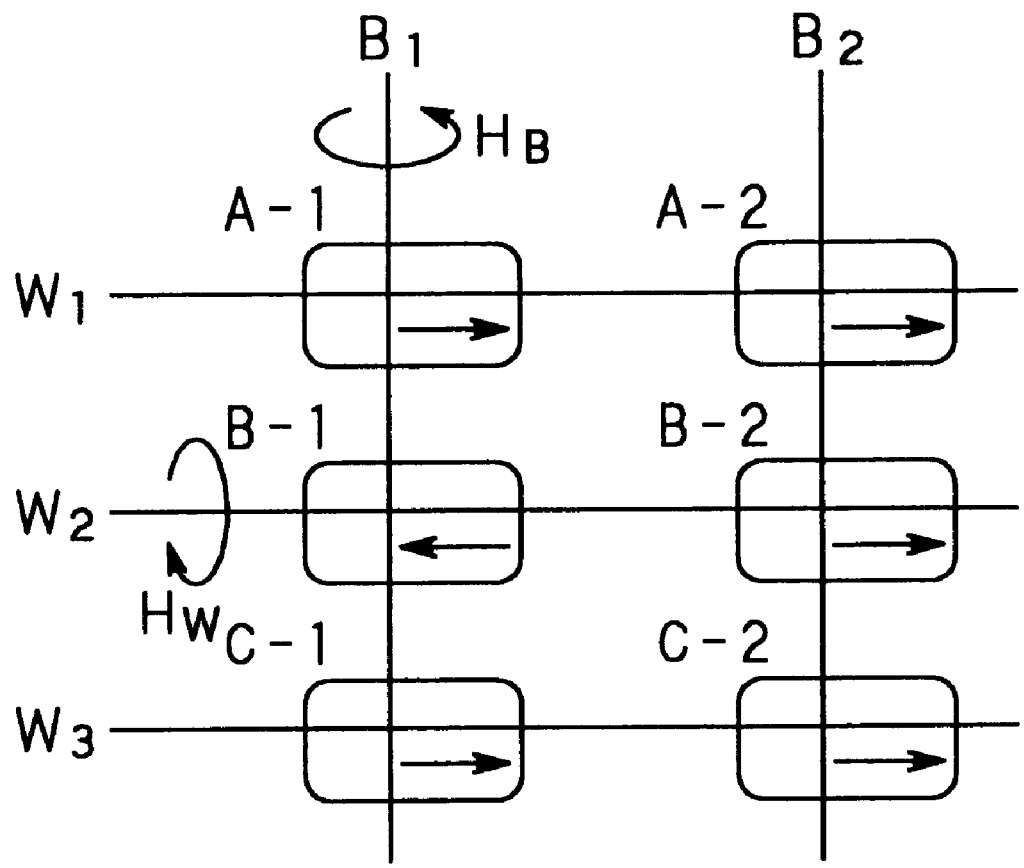
FIG. 2 illustrates an addressing method in a conventional solid magnetic memory.

On the other hand, with the conventional solid magnetic memory, shown in FIG. 2, the addressing function is realized by an simplified mechanism comprised of intersecting conductors. That is, with the conventional solid magnetic memory, shown in FIG. 2, it is possible to select and actuate a specified memory cell by simply providing m vertical conductors and n horizontal conductors for an array of the m vertical memory cells and n horizontal memory cells, totalling at n+m conductors.

In the following explanation, the addressing exploiting these intersecting conductors is termed the matrix type addressing. This matrix type addressing is particularly meritorious in constructing the integrated circuit element because an extremely small number of conductors suffices if the number of memory cells is increased, thus simplifying the structure.

In the conventional solid magnetic memory, shown in FIG. 2, inversion of magnetization of the storage carrier is realized by exploiting magnetic field superposition. Therefore, the matrix type addressing can be realized easily. However, in the exchange interaction type solid magnetic memory, matrix type addressing is difficult to realize since the magnetic field superposition is not used.

That is, if, in the previously proposed exchange interaction type solid magnetic memory, a specified memory cell is to be selected and actuated, there is required such a mechanism selecting the specified memory cell and supplying the current or the voltage to the selected cell. For this reason, in the previously proposed exchange interaction type solid magnetic memory, the matrix type addressing cannot be applied in a simple manner. In other words, if, in the previously proposed exchange interaction type solid magnetic memory, the matrix type addressing is to be applied at any rate, some technique other than simply connecting the address line and the memory cell is required. For example, it is necessary to interconnect a non-linear element, such as a diode, between the address line and the memory cell, or to annex selection transistors, such as those used in a semiconductor memory, to the memory cell. This, however, leads to complicated structure and hence is not desirable.

3-4 Exchange Coupling Type Solid Magnetic Memory Having the Addressing Function

If, in realization of the matrix type addressing in the exchange coupling type solid magnetic memory, non-linear devices or selection transistors are used, the structure is undesirably complicated. Thus, according to the present invention, the matrix type addressing is realized in the exchange coupling type solid magnetic memory without using non-linear devices or selection transistors. The basic structure of an example of the exchange coupling type solid magnetic memory of the present invention is hereinafter explained.

3-4-1 Entire Structure

First, the exchange coupling type solid magnetic memory is provided with plural linear members, that is elongated or strip-shaped members. These linear members are endowed with the function of signal transmission lines for specifying particular memory cells and the function of controlling the direction of magnetization of the storage carriers in the memory cells. In the following explanation, these linear members are termed driving lines.

More specifically, if, for example, the two mutually perpendicular directions are termed the x-direction and the y-direction, plural driving lines, arrayed subsequently parallel to the x-direction, are provided as driving lines (referred to hereinafter as x-direction driving lines), while plural driving lines, arrayed subsequently parallel to the y-direction, are provided as driving lines (referred to hereinafter as y-direction driving lines), and storage carriers are arranged at lattice points corresponding to the points of intersection of the x-direction driving lines and y-direction driving lines.

Similarly to the word and bit lines in the conventional solid magnetic memory shown in FIG. 2, these driving lines perform the operation of varying the direction of magnetization of all of the storage carriers arrayed along the driving lines. Since the present embodiment is directed to the exchange coupling type solid magnetic memory, the exchange interaction is utilized as the operation of varying the direction of magnetization of the storage carriers. In the following explanation, the operation of orienting the direction of magnetization of a storage carrier to a given orientation is termed a driving operation.

3-4-2 Principle of Matrix Type Addressing

The matrix type addressing in the exchange coupling type solid magnetic memory, achieved by combining the driving lines as described above, is hereinafter explained.

3-4-2-1 Structure of Memory Cell

Figure 39:
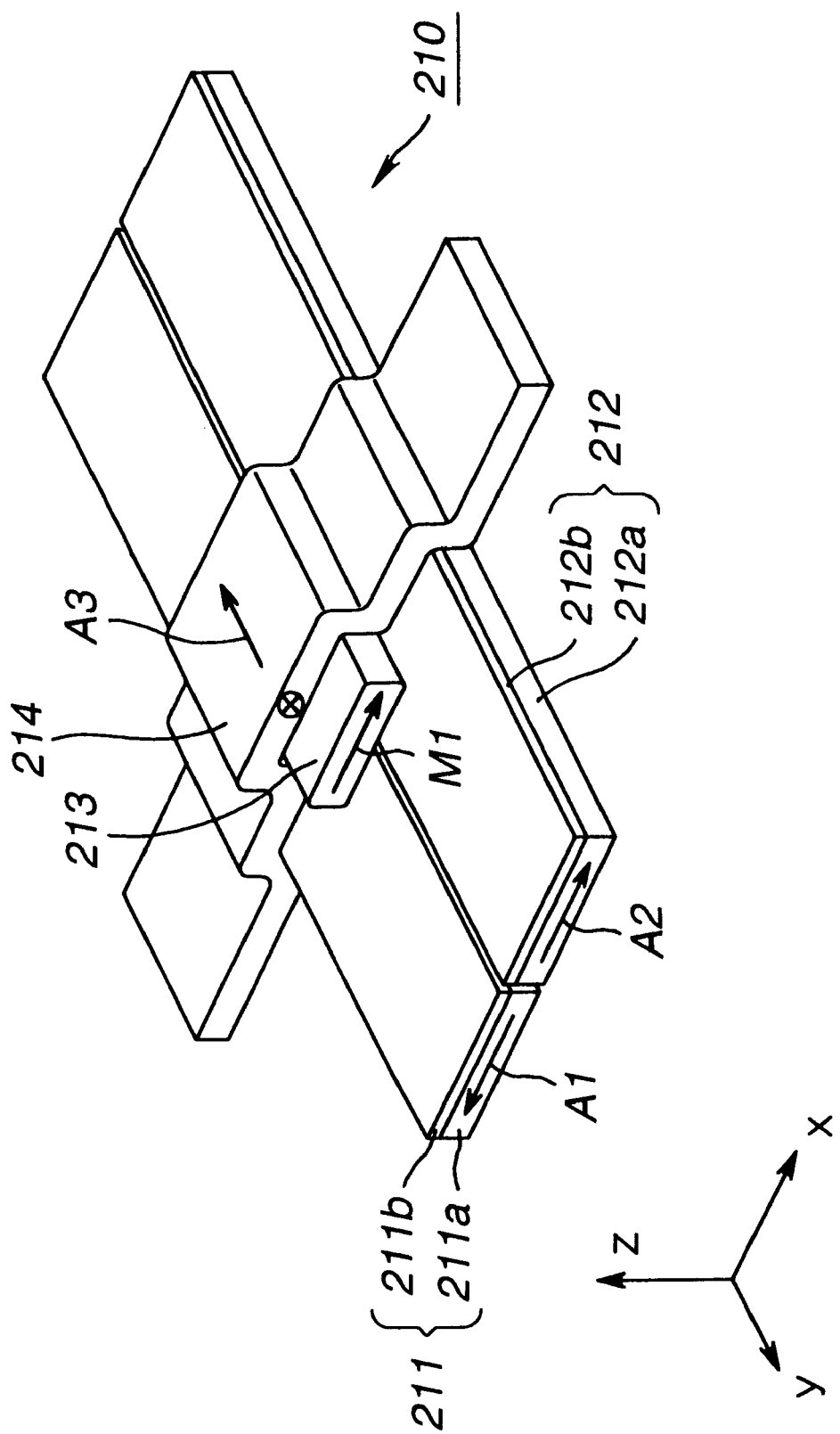
FIG. 39 is an enlarged view of a memory cell of an illustrative exchange coupling type solid magnetic memory.

The memory cells of the exchange coupling type solid magnetic memory for matrix type addressing are explained with reference to FIGS. 39 and 40A to 40E. FIG. 39 shows only a sole memory cell, while FIGS. 40A to 40E illustrate the driving principle.

Referring to FIG. 39, a memory cell 210 is made up of first y-direction driving lines 211 and second y-direction driving lines 212, an x-direction driving line 214 arrayed at right angles with the first and second y-direction driving lines 211, 212, and a storage carrier 213 arranged between the first and second y-direction driving lines 211, 212 and the x-direction driving line 214. The storage carrier 213 is adapted to be influenced by the first and second y-direction driving lines 211,212 and the x-direction driving line 214. That is, the storage carrier 213 is adapted to be influenced by three routes of driving sources.

In this memory cell 210, the first y-direction driving line 211 is a layered assembly made up of a first stationary magnetic layer 211a, magnetized to a pre-set orientation, and a first conductor layer 211b, each being of an elongated strip shape. The second y-direction driving line 212 is a layered assembly made up of a second stationary magnetic layer 212a, magnetized to an orientation opposite to that of the first stationary magnetic layer 211a, and a second conductor layer 212b, each being of an elongated strip shape. The storage carrier 213 is formed to overlie a portion of the first y-direction driving line 211 and a portion of the second y-direction driving line 212 so as to face the stationary magnetic layers 211a, 212a via the conductor layers 211b, 212b.

Although not shown in FIG. 39, an insulating layer is preferably formed between the first electrically conductive layer 211b and the storage carrier 213, between the second electrically conductive layer 212b and the storage carrier 213 or between the storage carrier 213 and the x-direction driving line 214, especially if the storage carrier 213 is of low electrical resistance.

In this memory cell 210, the first y-direction driving line 211 operates as a driving source for applying the driving operation A1 on the storage carrier 213 for setting the direction of magnetization of the storage carrier 213 to a pre-set orientation. Similarly, the second y-direction driving line 212 operates as a driving source for applying the driving operation A2 on the storage carrier 213 for setting the direction of magnetization of the storage carrier 213 to a pre-set orientation. Meanwhile, in FIGS. 39 and 40A to 40E, the direction of the arrow A1 denotes the direction of the driving operation from the first y-direction driving line 211 to the storage carrier 213, while the direction of the arrow A2 denotes the direction of the driving operation from the first y-direction driving line 211 to the storage carrier 213.

That is, the first stationary magnetic layer 211a, constituting the first y-direction driving line 211, is magnetized to the -x direction, while the driving operation A1 from the first y-direction driving line 211 to the storage carrier 213 operates for orienting the direction of magnetization M1 of the storage carrier 213 to the -x direction. On the other hand, the second stationary magnetic layer 212a, constituting the second y-direction driving line 212, is magnetized to the +x direction, while the driving operation A2 from the second y-direction driving line 212 to the storage carrier 213 operates for orienting the direction of magnetization M1 of the storage carrier 213 to the +x direction.

The storage carrier 213, arranged to overlie a portion of the first y-direction driving line 211 and a portion of the second y-direction driving line 212, is formed of a magnetic material exhibiting uniaxial magnetic anisotropy, with the x-direction being the easy axis. With the present memory cell 210, binary recording can be made depending on the direction of magnetization of the storage carrier 213.

On the other hand, the x-direction driving line 214 is formed of an electrically conductive material and is formed in an elongated strip shape, with its longitudinal direction as the x-direction, so as to overlie the storage carrier 213. With the present memory cell 210, the magnetic field is generated by causing the current to flow through the x-direction driving line 214 and is applied to the storage carrier 213. Meanwhile, in FIGS. 39, 40C and 40E, A3 denotes the magnetic field generated when the current is caused to flow in the x-direction driving line 214.

Meanwhile, the magnitude of the magnetic field required to induce inversion of magnetization in a magnetic material depends on the direction of application of the magnetic field, as discussed in connection with the conventional solid magnetic memory shown in FIG. 2. In general, inversion of magnetization can be induced with a smaller strength of the magnetic field if the magnetic field is applied in a direction inclined approximately 45° from the easy axis than if the magnetic field is applied parallel to the easy axis.

Thus, in the present memory cell 210, inversion of magnetization is adapted to be not induced in the storage carrier 213 if there is only the driving operation A1 from the first y-direction driving line 211 or only the driving operation A2 from the second y-direction driving line 212. On the other hand, inversion of magnetization is adapted to be induced in the storage carrier 213 if there are both the driving operation A1 from the first y-direction driving line 211 and the operation by the magnetic field A3 generated on flowing the current in the x-direction driving line 214, or if there are both the driving operation A2 from the second y-direction driving line 212 and the operation by the magnetic field A3 generated on flowing the current in the x-direction driving line 214. That is, with the present memory cell, the direction of magnetization M1 of the storage carrier 213 is controlled by controlling the current flowing in the second electrically conductive layer 211b of the first y-direction driving line 211, the current flowing through the second electrically conductive layer 212b of the second y-direction driving line 212 and the current flowing in the x-direction driving line 214, so that binary recording can be made based on the direction of magnetization of the storage carrier 213.

3-4-2-2 Driving Principle of Memory Cell

Referring to FIGS. 40A to 40E, the driving principle of the memory cell 210 is explained in detail.

Figure 40A:
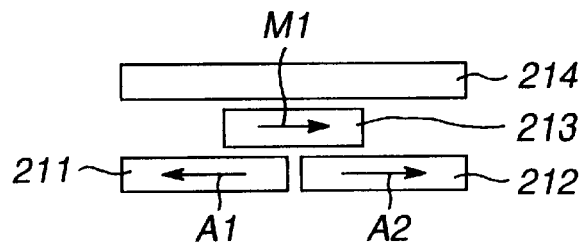

FIG. 40A shows the state in which the direction of magnetization of the storage carrier 213 is maintained in the +x direction (rightward in the drawing) without the current being supplied to the x-direction driving line 214, to the second electrically conductive layer 211b of the second y-direction driving line 212 nor to the second electrically conductive layer 212b of the second y-direction driving line 212. Since no current is being supplied at this time to the x-direction driving line 214, to the second electrically conductive layer 211b of the second y-direction driving line 212 nor to the second electrically conductive layer 212b of the second y-direction driving line 212, there act both the driving operation A1 from the first y-direction driving line 211 and the driving operation A2 from the second y-direction driving line 212 on the storage carrier 213. However, since the direction of the driving operation A1 from the first y-direction driving line 211 is opposite to that of the driving operation A2 from the second y-direction driving line 212, the driving operation A1 from the first y-direction driving line 211 and the driving operation A2 from the second y-direction driving line 212 cancel each other, so that the direction of magnetization M1 of the storage carrier 213 is stabilized by the uniaxial magnetic anisotropy of the storage carrier itself to maintain its current state, that is the state in which the direction of magnetization of the storage carrier 213 is oriented in the +x direction.

Figure 40B:
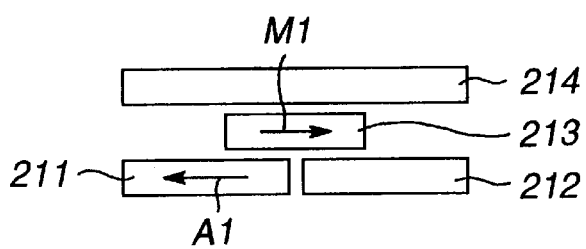

FIG. 40B shows the state in which the current is supplied only to the second electrically conductive layer 212b of the second y-direction driving line 212 when the direction of magnetization M1 of the storage carrier 213 is the +x direction (rightward direction in the drawing) and the current is supplied only to the second electrically conductive layer 211b of the first y-direction driving line 211, without the current being supplied to the x-direction driving line 214 not to the first electrically conductive layer 211b of the first y-direction driving line 211. At this time, the driving operation A2 from the second y-direction driving line 212 to the storage carrier 213 is not effective. On the other hand, the driving operation A1 from the first y-direction driving line 211 is effective, since no current is supplied to the electrically conductive layer 211b of the first y-direction driving line 211. The driving operation A1 acting from the first y-direction driving line 211 on the storage carrier 213 is adapted not to surpass the coercivity of the storage carrier 213. If the driving operation A1 from the first y-direction driving line 211 is adapted not to surpass the coercivity of the storage carrier 213, the direction of magnetization M1 of the storage carrier 213 is maintained in the +x direction (rightward direction in the drawing), if the driving operation A2 from the second y-direction driving line 212 ceases to be effective, as shown in FIG. 40B.

Figure 40C:
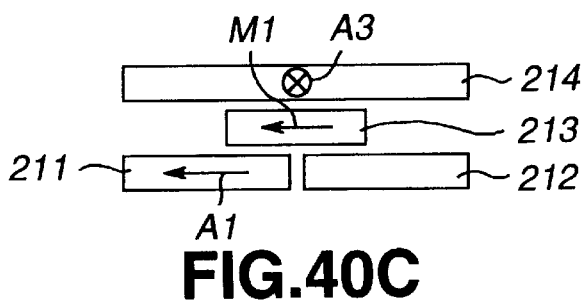

FIG. 40C shows the state in which, with the direction of magnetization M1 of the storage carrier 213 in the +x direction, that is rightward direction in the drawing, the current is supplied to the x-direction driving line 214 and to the second electrically conductive layer 212b of the second y-direction driving line 212, with the current not being supplied to the first electrically conductive layer 211b of the first y-direction driving line 211. At this time, the driving operation A2 from the second y-direction driving line 212 to the storage carrier 213 ceases to be effective. On the other hand, since no current is being supplied to the electrically conductive layer 211b of the first y-direction driving line 211, the driving operation A1 from the first y-direction driving line 211 acts on the storage carrier 213. Since the current is supplied to the x-direction driving line 214, the magnetic field A3 in the y-direction, induced on flowing the current in the x-direction driving line 214, acts on the storage carrier 213.

The vector of the combined operation of the driving operation A1 from the first y-direction driving line 211 and the operation by the magnetic field A3 induced on flowing the current through the x-direction driving line 214 is oriented in a direction offset from the easy axis of the storage carrier 213, so that the inversion of magnetization can be induced on the storage carrier 213 with a magnetic field strength smaller than the action operating parallel to the easy axis. The storage carrier 213 is adapted to undergo inversion of magnetization in the presence of both the driving operation A1 from the first y-direction driving line 211 and the operation by the magnetic field A3 induced on flowing the current through the x-direction driving line 214. The result is that, as shown in FIG. 40C, the direction of magnetization M1 of the storage carrier 213 is inverted from the +x direction (rightward direction in the drawing) to the −x direction (leftward direction in the drawing), as shown in FIG. 40C, with the direction of magnetization M1 of the storage carrier 213 being aligned with the direction of the driving operation A1 from the first y-direction driving line 211.

If then the current supply to the x-direction driving line 214 and to the second electrically conductive layer 212b is halted, the direction of magnetization M1 of the storage carrier 213, inverted to the −x direction, is retained. If the current supply to the x-direction driving line 214 and to the second electrically conductive layer 212b is halted, both the driving operation A1 from the first y-direction driving line 211 and the driving operation A2 from the second y-direction driving line 212 are effective. However, since the direction of the driving operation A1 from the first y-direction driving line 211 is opposite to that of the driving operation A2 from the second y-direction driving line 212, these driving actions A1 and A2 cancel each other. Therefore, the direction of magnetization M1 of the storage carrier 213 is stabilized by the uniaxial magnetic anisotropy proper to the storage carrier itself so that the current state (the state in which the direction of magnetization of the storage carrier 213 is in the −x direction) is retained.

Figure 40D:
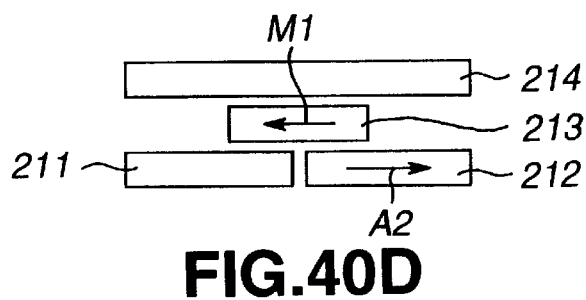

FIG. 40D shows the state in which, with the direction of magnetization M1 of the storage carrier 213 in the −x direction, that is leftward direction in the drawing, the current is supplied only to the first electrically conductive layer 211b of the first y-direction driving line 211, with the current not being supplied to the x-direction driving line 214 nor to the second electrically conductive layer 212b of the second y-direction driving line 212. At this time, the driving operation A1 from the first y-direction driving line 211 to the storage carrier 213 ceases to be effective. On the other hand, since no current is being supplied to the electrically conductive layer 212b of the second y-direction driving line 212, the driving operation A2 from the second y-direction driving line 212 acts on the storage carrier 213. The driving operation A2 from the second y-direction driving line 212 to the storage carrier 213 is adapted not to surpass the coercivity of the storage carrier 213. If the driving operation A2 from the second y-direction driving line 212 to the storage carrier 213 is adapted not to surpass the coercivity of the storage carrier 213, the direction of magnetization M1 of the storage carrier 213 is maintained in the −x direction (leftward direction in the drawing), even if the driving operation A1 from the first y-direction driving line 211 ceases to be effective, as shown in FIG. 40D.

Figure 40E:
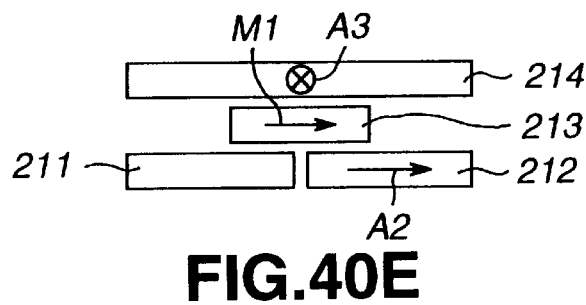

FIG. 40E shows the state in which, with the direction of magnetization M1 of the storage carrier 213 in the −x direction, that is leftward direction in the drawing, the current is supplied to the x-direction driving line 214 and to the first electrically conductive layer 211b of the first y-direction driving line 211, with the current not being supplied to the second electrically conductive layer 212b of the second y-direction driving line 212. At this time, the driving operation A1 from the first y-direction driving line 211 to the storage carrier 213 ceases to be effective. On the other hand, since no current is being supplied to the electrically conductive layer 212b of the second y-direction driving line 212, the driving operation A2 from the second y-direction driving line 212 acts on the storage carrier 213. Since the current is supplied to the x-direction driving line 214, the magnetic field A3 in the y-direction, induced on flowing the current in the x-direction driving line 214, acts on the storage carrier 213.

The vector of the combined operation of the driving operation A2 from the second y-direction driving line 212 and the operation by the magnetic field A3 induced on flowing the current through the x-direction driving line 214 is oriented in a direction offset from the easy axis of the storage carrier 213, so that the inversion of magnetization can be induced on the storage carrier 213 with a magnetic field strength smaller than the action operating parallel to the easy axis. The storage carrier 213 is adapted to undergo inversion of magnetization in the presence of both the driving operation A2 from the second y-direction driving line 212 and the operation by the magnetic field A3 induced on flowing the current through the x-direction driving line 214. The result is that, as shown in FIG. 40E, the direction of magnetization M1 of the storage carrier 213 is inverted from the −x direction (leftward direction in the drawing) to the +x direction (rightward direction in the drawing), as shown in FIG. 40E, with the direction of magnetization M1 of the storage carrier 213 being aligned with the direction of the driving operation A2 from the second y-direction driving line 212.

If then the current supply to the x-direction driving line 214 and to the first electrically conductive layer 211b is halted, the direction of magnetization M1 of the storage carrier 213, inverted to the +x direction, is retained. If the current supply to the x-direction driving line 214 and to the first electrically conductive layer 211b is halted, both the driving operation A1 from the first y-direction driving line 211 and the driving operation A2 from the first y-direction driving line 211 are effective. However, the direction of the driving operation A1 from the first y-direction driving line 211 is opposite to that of the driving operation A2 from the second y-direction driving line 212, these driving actions A1 and A2 cancel each other. Therefore, the direction of magnetization M1 of the storage carrier 213 is stabilized by the uniaxial magnetic anisotropy proper to the storage carrier itself so that the current state (the state in which the direction of magnetization of the storage carrier 213 is in the +x direction) is retained.

With the present memory cell 210, as described above, the direction of magnetization M1 of the storage carrier 231 can be inverted by switching the on/off states of current supply to the first electrically conductive layer 211b of the first y-direction driving line 211, to the second electrically conductive 212b of the second y-direction driving line 212 or to the x-direction driving line 214 to enable binary recording based on the direction of magnetization of the storage carrier 213.

Moreover, with the present memory cell 210, the direction of magnetization M1 of the storage carrier 213 can be repeatedly inverted to enable repeated rewriting of the recorded information. In addition, there is no necessity in the present memory cell 210 to supply the current to the first electrically conductive layer 211b, to the second electrically conductive layer 212b or to the x-direction driving line 214 to maintain the direction of magnetization M1 of the storage carrier 213. That is, the present memory cell serves as a non-volatile memory.

3-4-2-3 Matrix Type Addressing

In the above-described memory cell 210, the first y-direction driving line 211, the second y-direction driving line 212 and the x-direction driving line 214 serve as a driving source for inverting the direction of magnetization M1 of the storage carrier 213. It should be noted that the sole driving source is not sufficient to induce the inversion of magnetization and the inversion of magnetization is induced in the storage carrier 213 when both the driving sources are turned on. Therefore, if plural elongated y-direction driving lines 211,212 and plural elongated x-direction driving lines 214 are arranged in a matrix configuration on a substrate and memory cells 210 shown in FIG. 39 are arranged at the points of intersection of these driving lines, there is provided a magnetic storage device made up of a larger number of memory cells 210 in the matrix configuration.

That is, by arranging the first y-direction driving lines 211 and the second y-direction driving lines 212 so as to be parallel to one another, arranging plural x-direction driving lines 214 at right angles with the first and second y-direction driving lines 211, 212 and by arranging plural storage carriers 213 at the points of intersection of the first and second y-direction driving lines 211, 212 and the x-direction driving lines 214, there may be provided an exchange coupling type solid magnetic memory having an addressing function and which is able to select and write optional memory cells, that is an exchange coupling type solid magnetic memory having the matrix type addressing function, by a simple matrix array similar to the conventional solid magnetic memory shown in FIG. 2.

Specifically, a plurality of first y-direction driving lines 211A, 211B, . . . and a plurality of second y-direction driving lines 212A, 212B are arranged parallel to the y-direction with the first y-direction driving lines and the second y-direction driving lines extending parallel to one another. That is, a combination 221A of the first y-direction driving line 211A and the second y-direction driving line 212A, a combination 221B of the first y-direction driving line 211B and the second y-direction driving line 212B, . . . are arranged parallel to one another in the y-direction. Also, a plurality of x-direction driving line 214A, 214B, 214C, . . . are arranged parallel to the x-direction, and a number of storage carriers 213A-1,213A-2, . . . , 213B-1,213B-2, . . . , 213C-1, 213C-2, . . . are arrayed at the intersection points.

Figure 41:
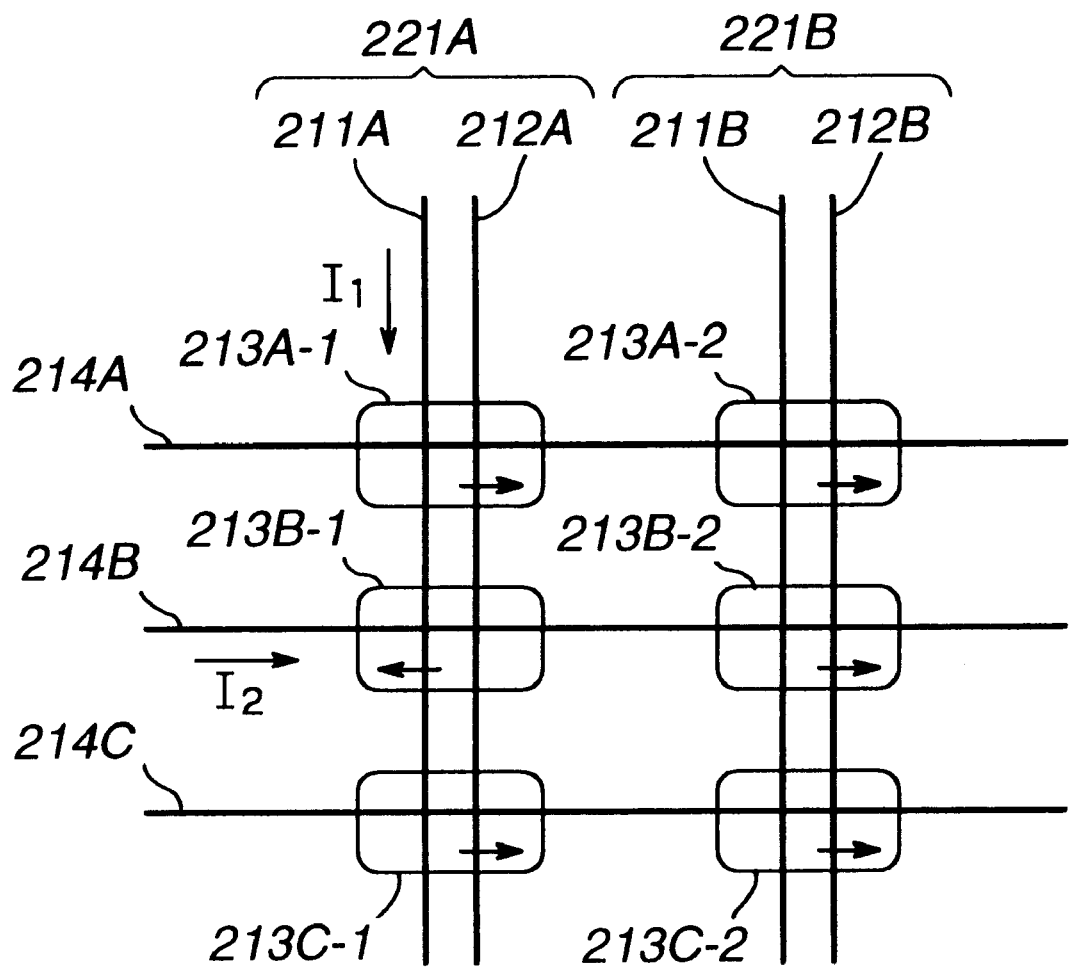
FIG. 41 illustrates the addressing method in the exchange coupling type solid magnetic memory embodying the present invention.
Figure 42:
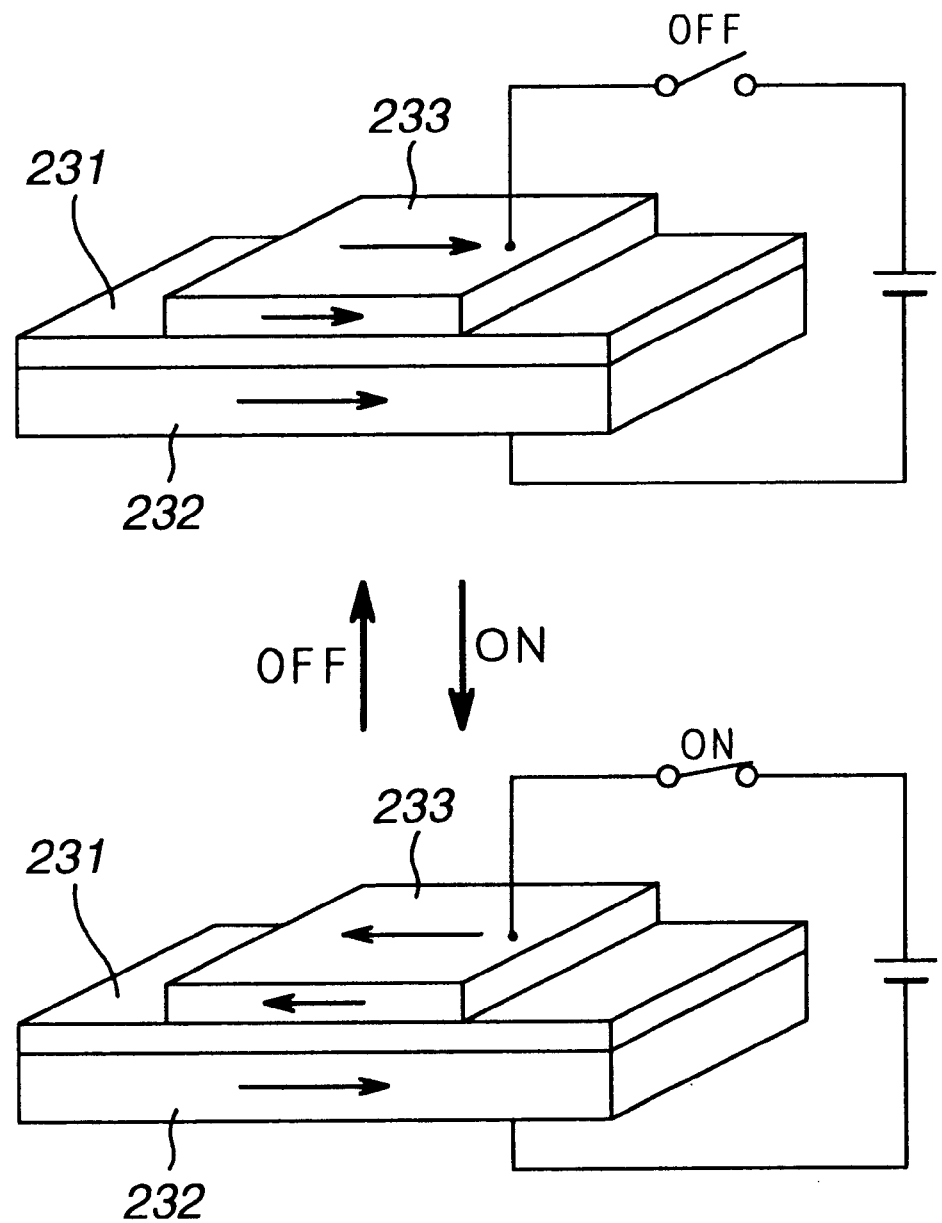
FIG. 42 shows the state of magnetic driving via a semiconductor layer with the use of the semiconductor layer as a coupling control layer.
Figure 43:
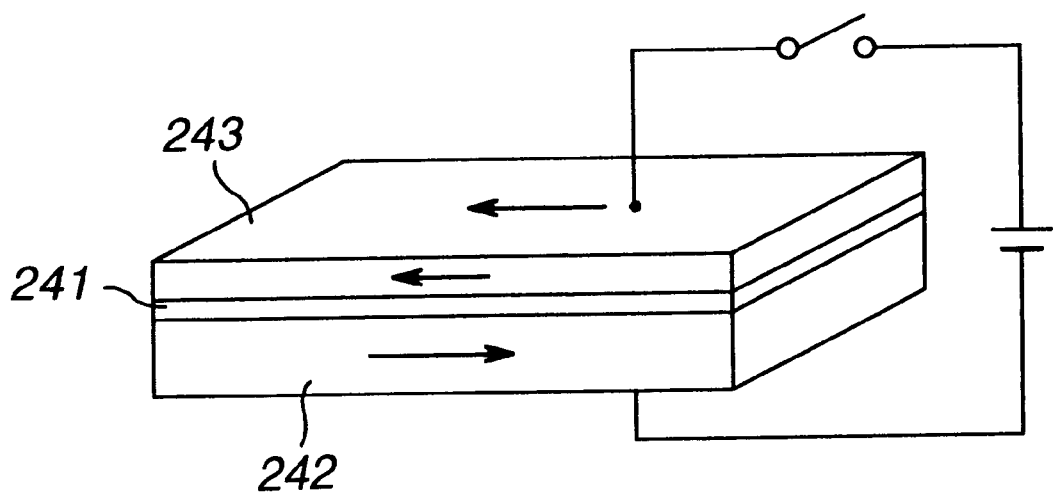
FIG. 43 shows the state of magnetic driving via a dielectric layer with the use of the dielectric layer as a coupling control layer.

If the sole y-direction driving line 211A and the sole x-direction driving line 214B are selected and fed simultaneously with suitable currents I1, I2, respectively, inversion of magnetization occurs only at the storage carrier 213B-1 at the point of intersection of these two driving lines. At this time, the y-direction driving line 211A and the x-direction driving line 214B, both fed with the current, apply the driving operation on the plural storage carriers arranged thereon. However, the driving operation from one of the y-direction driving line 211A or the x-direction driving line 214B is insufficient to induce the inversion of magnetization. The driving operation produced on flowing the current through the y-direction driving line 211A and that produced on flowing the current through the x-direction driving line 211B are synthesized such that it is only when the driving action on the storage carrier 213 is at a 45° direction relative to the easy axis that the inversion of magnetization is induced. In the example of FIG. 41, the inversion of magnetization occurs only in the storage carrier 213B-1.

By realizing the matrix type addressing in the exchange coupling type solid magnetic memory as described above, it is possible to write an optional memory cell, by a simplified structure similar to that of the conventional solid magnetic memory shown in FIG. 2, without annexing the non-linear elements or selection transistors to the individual solid magnetic memories.

In the above-described exchange coupling type solid magnetic memory, there is no necessity of using non-linear elements or selection transistors, even if the matrix type addressing is used. That is, the exchange coupling type solid magnetic memory can be constructed from metal materials and insulating materials, while it is unnecessary to use semiconductors sensitive to pollution. If the memory is constructed from metal materials and insulating materials, the manufacturing process can be simplified significantly by not using semiconductors sensitive to pollution.

3-5 Specified Embodiment of Exchange Coupling Type Solid Magnetic Memory Having the Addressing Function 3-5-1 Entire Structure As a storage carrier, an array of plural thin magnetic films formed on a substrate is used. As transmission routes for selecting individual storage carriers and for transmitting the operation of writing on the sole storage carrier from outside the exchange coupling type solid magnetic memory by way of addressing, a plurality of driving lines are arranged on the substrate. For achieving effective addressing with as small a number of driving lines as possible, a plurality of sets of driving lines, such as sets of driving lines extending in the x-direction and those extending in the y-direction, are provided, and storage carriers are arranged at the lattice points corresponding to the points of intersection of the respective sets.

3-5-2 Mechanism of Usable Exchange Coupling

The mechanism that induce the exchange interaction of transmitting the driving power from the driving lines to the storage carrier has a variety of sources, as discussed below, while there are a variety of input systems suitable for controlling the magnitude of the exchange interaction from outside.

3-5-2-1 Magnetic Coupling via Semiconductor Layer

The carriers in the semiconductor contacted with a magnetic member have spin density distribution attenuated in a vibrating manner with the distance from the magnetic member to induce magnetic interaction (RKKY interaction) with respect to other magnetic ions or magnetic members lying at a distance of the polarization (deviation of mean carrier spin from zero). By this interaction, there results the exchange coupling between two magnetic layers divided by a semiconductor layer.

The period of vibrations accompanying the magnitude or distance of the magnetic interaction depend on the carrier density. Also, the carrier density of the semiconductor can be varied by electrical stimuli (voltage application or current supply) or external stimuli such as light illumination. Thus, the magnetic coupling between the upper and lower magnetic layers can be changed by applying external stimuli to the semiconductor layer. Thus, by arranging a thin film of a magnetic metal 232, having a fixed direction of magnetization, and a thin film of a magnetic metal 233, having a variable direction of magnetization, with a semiconductor layer 231 in-between, and by switching the voltage on/off, it is possible to generate a driving power that is able to invert the magnetization vector of the thin film of a magnetic metal 233.

In particular, in the magnetic coupling mediated by the semiconductor layer, not only the strength but also the sign of magnetic coupling is liable to be changed owing to the vibratory nature of the spin density distribution. That is, in the case of the magnetic coupling mediated by the semiconductor layer, there is a possibility of controlling whether the magnetization of the upper and lower magnetic layers are liable to be aligned in the parallel direction, that is ferromagnetically, or in the antiparallel direction, that is anti-ferromagnetically, by external stimuli applied to the semiconductor layer. If the driving line that is able to invert the driving direction is used, the function of two driving lines (first y-direction driving line 211 and the second y-direction driving line 212) in the memory cell shown in FIG. 39 can be realized by a sole driving line. Therefore, if there are m and n memory cells in the vertical direction and in the horizontal direction, respectively, the matrix type addressing can be realized by solely m+n driving lines, as in the case of the conventional solid magnetic memory shown in FIG. 2.

3-5-2-2 Magnetic Coupling Mediated by Dielectric Layer

The exchange coupling can be established between magnetic layers via a dielectric layer. In this case, the exchange coupling between the magnetic layers is mediated by tunnel electrons interconnecting the two layers. Thus, by arranging a thin film of a magnetic metal 242, having a fixed direction of magnetization, and a thin film of a magnetic metal 243, having a variable direction of magnetization, with a dielectric layer 241 in-between, and by applying a voltage from the thin films of magnetic metal 242, 243 or a separate electrode to change the potential distribution of the layered structure, the tunnel possibility of electrons transmitted through the dielectric layer 241 is changed, thus changing the exchange coupling between the thin films of magnetic metal 242, 243. This can be used as the driving power for inverting the direction of magnetization.

Figure 44:
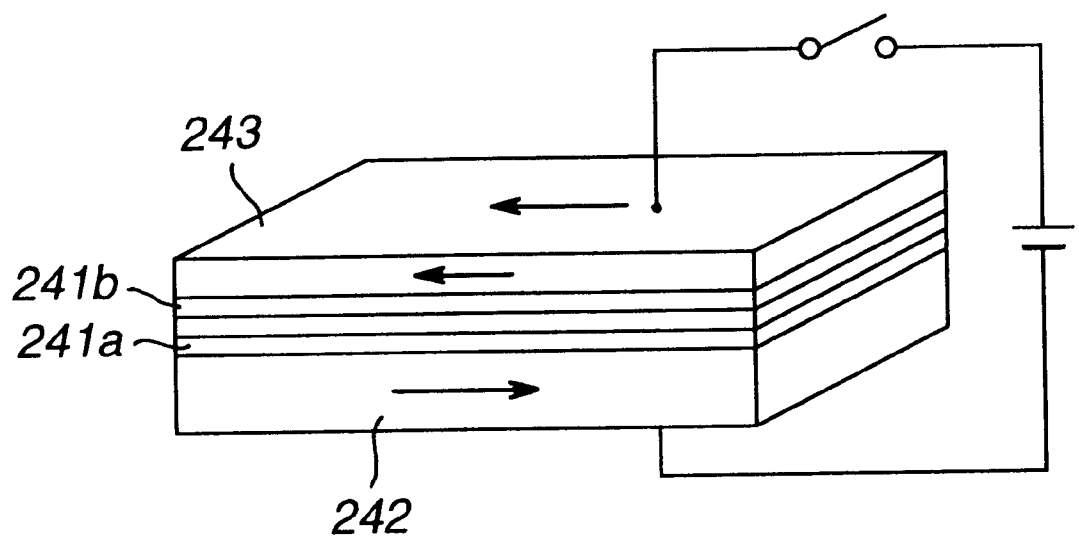
FIG. 44 shows the state of magnetic driving via a plurality of dielectric layers with the use of the dielectric layers as a coupling control layer.

Meanwhile, if the plural dielectric layers 241a, 241b are formed as shown in FIG. 44, there is realized a structure having plural potential barriers. The possibility of the electrons being transmitted through a structure having plural potential barriers shows a significant local maximum value if the electrons have an energy of being resonantly transmitted through a potential well provided between the barriers. If the potential distribution of the electron energy or structure is varied between the resonance and the non-resonance, significant changes in the tunnel possibility can be induced by a relatively small external stimulus, as a result of which significant changes can be produced in the exchange coupling by the tunnel electrons.

3-5-2-3 Coupling mediated by Electrically Conductive Layer

The RKKY interaction is observed in an electrically conductive layer formed of non-magnetic metal, whereby magnetic coupling can be realized between the magnetic layers. However, an electrically conductive material has many carriers and short relaxation time and hence it is difficult to vary the number of carriers by the external stimuli as in the case of using a semiconductor and hence to modulate the magnetic coupling. However, by using a contrivance in the material structure, it is possible to modulate the magnetic coupling.

For example, the magnetic coupling between the magnetic layers can be removed by arranging a coupling control layer formed by Cr/Fe—Ag layered films between the magnetic layers and by supplying the current to the coupling control layer. The structure shown in FIG. 37 corresponds to an example of exploiting this principle. This corresponds to the case of using an electrically conductive material and the case of exploiting the composite material explained in 3-5-2-4. This current-controlled system has a merit that the operating speed is not limited by the electrical capacity, while an insulating material of high voltage-withstand properties is not needed.

3-5-2-4 Coupling Mediated by Composite Material

Figure 45:
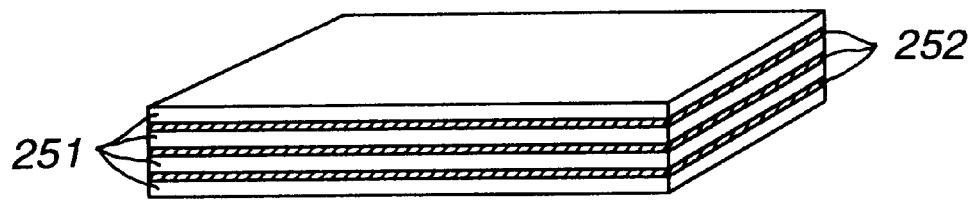
FIG. 45 schematically shows the structure of a multi-layer coupling control layer comprised of a magnetic layer and a non-ferromagnetic layer layered togther.
Figure 46:
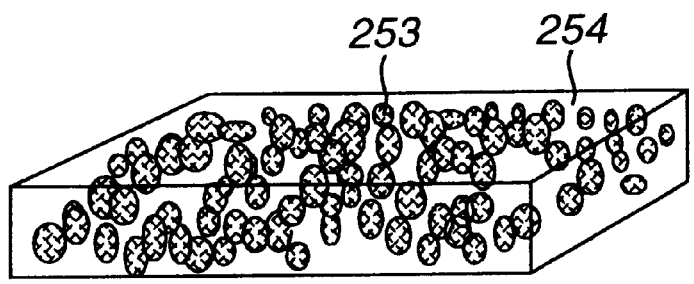
FIG. 46 schematically shows the structure of a coupling control layer comprised of magnetic particles dispersed in a non-magnetic material.

If the composite material, shown in FIGS. 45 or 46, is used in place of the single-phase material as a coupling control layer controlling the magnetic coupling between the magnetic layers, it is possible to perform control of propagating the magnetic coupling and to vary the strength of the coupling by external stimuli.

FIG. 45 shows a multi-layered coupling control layer comprised of a magnetic layer 251 and a non-ferromagnetic layer 252. For the magnetic layer 251, as a constituent element of the multi-layered structure, ferromagnetic metals, such as Fe, Co or Ni, or alloys thereof with non-magnetic metals, may be used. As the nonferromagnetic layer 252, any suitable metals, such as Ti, V, Mn, Cu, Zr, Nb, Mo, Ru, Rh, Pd, Ag, Hf, Ta, W, Re, Ir, Pt or Au may be used. In addition, Cr, exhibiting antiferromagnetic properties at room temperature, may be used. The ferromagnetic or anti-ferromagnetic properties or strength of the resulting coupling can be designed in many ways depending on the type of the magnetic material or the thickness of the non-ferromagnetic layer 252.

In addition to the layered structure, the fine particle dispersion structure shown in FIG. 46 may also be used as a coupling control layer. This coupling control layer is of such a structure in which ferromagnetic particles 253 such as Fe particles are dispersed in the interior of the non-magnetic material 254 such as Ag. The magnetic coupling is transmitted among the ferromagnetic particles 253 like step stones, as a result of which the magnetic layer and the magnetic layer arranged on both sides of the control coupling layer are magnetically coupled together.

The magnetic coupling among the ferromagnetic particles is extremely weak, so that the magnetic coupling tends to be fractionated due to excess electron scattering and rise in temperature if the current flows in the coupling control layer. That is, in the coupling control layer of the fine particle dispersion structure, the magnetic coupling between the magnetic layers arranged on both sides thereof depends on the weak magnetic coupling among the ferromagnetic particles, such that the macroscopic magnetic coupling tends to be fractionated by the current flowing in the coupling control layer.

Meanwhile, the fine particle dispersion structure may also be used as an element of the layered structure. For example, the Cr/Fe—Ag film is used as the coupling control layer in the exchange coupling type solid magnetic memory which will be explained subsequently. This Fe—Ag film is formed of a two-phase mixed material of the non-solid solution type and hence may be said to be of the fine particle dispersion structure.

Meanwhile, if the composite material containing a magnetic material is used in the coupling control layer, magnetic coupling occurs indirectly via a magnetic material in the composite material. Therefore, the coupling control layer can have an increased film thickness. If the composite material containing the magnetic material is used as the coupling control layer, its film thickness is preferably not less than 10 nm. If the film thickness is not less than 10 nm, it is possible to evade the problem of fabrication difficulties due to the excessively thin thickness of the coupling control layer.

Although there is no limitation to the upper limit of the coupling control layer composed of a composite material, the thickness of the coupling control layer is preferably not larger than about 1 $\mu$m in consideration of actually met manufacturing processes.

3-5-2-5 Coupling mediated by Different Magnetic Material

If put to external stimuli, a material with a relatively low Curie temperature, for which the magnetic order disappears, or a ferri magnetic material in the vicinity of the compensation point, has its macroscopic magnetic properties changed significantly. This can be used for modulating magnetic coupling between magnetic layers.

3-5-3 Verification of the Addressing Operation by Experiments

An exchange coupling type solid magnetic memory embodying the present invention was actually prepared and the addressing operations thereof were verified.

3-5-3-1 Preparation Sequence of Exchange Coupling Type Solid Magnetic Memory An exchange coupling type solid magnetic memory embodying the present invention was prepared using a magnetron sputtering device. The preparation sequence is explained with reference to FIGS. 47 to 51. It should be noted that FIGS. 47 to 51 showing the manufacturing process of the exchange coupling type solid magnetic memory are partial enlarged cross-sectional views showing a sole memory cell.

Figure 47:
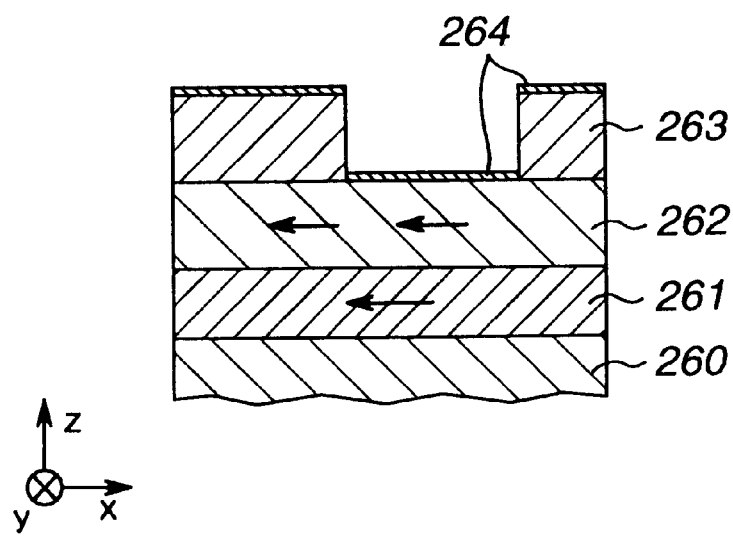
FIG. 47 is a first schematic view showing the manufacturing process of a coupling control layer embodying the present invention.

(1) Deposition of Stationary Magnetic Layer and Cu Layer for Controlling the Direction of Magnetization (FIG. 47)

After depositing a high coercivity Co—Pt magnetic layer 261 (permanent magnet layer) and a Co layer 262 on a glass substrate 260, a resist mask pattern 263 was formed by electron beam etching, and a strip-like Cu layer 264 was deposited in a region corresponding to a sole y-direction driving line.

The film thicknesses of the high coercivity Co—Pt magnetic layer 261, Co layer 262 and the Cu layer 264 were set to 100 nm, 100 nm and to 0.8 nm, respectively.

Figure 48:
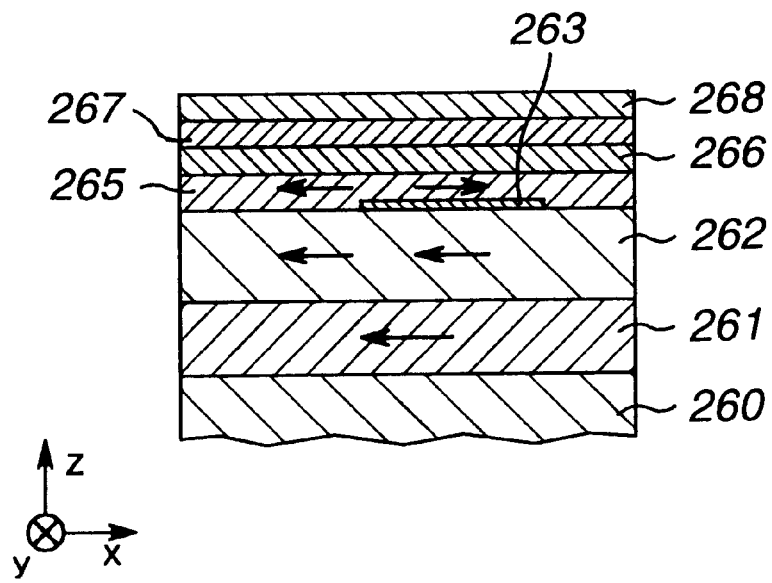
FIG. 48 is a second schematic view showing the manufacturing process of a coupling control layer embodying the present invention.

(2) Deposition of Second-order Co layer and Coupling Control Layer (FIG. 48)

The resist mask pattern 263 was removed and a second-degree Co layer 265 was deposited to a thickness of 20 nm. The region of the second-degree Co layer 265 deposited on the Cu layer 263 was magnetized in an antiparallel direction with respect to the underlying Co layer 262 by the antiferromagnetic exchange interaction mediated by the Cu layer 262.

An insulation control layer 266 was then deposited. The insulation control layer 266, obtained on sputtering a Fe—Si target in an oxygen-containing argon atmosphere, is formed of a material having high electrical resistance and ferromagnetic properties and that can propagate magnetic coupling.

A coupling control layer 267 then was deposited. To this end, a Cu/Fe—Ag multi-layered film was deposited at room temperature by simultaneously sputtering a Fe—Ag mosaic target and a Cr target and by causing the substrate 260 to stay alternately on the respective targets. The mosaic target used is an Fe target on which six sector-shaped Ag plates having a center angle of 15° were arrayed. The respective film thicknesses were 0.9 nm and 1.5 nm for Cr and Fe—Ag, respectively. These layers were deposited on a ferrite substrate, beginning with a first Fe—Ag layer, and the last Fe—Ag layer was despoiled as an uppermost layer after 16 and a half periods. This layer has the operation of interrupting the magnetic coupling when the current flows therein, as discussed in 3-5-2-4. An electrode pad was formed on an outer rim of a memory cell region in order to provide an electrode for supplying t the current to the coupling control layer 267.

An insulating coupling layer 268 was deposited on the coupling control layer 267 so as not to cover the electrode pad derived from the coupling control layer 267.

Figure 49:
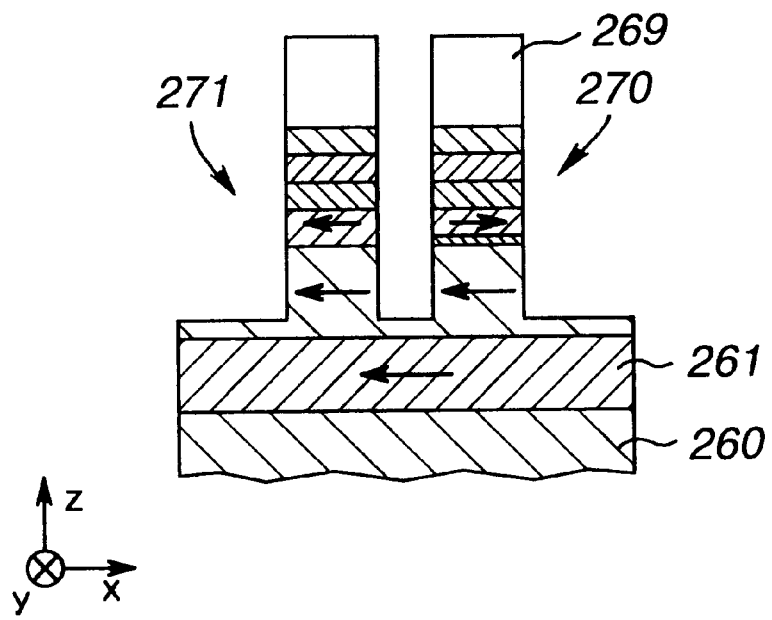
FIG. 49 is a third schematic view showing the manufacturing process of a coupling control layer embodying the present invention.
Figure 50:
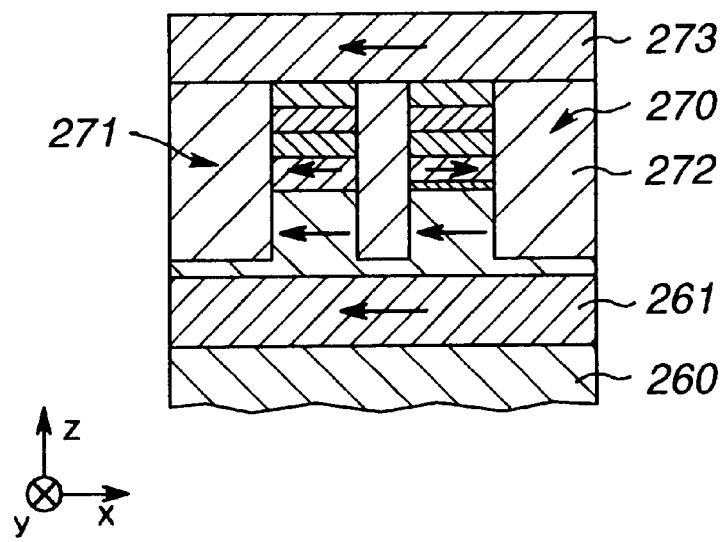
FIG. 50 is a fourth schematic view showing the manufacturing process of a coupling control layer embodying the present invention.
Figure 51:
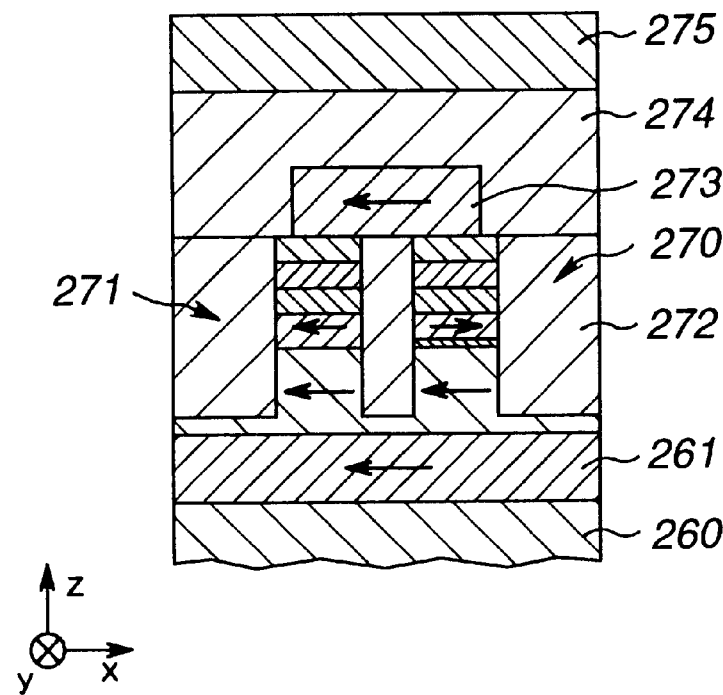
FIG. 51 is a fifth schematic view showing the manufacturing process of a coupling control layer embodying the present invention.

(3) Formation of Driving Line Pattern (FIG. 49)

A resist mask pattern 269 was formed in a region of two y-direction driving lines corresponding to a cell width to interconnect electrode pads, while other portions were scraped off up to a half-thickness of the underlying Co layer 262. This formed y-direction driving lines 270, 271.

(4) Deposition of Ni—Fe Layer and Affording Magnetic Anisotropy The step difference was removed by an insulating resin 272 and a Ni—Fe layer 273 was then deposited into contact with the insulating coupling layer 268. During the deposition, the magnetic bias propagated from the underlying layer was removed by heating the substrate. An external magnetic field was applied in the —x direction to induce uniaxial magnetic anisotropy having an easy axis along the x-axis direction in the Ni—Fe layer 273. This Ni—Fe layer 273 later serves as a storage carrier.

(5) Formation of a Storage Carrier and Deposition and Formation of x-Direction Driving Lines By a mask process, the Ni—Fe layer 273 was left to the size of the storage carrier. After charging the insulating resin 274, an x-direction Cu interconnection was deposited to form an x-direction driving line 275. A magnetic field of 2 kOe was applied in the x-direction at room temperature, using an electromagnet, to align the direction of magnetization of the high coercivity Co—Pt magnetic layer 261 and the Co layer 262 in the —x direction.

Figure 52:
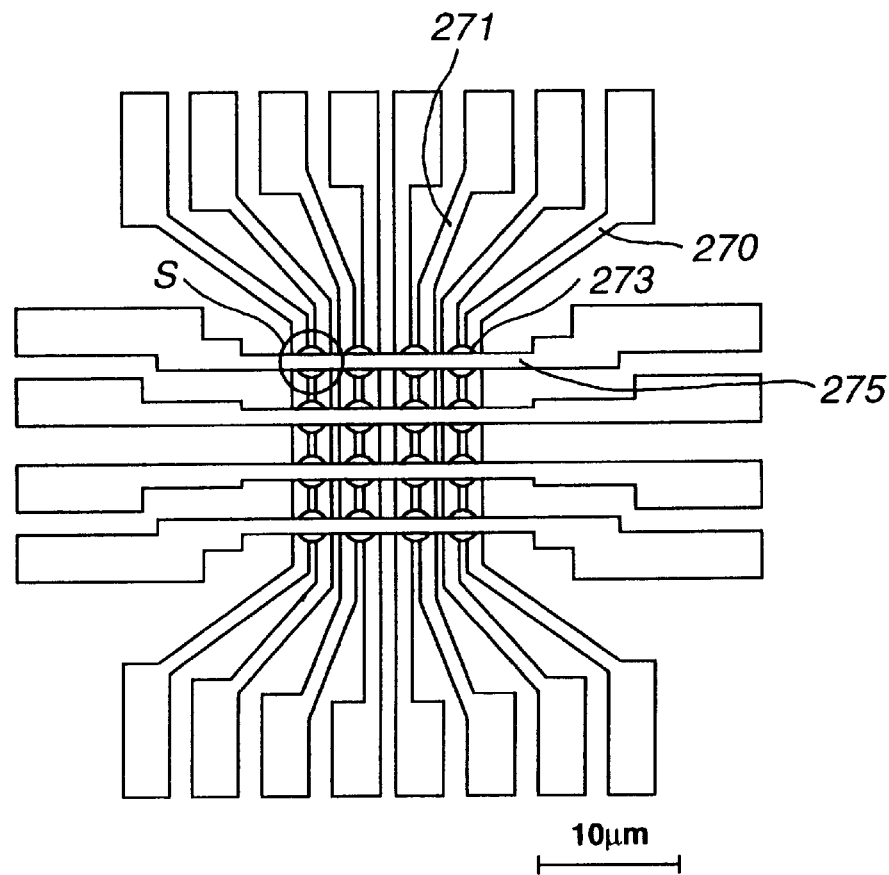
FIG. 52 shows a planar structure of an exchange coupling type solid magnetic memory having a 4 by 4 memory cells.
Figure 53:
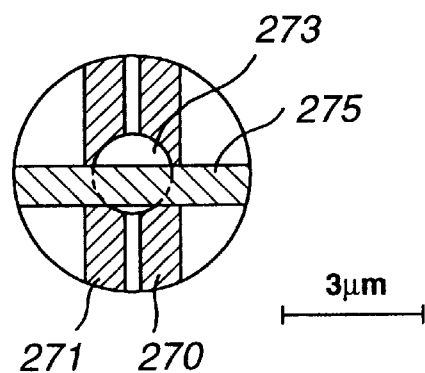
FIG. 53 is an enlarged view showing a circular portion S of FIG. 52 and specifically showing the planar structure of a sole memory cell.

The exchange coupling type solid magnetic memory was prepared, inclusive of the driving lines, as described above. Although a sole memory cell is shown enlarged in FIGS. 47 to 51, 4×4 memory cells were actually prepared. FIGS. 52 and 53 show a plan structure of a solid magnetic memory comprised of 4 by 4 memory cells and the planar structure of a sole memory cell to an enlarged scale, respectively.

In the above-described exchange coupling type solid magnetic memory, the x-direction driving lines 275 are simple conductors. The operation of magnetizing the storage carrier comprised of the Ni—Fe layer 73 from the conductor is by the magnetic field induced by the current flowing in this conductor. For simplifying the manufacturing process, exchange coupling is not used insofar as the x-direction driving lines 275 are concerned. Of course, the entire driving can be realized by exchange coupling by exploiting the driving lines operating for tilting the magnetization of the storage carrier towards the y-direction by utilizing the exchange coupling. In such case, any suitable mechanism which induces driving for the electrical input on state may be selected and used from those shown in 3-5-2-1 to 3-5-2-5. It is also possible to utilize the driving lines of the type in which the coupling is broken in the electrical input on state as adopted in the present embodiment. In this case, the driving power balance is shifted by bias superposition from another magnetic member such as the stationary magnetic layer 204 of FIG. 37 so that the driving power is induced for the electrical input on state.

In the above element structure, the following aspects, crucial in the element preparation, is encompassed.

(1) Stationary Magnetic Layer Deposited on the Entire Substrate Surface

In the above-described exchange coupling type solid magnetic memory, a stationary magnetic layer, comprised of the high coercivity Co—Pt magnetic layer 261 and the Co layer 262, is deposited on the entire substrate surface. By magnetizing the stationary magnetic layer in one direction and constructing the structure up to the cell array thereon, the direction of magnetization of the totality of the driving lines and the storage carriers is improved in uniformity on the entire substrate surface with the stationary magnetic layer as the reference. This uniformity contributes to signal uniformity especially in the memory readout process to improve the operational reliability.

(2) Cu Layer Used in Controlling the Direction of Magnetization

The driving directions of the two driving lines 270, 271, realizing the magnetization of the storage carrier n opposite directions, such as +x and −x directions, are expected to be correctly antiparallel. As means for realizing this regular magnetic domain structure on the driving lines 270, 271, such feature that the magnetization on the Co layers 260, 265 on both sides of the Cu layer 263 become antiparallel to each other. Meanwhile, similar antiparallel coupling is known to be produced in a variety of combinations of different materials, such as coupling of the Fe layers mediated by the Cr layer. these combinations may be suitably selected for use in memory fabrication. This antiparallel coupling is discussed in for example, S. S. P. Parkin, physical Review letters vol.61, p.3598–3601 (1991).

(3) Insulation Coupling Layer of Containing the Current in the Coupling Control Layer and Propagating the Magnetic Coupling As a material of high electrical resistance mediating the magnetic coupling, a thin film obtained on sputtering the Fe—Si target in the oxygen containing atmosphere was used. The thin film is presumably a mixture of the magnetic metal alloy and an oxide. Similar materials having the above function may be obtained by sputtering an alloy target mainly composed of Fe, Co and Ni.

3-5-3-2 Confirmation of Addressing Operation

Using an exchange coupling type solid magnetic memory, prepared as described above, it was confirmed experimentally that memory cells can actually be selected for writing. The direction of magnetization of the storage carrier was detected using a Kerr microscope which affords light/dark contrast dependent on the magnetization to an image of a polarization microscope by exploiting the fact that rotation of the polarized light plane induced when the light is reflected on the surface of a magnetic sample (magneto-optical Kerr effect) reflects the direction of magnetization of the sample. For the experiment, the arrangement of the optical system was selected to enable detection of the contrast dependent on the x-direction magnetization component corresponding to the easy axis of the storage carrier. Prior to observation, an insulation resin superposed on upper portions of the 4 by 4 storage carriers was removed by ion milling so that the Ni—Fe thin film which serves as the storage carrier will be exposed on the surface. This procedure is used to evade redundant contrast not attributed t the magneto-optical Kerr effect by double refraction of the resin and superposition of surface reflection.

(1) In the initial magnetized state, the underlying permanent magnet layer of the sample was magnetized to the −x direction, while the storage carrier layer was also aligned in the −x direction. On observation with the Kerr microscope, all of 14 storage carriers appeared to have the same lightness.

(2) The samples were shifted to a micro-prober and four electrodes were set. One of the y-direction driving lines and one of x-direction driving lines were selected and fed with the pulse current simultaneously. For inverting the magnetization of the storage carrier to the +x direction, such driving line was selected which, when fed with the current, operate to weaken the bias in the −x direction to the storage carrier.

Figure 54:
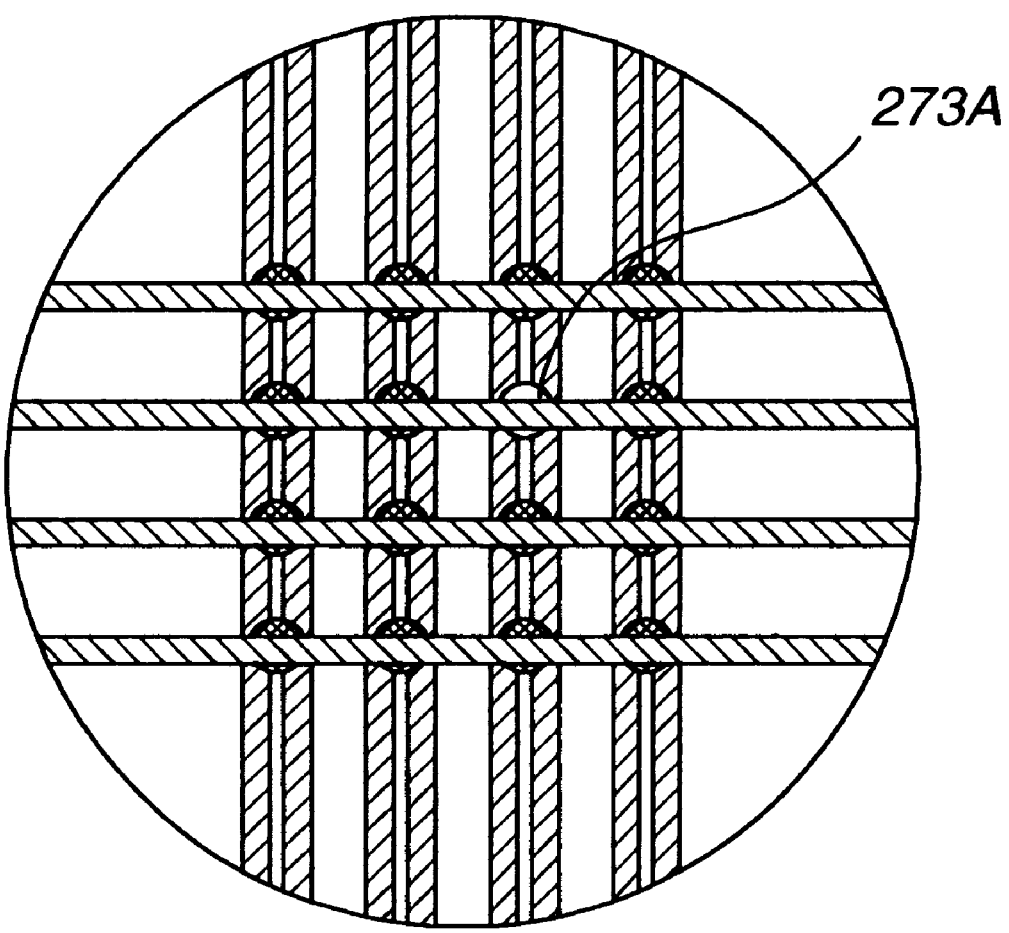
FIG. 54 shows the results of observation over a Kerr microscope after writing in a memory cell for confirming the addressing operation in the exchange coupling type solid magnetic memory shown in FIG. 52.

(3) The sample was returned to the Kerr microscope to observe an image with the same orientation as that during initial observation. The observed image is shown schematically in FIG. 54, from which is seen that only the storage carrier of the selected memory cell (storage carrier 273A on the second row from top and on the third column from left) was observed more lightly than other storage carriers, thus evidencing that the direction of magnetization of the storage carrier in question has been changed.

(4) The sample was shifted to a prober. The same memory cell was selected and, for erasing the memory contents, pulse currents were supplied to different y-direction and x-direction driving lines. The sample was again observed under the Kerr microscope. It was found that all of the storage carriers appeared with the same lightness. This demonstrated that memory writing by inversion of magnetization is reversible.

(5) The above experiment was conducted repeatedly on plural different memory cells. It was confirmed that writing and erasure could be executed independently from one memory cell to another. That is, with the exchange coupling type solid magnetic memory, an addressing operation can be realized by driving lines arranged in a matrix configuration.

In the magnetic storage device, having an array of magnetic members as storage carriers, the addressing function indispensable to the integrated circuit elements, can be realized by a simple matrix type interconnections, as the problem accompanying the writing exploiting the magnetic field, such as crosstalk due to minuted design rule or lowered coercivity.

What is claimed is:

1. A magnetization controlling method comprising the steps of:
   splitting a magnetized area of a ferromagnetic material by a spacer area of a composite material containing a magnetic material and a semiconductor material; and
   applying a stimulus from outside to said spacer area to change the magnetic interaction between split magnetized areas to control the magnetization of one or more of the split magnetized areas.

2. The magnetization controlling method according to claim 1 wherein said stimulus is applied to said spacer area by one of electrical stimulation, light illumination or temperature control.

3. The magnetization controlling method according to claim 1 wherein a magnetic semiconductor is used as the composite material used as the spacer area.

4. The magnetization controlling method according to claim 1 wherein a medium obtained on dispersing ferromagnetic particles in a semiconductor is used as the composite material used as the spacer area.

5. The magnetization controlling method according to claim 1 wherein a medium obtained on dispersing ferromagnetic particles in a magnetic semiconductor is used as the composite material used as the spacer area.

6. The magnetization controlling method according to claim 1 wherein a multi-layered film obtained on layering a ferromagnetic film and a semiconductor film together is used as the composite material used in said spacer area.

7. The magnetization controlling method according to claim 1 wherein a multi-layered film obtained on layering a ferromagnetic film and a magnetic semiconductor film together is used as the composite material used in said spacer area.

8. The magnetization controlling method according to claim 1 wherein the thickness of the spacer area is not less than 10 nm.

9. A magnetization controlling method comprising the steps of:

splitting a magnetized area of a ferromagnetic material by a spacer area having a thickness of not less than 10 nm, said spacer area comprising a composite material containing a magnetic material and a semiconductor material; and applying a stimulus from outside to said spacer area to change the magnetic interaction between split magnetized areas to control the magnetization of one or more of the split magnetized areas.

10. An information recording method comprising the steps of:

splitting a magnetized area of a ferromagnetic material by a spacer area of a composite material containing a magnetic material and a semiconductor material;

applying a stimulus from outside to said spacer area in meeting with the information for recording to change the magnetic interaction between split magnetized areas to control the magnetization of one or more of the split magnetized areas; and doing binary or higher multi-valued recording depending on the direction of magnetization of the magnetized area.

11. The information recording method according to claim 10 wherein said stimulus is applied by one of the electrical stimulation, light illumination or temperature control to said spacer area.

12. The information recording method according to claim 10 wherein a magnetic semiconductor is used as a composite material used for said spacer area.

13. The information recording method according to claim 10 wherein a medium obtained on dispersing ferromagnetic particles in a semiconductor is used as the composite material used as the spacer area.

14. The information recording method according to claim 10 wherein a medium obtained on dispersing ferromagnetic particles in a magnetic semiconductor is used as the composite material used as the spacer area.

15. The information recording method according to claim 10 wherein a multi-layered film obtained on layering a ferromagnetic film and a semiconductor film together is used as a the composite material of said spacer area.

16. The information recording method according to claim 10 wherein a multi-layered film obtained on layering a ferromagnetic film and a magnetic semiconductor film together is used as the composite material of said spacer area.

17. The information recording method according to claim 10 wherein the thickness of said spacer area is not less than 10 nm.

18. An information recording method comprising the steps of:

splitting a magnetized area of a ferromagnetic material by a spacer area having a thickness of not less than 10 nm, said spacer area comprising a composite material containing a magnetic material and a semiconductor material; and applying a stimulus from outside to said spacer area in meeting with the information for recording to change the magnetic interaction between split magnetized information for recording to change the magnetic interaction between split magnetized areas to control the magnetization of one or more of the split magnetized areas; and doing binary or higher multi-valued recording depending on the direction of magnetization of the magnetized area.

19. An information recording element having a magnetized area of a ferromagnetic material split by a spacer area of a composite material containing a magnetic material and a semiconductor material, wherein:

a stimulus in meeting with the information for recording is applied from outside to the spacer area to change the magnetic interaction between split magnetized areas to control the magnetization of one or more split magnetized areas:

binary or higher multi-valued recording is made depending on the direction of magnetization of the magnetized areas; and said stimulus is applied by one of electrical stimulation, light illumination or temperature control to said spacer area.

20. The information recording element according to claim 19 wherein the thickness of the spacer area is not less than 10 nm.

21. An information recording element having a magnetized area of a ferromagnetic material split by a spacer area of a composite material containing a magnetic material and a semiconductor material, wherein:

a stimulus in meeting with the information for recording is applied from outside to the spacer area to change the magnetic interaction between split magnetized areas to control the magnetization of one or more split magnetized areas:

binary or higher multi-valued recording is made depending on the direction of magnetization of the magnetized areas; and a magnetic semiconductor is used as a composite material used for said spacer area.

22. An information recording element having a magnetized area of a ferromagnetic material split by a spacer area of a composite material containing a magnetic material and a semiconductor material. wherein:

a stimulus in meeting with the information for recording is applied from outside to the spacer area to change the magnetic interaction between split magnetized areas to control the magnetization of one or more split magnetized areas:

binary or higher multi-valued recording is made depending on the direction of magnetization of the magnetized areas; and the composite material used as the spacer area is a medium obtained on dispersing ferromagnetic particles in a semiconductor is used as the composite material for said spacer area.

23. An information recording element having a magnetized area of a ferromagnetic material split by a spacer area of a composite material containing a magnetic material and a semiconductor material. wherein:

a stimulus in meeting with the information for recording is applied from outside to the spacer area to change the magnetic interaction between split magnetized areas to control the magnetization of one or more split magnetized areas:

binary or higher multi-valued recording is made depending on the direction of magnetization of the magnetized areas; and the composite material used as the spacer area is a medium obtained on dispersing ferromagnetic particles in a magnetic semiconductor.

24. An information recording element having a magnetized area of a ferromagnetic material split by a spacer area of a composite material containing a magnetic material and a semiconductor material. wherein:

a stimulus in meeting with the information for recording is applied from outside to the spacer area to change the magnetic interaction between split magnetized areas to control the magnetization of one or more split magnetized areas:

binary or higher multi-valued recording is made depending on the direction of magnetization of the magnetized areas; and the composite material used in the spacer area is a multi-layered film obtained on layering a ferromagnetic film and a semiconductor film together.

25. An information recording element having a magnetized area of a ferromagnetic material split by a spacer area of a composite material containing a magnetic material and a semiconductor material. wherein:

a stimulus in meeting with the information for recording is applied from outside to the spacer area to change the magnetic interaction between split magnetized areas to control the magnetization of one or more split magnetized areas:

binary or higher multi-valued recording is made depending on the direction of magnetization of the magnetized areas; and the composite material used in the spacer area is a multi-layered film obtained on layering a ferromagnetic film and a magnetic semiconductor film together.

26. An information recording element having a structure in which a magnetized area of a ferromagnetic material is split by a spacer area having a thickness not less than 10 nm, wherein;

a stimulus in meeting with the information for recording is applied from outside to the spacer area to change the magnetic interaction between split magnetized areas to control the magnetization of one or more split magnetized areas;

binary or higher multi-valued recording is made depending on the direction of magnetization of the magnetized areas; and said spacer area is composed of a composite material containing a magnetic material and a semiconductor material.

27. A magnetization controlling method comprising the steps of:

constructing a layered assembly, obtained on layering an electrically conductive layer containing an electrically conductive material and a plurality of magnetic layers so that the electrically conductive layer is disposed between the magnetic layers; and causing the current to flow in the electrically conductive layer of the layered assembly to change the magnetic coupling state between the magnetic layers to control the direction of magnetization of the magnetic layers, wherein the electrically conductive layer is made up of a composite material containing a substance showing magnetic order in a sole phase and a non-magnetic material.

28. A magnetization controlling method comprising the steps of:

constructing a layered assembly, obtained on layering an electrically conductive layer containing an electrically conductive material and a plurality of magnetic layers so that the electrically conductive layer is disposed between the magnetic layers, and causing the current to flow in the electrically conductive layer of the layered assembly to change the magnetic coupling state between the magnetic layers to control the direction of magnetization of the magnetic layers, wherein the electrically conductive layer is made up of alternately layered regions of a ferromagnetic composition and of a non-magnetic composition or a composition-modulated film.

29. A magnetization controlling method comprising the steps of:

constructing a layered assembly, obtained on layering an electrically conductive layer containing an electrically conductive material and a plurality of magnetic layers so that the electrically conductive layer is disposed between the magnetic layers; and causing the current to flow in the electrically conductive layer of the layered assembly to change the magnetic coupling state between the magnetic layers to control the direction of magnetization of the magnetic layers, wherein said electrically conducive layer is of a structure of a three-dimensionally mixture of regions of a ferromagnetic composition and of a non-magnetic composition.

30. A magnetization controlling method comprising the steps of:

constructing a layered assembly. obtained on layering an electrically conductive layer containing an electrically conductive material and a plurality of magnetic layers so that the electrically conductive layer is disposed between the magnetic layers; and causing the current to flow in the electrically conductive layer of the layered assembly to change the magnetic coupling state between the magnetic layers to control the direction of magnetization of the magnetic layers, wherein layers of a material higher in electrical resistance than the electrically conductive layer are arranged as an overlying layer and an underlying layer of the electrically conductive layer.

31. A magnetic functional element comprising:

a layered assembly, obtained on layering an electrically conductive layer containing an electrically conductive material and a plurality of magnetic layers so that the electrically conductive layer is disposed between the magnetic layer;

wherein the current is caused to flow in the electrically conductive layer of the layered assembly to change the magnetic coupling state between the magnetic layers to control the direction of magnetization of the magnetic layers, and an output is caused to correspond to the magnetized state of the magnetic layers by exploiting the magnetized state of the magnetic layers.

32. A magnetic functional element comprising:

a layered assembly, obtained on layering an electrically conductive layer containing an electrically conductive material and a plurality of magnetic layers so that the electrically conductive layer is disposed between the magnetic layer;

wherein the current is caused to flow in the electrically conductive layer of the layered assembly to change the magnetic coupling state between the magnetic layers to control the direction of magnetization of the magnetic layers, and the electrically conductive layer is made up of a composite material containing a substance showing magnetic order in a sole phase and a non-magnetic material.

33. A magnetic functional element comprising:

a layered assembly, obtained on layering an electrically conductive layer containing an electrically conductive material and a plurality of magnetic layers so that the electrically conductive layer is disposed between the magnetic layer, wherein the current is caused to flow in the electrically conductive layer of the layered assembly to change the magnetic coupling state between the magnetic layers to control the direction of magnetization of the magnetic layers, and the electrically conductive layer is made up of alternately layered regions of a ferromagnetic composition or a composition-modulated film.

34. A magnetic functional element comprising:

a layered assembly, obtained on layering an electrically conductive layer containing an electrically conductive material and a plurality of magnetic layers so that the electrically conductive layer is disposed between the magnetic layer;

wherein the current is caused to flow in the electrically conductive layer of the layered assembly to change the magnetic coupling state between the magnetic layers to control the direction of magnetization of the magnetic layers, and said electrically conductive layer is of a structure of a three-dimensionally mixed structure of regions of a ferromagnetic composition and of a non-magnetic composition.

35. A magnetic functional element comprising:

a layered assembly, obtained on layering an electrically conductive layer containing an electrically conductive material and a plurality of magnetic layers so that the electrically conductive layer is disposed between the magnetic layer;

wherein the current is caused to flow in the electrically conductive layer of the layered assembly to change the magnetic coupling state between the magnetic layers to control the direction of magnetization of the magnetic layers, and layers of a material higher in electrical resistance than the electrically conductive layer are arranged as an overlying layer and an underlying layer of the electrically conductive layer.

* * * * *